(12) United States Patent
Shakuda

(10) Patent No.: US 6,996,150 B1
(45) Date of Patent: *Feb. 7, 2006

(54) SEMICONDUCTOR LIGHT EMITTING DEVICE AND MANUFACTURING METHOD THEREFOR

(75) Inventor: Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 326 days.

This patent is subject to a terminal disclaimer.

(21) Appl. No.: 09/604,097

(22) Filed: Jun. 27, 2000

Related U.S. Application Data

(62) Division of application No. 09/012,790, filed on Jan. 23, 1998, now Pat. No. 6,115,399, which is a division of application No. 08/528,308, filed on Sep. 14, 1995, now Pat. No. 5,751,752.

(30) Foreign Application Priority Data

| Sep. 14, 1994 | (JP) | ................................. 6/219892 |
| Sep. 28, 1994 | (JP) | ................................. 6/233179 |
| Sep. 28, 1994 | (JP) | ................................. 6/233180 |
| Sep. 29, 1994 | (JP) | ................................. 6/235013 |
| Sep. 29, 1994 | (JP) | ................................. 6/235014 |

(51) Int. Cl.
   *H01S 5/00* (2006.01)

(52) U.S. Cl. .......................................... 372/46; 372/43

(58) Field of Classification Search ................. 372/45, 372/46
   See application file for complete search history.

(56) References Cited

U.S. PATENT DOCUMENTS

| 3,226,270 A | 12/1965 | Miederer et al. |
| 3,364,084 A | 1/1968 | Ruehrwein |
| 3,433,684 A | 3/1969 | Zanowick et al. |
| 3,604,991 A | 9/1971 | Yonezu et al. |
| 3,733,561 A | 5/1973 | Hayashi |
| 3,758,875 A | 9/1973 | Hayashi |
| 3,819,974 A | 6/1974 | Stevenson et al. |
| 3,983,509 A | 9/1976 | Scifres et al. |
| 3,984,262 A | 10/1976 | Burnham et al. |
| 4,063,189 A | 12/1977 | Scifres et al. |
| 4,144,116 A | 3/1979 | Jacob et al. |
| 4,249,142 A | 2/1981 | Burnham et al. |
| 4,268,842 A | 5/1981 | Jacob et al. |
| 4,328,469 A | 5/1982 | Scifres et al. |
| 4,335,461 A | 6/1982 | Streifer et al. |
| 4,347,611 A | 8/1982 | Scifres et al. .................. 372/45 |
| 4,371,966 A | 2/1983 | Scifres et al. |

(Continued)

FOREIGN PATENT DOCUMENTS

| CA | 1325582 | 12/1993 |

(Continued)

OTHER PUBLICATIONS

Blue Device Development Story (P1-6 and P10, ELECTRONICS, Apr. 1999 issue) (with English Translation).

(Continued)

*Primary Examiner*—Minsun O. Harvey
*Assistant Examiner*—Nguyen N. Nguyen
(74) *Attorney, Agent, or Firm*—Sterne Kessler Goldstein & Fox PLLC

(57) ABSTRACT

A semiconductor light emitting device of double hetero junction includes an active layer and clad layers. The clad layers include an n-type layer and p-type layer. The clad layers sandwich the active layer. A band gap energy of the clad layers is larger than that of the active layer. The band gap energy of the n-type clad layer is smaller than of the p-type clad layer.

7 Claims, 9 Drawing Sheets

U.S. PATENT DOCUMENTS

| | | | |
|---|---|---|---|
| 4,506,366 A | 3/1985 | Chinone et al. | |
| 4,567,060 A | 1/1986 | Hayakawa et al. | 438/44 |
| 4,675,709 A | 6/1987 | Scifres et al. | |
| 4,817,103 A | 3/1989 | Holonyak, Jr. et al. | |
| 4,839,899 A | 6/1989 | Burnham et al. | |
| 4,890,293 A | 12/1989 | Taneya et al. | 372/46 |
| 4,904,618 A | 2/1990 | Neumark | |
| 4,982,409 A | 1/1991 | Kinoshita et al. | 372/45 |
| 4,984,242 A | 1/1991 | Scifres et al. | |
| 4,999,841 A | 3/1991 | Sakiyama et al. | |
| 5,006,908 A | 4/1991 | Matsuoka et al. | |
| 5,008,718 A | 4/1991 | Fletcher et al. | |
| 5,010,376 A | 4/1991 | Nishimura et al. | |
| 5,023,880 A | 6/1991 | Suzuki et al. | |
| 5,048,036 A | 9/1991 | Scifres et al. | |
| 5,060,028 A | 10/1991 | Kuo et al. | |
| 5,136,600 A | 8/1992 | Fidric et al. | |
| 5,138,404 A | 8/1992 | Ishikawa et al. | |
| 5,151,913 A | 9/1992 | Ueno | |
| 5,153,148 A | 10/1992 | Sakiyama et al. | |
| 5,164,798 A | 11/1992 | Huang | |
| 5,170,228 A * | 12/1992 | Sasaki | 257/184 |
| 5,192,987 A * | 3/1993 | Khan et al. | 257/183.1 |
| 5,210,767 A | 5/1993 | Arimoto et al. | 372/46 |
| 5,212,705 A | 5/1993 | Kahen et al. | |
| 5,218,613 A | 6/1993 | Serreze | 372/45 |
| 5,227,328 A | 7/1993 | Khan et al. | |
| 5,233,204 A | 8/1993 | Fletcher et al. | |
| 5,235,609 A | 8/1993 | Uchida et al. | |
| 5,239,188 A * | 8/1993 | Takeuchi et al. | 257/76 |
| 5,247,533 A * | 9/1993 | Okazaki et al. | 372/45 |
| 5,252,466 A | 10/1993 | Cronan, Jr. | |
| 5,252,499 A | 10/1993 | Rothschild | |
| 5,278,433 A * | 1/1994 | Manabe et al. | 257/103 |
| 5,280,535 A | 1/1994 | Gfeller et al. | |
| 5,281,830 A * | 1/1994 | Kotaki et al. | 257/86 |
| 5,285,464 A | 2/1994 | Ogino | |
| 5,299,212 A | 3/1994 | Koch | |
| 5,301,202 A | 4/1994 | Harder et al. | |
| 5,309,458 A | 5/1994 | Carl | |
| 5,338,944 A * | 8/1994 | Edmond et al. | 257/76 |
| 5,359,209 A | 10/1994 | Huang | |
| 5,369,658 A | 11/1994 | Ikawa et al. | |
| 5,395,792 A | 3/1995 | Ikawa et al. | |
| 5,483,547 A | 1/1996 | Adams et al. | |
| 5,530,712 A | 6/1996 | Solina et al. | |
| 5,555,271 A | 9/1996 | Honda et al. | |
| 5,557,115 A * | 9/1996 | Shakuda | 257/81 |
| 5,578,839 A * | 11/1996 | Nakamura et al. | 257/96 |
| 5,583,879 A * | 12/1996 | Yamazaki et al. | 372/45 |
| 5,583,881 A | 12/1996 | Uchida et al. | |
| 5,585,649 A * | 12/1996 | Ishikawa et al. | 257/94 |
| 5,592,502 A | 1/1997 | Matsumoto et al. | 372/45 |
| 5,619,518 A | 4/1997 | Horie et al. | 372/45 |
| 5,670,798 A * | 9/1997 | Schetzina | 257/96 |
| 5,689,123 A | 11/1997 | Major et al. | |
| 5,732,098 A * | 3/1998 | Nisitani et al. | 372/45 |
| 5,734,182 A * | 3/1998 | Nakamura et al. | 257/96 |
| 5,751,752 A | 5/1998 | Shakuda | 372/45 |
| 5,761,230 A | 6/1998 | Oono et al. | |
| 5,814,533 A * | 9/1998 | Shakuda | 438/46 |
| 5,825,052 A * | 10/1998 | Shakuda | 257/94 |
| 5,966,395 A | 10/1999 | Ikeda | |
| 5,998,810 A * | 12/1999 | Hatano et al. | 257/102 |
| 6,009,112 A | 12/1999 | Uchida | |
| 6,015,979 A * | 1/2000 | Sugiura et al. | 257/86 |
| 6,031,858 A * | 2/2000 | Hatakoshi et al. | 372/46 |
| 6,084,899 A * | 7/2000 | Shakuda | 372/45 |
| 6,115,399 A * | 9/2000 | Shakuda | 372/45 |
| 6,146,916 A * | 11/2000 | Nanishi et al. | 438/46 |
| 6,282,218 B1 | 8/2001 | Anderson | |
| 6,369,926 B1 | 4/2002 | Lyu et al. | |
| 2002/0125492 A1 | 9/2002 | Shakuda | |

FOREIGN PATENT DOCUMENTS

| | | |
|---|---|---|
| EP | 0 356 059 A2 | 2/1990 |
| EP | 477013 A2 | 3/1992 |
| EP | 0 483 688 A2 | 5/1992 |
| EP | 0 496 030 A2 | 7/1992 |
| EP | 0 496 030 A3 | 7/1992 |
| EP | 0 541 373 B1 | 9/1998 |
| GB | 778383 | 7/1957 |
| GB | 1011979 | 12/1965 |
| JP | 57-153479 A | 9/1982 |
| JP | 57-155793 A | 9/1982 |
| JP | 60-41478 B2 | 9/1985 |
| JP | 62-119196 A | 5/1987 |
| JP | 62-165948 A | 7/1987 |
| JP | 62-165991 A | 7/1987 |
| JP | 63-188977 A | 8/1988 |
| JP | 63-222488 A | 9/1988 |
| JP | 63-222489 A | 9/1988 |
| JP | 64-17484 A | 1/1989 |
| JP | 1-14717 B2 | 3/1989 |
| JP | 1-111375 | 4/1989 |
| JP | 1-111375 A | 4/1989 |
| JP | 1-204425 A | 8/1989 |
| JP | A 1-217986 | 8/1989 |
| JP | 2-74088 A | 3/1990 |
| JP | 2-111016 A | 4/1990 |
| JP | A 4-87378 | 7/1990 |
| JP | 2-229475 | 9/1990 |
| JP | 2-229476 A | 9/1990 |
| JP | 2-291125 A | 11/1990 |
| JP | 3-80198 A | 4/1991 |
| JP | 3-85785 A | 4/1991 |
| JP | 3-31678 B2 | 5/1991 |
| JP | 3-203388 A | 9/1991 |
| JP | 3-252176 A | 11/1991 |
| JP | 3-252177 A | 11/1991 |
| JP | 3-252178 A | 11/1991 |
| JP | 3-289187 A | 12/1991 |
| JP | 4-10665 A | 1/1992 |
| JP | 4-11375 A | 1/1992 |
| JP | 4-25191 A | 1/1992 |
| JP | 4-15200 B2 | 3/1992 |
| JP | 4-111375 A | 4/1992 |
| JP | A 4-127595 | 4/1992 |
| JP | 4-130692 A | 5/1992 |
| JP | 4-144296 A | 5/1992 |
| JP | 4-163968 A | 6/1992 |
| JP | 4-163970 A | 6/1992 |
| JP | 4-163971 A | 6/1992 |
| JP | 4-164895 A | 6/1992 |
| JP | 4-170390 A | 6/1992 |
| JP | 4-209577 A | 7/1992 |
| JP | 4-236478 A | 8/1992 |
| JP | 4-247637 A | 9/1992 |
| JP | 4-273175 A | 9/1992 |
| JP | 4-297023 A | 10/1992 |
| JP | 4-309281 A | 10/1992 |
| JP | 4-321279 A | 11/1992 |
| JP | 4-321280 A | 11/1992 |
| JP | 5-21845 A | 1/1993 |
| JP | 5-21846 A | 1/1993 |
| JP | 5-63236 A | 3/1993 |
| JP | 5-74710 A | 3/1993 |
| JP | 5-109621 A | 4/1993 |
| JP | 5-110138 A | 4/1993 |
| JP | 5-110139 A | 4/1993 |
| JP | 5-121327 A | 5/1993 |
| JP | 5-129656 A | 5/1993 |
| JP | A 6-177423 | 5/1993 |

| | | | | | | |
|---|---|---|---|---|---|---|
| JP | 5-160437 A | 6/1993 | | JP | 6-350200 A | 12/1994 |
| JP | 5-160504 A | 6/1993 | | JP | 6-350201 A | 12/1994 |
| JP | 5-166923 A | 7/1993 | | JP | 6-350204 A | 12/1994 |
| JP | 5-175124 A | 7/1993 | | JP | 7-7182 A | 1/1995 |
| JP | 5-183189 A | 7/1993 | | JP | 7-7183 A | 1/1995 |
| JP | 5-190900 A | 7/1993 | | JP | 7-15041 A | 1/1995 |
| JP | 5-190903 A | 7/1993 | | JP | 7-30190 A | 1/1995 |
| JP | 5-206520 A | 8/1993 | | JP | 7-9999 B2 | 2/1995 |
| JP | 5-211347 A | 8/1993 | | JP | 7-45867 A | 2/1995 |
| JP | 5-243613 A | 9/1993 | | JP | 7-94782 A | 4/1995 |
| JP | 5-73252 B2 | 10/1993 | | JP | 7-94783 A | 4/1995 |
| JP | 5-291621 A | 11/1993 | | JP | 7-106633 A | 4/1995 |
| JP | 5-308154 A | 11/1993 | | JP | 7-122520 A | 5/1995 |
| JP | 5-308155 A | 11/1993 | | JP | 7-131068 A | 5/1995 |
| JP | 5-308156 A | 11/1993 | | JP | 7-131069 A | 5/1995 |
| JP | 5-315646 A | 11/1993 | | JP | 7-142763 A | 6/1995 |
| JP | 5-343741 A | 12/1993 | | JP | 7-153996 A | 6/1995 |
| JP | 5-343742 A | 12/1993 | | JP | 7-162038 A | 6/1995 |
| JP | 5-343802 A | 12/1993 | | JP | 7-176826 A | 7/1995 |
| JP | 6-9257 B2 | 2/1994 | | JP | 7-183576 A | 7/1995 |
| JP | 6-9258 B2 | 2/1994 | | JP | 7-202265 A | 8/1995 |
| JP | 6-14564 B2 | 2/1994 | | JP | 7-221103 A | 8/1995 |
| JP | 6-29574 A | 2/1994 | | JP | 7-221347 A | 8/1995 |
| JP | 6-69543 A | 3/1994 | | JP | 7-83136 B2 | 9/1995 |
| JP | 6-97493 A | 4/1994 | | JP | 7-235729 A | 9/1995 |
| JP | 6-97494 A | 4/1994 | | JP | 7-254733 A | 10/1995 |
| JP | 6-97495 A | 4/1994 | | JP | 7-263748 A | 10/1995 |
| JP | 6-97496 A | 4/1994 | | JP | 7-263749 A | 10/1995 |
| JP | 6-125113 A | 5/1994 | | JP | 7-273069 A | 10/1995 |
| JP | 6-151962 A | 5/1994 | | JP | 7-273366 A | 10/1995 |
| JP | 6-151963 A | 5/1994 | | JP | 7-288334 A | 10/1995 |
| JP | 6-151964 A | 5/1994 | | JP | 7-297446 A | 11/1995 |
| JP | 6-151965 A | 5/1994 | | JP | 7-297447 A | 11/1995 |
| JP | 6-151966 A | 5/1994 | | JP | 7-297494 A | 11/1995 |
| JP | 6-151967 A | 5/1994 | | JP | 7-297495 A | 11/1995 |
| JP | 6-151968 A | 5/1994 | | JP | 7-297496 A | 11/1995 |
| JP | 6-152072 A | 5/1994 | | JP | 7-312350 A | 11/1995 |
| JP | 6-164058 A | 6/1994 | | JP | 7-312445 | 11/1995 |
| JP | 6-177059 A | 6/1994 | | JP | 7-319427 A | 12/1995 |
| JP | 6-196755 A | 7/1994 | | JP | 7-326794 A | 12/1995 |
| JP | 6-196757 A | 7/1994 | | JP | 7-335975 A | 12/1995 |
| JP | 6-209120 A | 7/1994 | | JP | 2500319 B2 | 5/1996 |
| JP | 6-216409 A | 8/1994 | | JP | 2556211 B2 | 11/1996 |
| JP | 6-219892 A | 8/1994 | | JP | 2587825 B2 | 3/1997 |
| JP | 6-232450 A | 8/1994 | | JP | 2623463 B2 | 6/1997 |
| JP | 6-232451 A | 8/1994 | | JP | 2623466 B2 | 6/1997 |
| JP | 6-237012 A | 8/1994 | | JP | 26233463 | 6/1997 |
| JP | 6-244458 A | 9/1994 | | JP | 26233466 | 6/1997 |
| JP | 6-260680 A | 9/1994 | | JP | 2631285 B2 | 7/1997 |
| JP | 6-260681 A | 9/1994 | | JP | 2631286 B2 | 7/1997 |
| JP | 6-260682 A | 9/1994 | | JP | 26311285 | 7/1997 |
| JP | 6-260683 A | 9/1994 | | JP | 2666228 B2 | 10/1997 |
| JP | 6-260715 A | 9/1994 | | JP | 2728190 B2 | 3/1998 |
| JP | 6-268257 A | 9/1994 | | JP | 2740818 B2 | 4/1998 |
| JP | 6-268259 | 9/1994 | | JP | 2748355 B2 | 5/1998 |
| JP | 6-275867 A | 9/1994 | | JP | 2751987 B2 | 5/1998 |
| JP | 6-275868 A | 9/1994 | | JP | 2790237 B2 | 8/1998 |
| JP | 6-283758 A | 10/1994 | | JP | 2812375 B2 | 10/1998 |
| JP | 6-283825 A | 10/1994 | | JP | 2818776 B2 | 10/1998 |
| JP | 6-291366 A | 10/1994 | | JP | 2829311 B2 | 11/1998 |
| JP | 6-291367 A | 10/1994 | | JP | 2829311 B2 | 11/1998 |
| JP | 6-291368 A | 10/1994 | | JP | 2829319 B2 | 11/1998 |
| JP | 6-296041 A | 10/1994 | | JP | 2849642 B2 | 1/1999 |
| JP | 6-314659 A | 11/1994 | | JP | 8355 | 2/1999 |
| JP | 6-314821 A | 11/1994 | | JP | 2908815 B2 | 4/1999 |
| JP | 6-314822 A | 11/1994 | | JP | 2895566 B2 | 5/1999 |
| JP | 6-314823 A | 11/1994 | | JP | 2914014 B2 | 6/1999 |
| JP | 6-314825 A | 11/1994 | | JP | 2914065 B2 | 6/1999 |
| JP | 6-101587 B2 | 12/1994 | | JP | 2917742 B2 | 7/1999 |
| JP | 6-338632 A | 12/1994 | | JP | 2947047 B2 | 9/1999 |
| JP | 6-350137 A | 12/1994 | | JP | 2982553 B2 | 11/1999 |
| JP | 6-350138 A | 12/1994 | | WO | WO 96/11498 | 4/1996 |
| JP | 6-350199 A | 12/1994 | | | | |

OTHER PUBLICATIONS

Semiconductor Laser (issued on Oct. 25, 1994), (P44-P45) (with English Translation).

Device Physical Properties and Applications (P124-P125, The Fascination of Blue Light Emitting Device, issued on Apr. 14, 1997) (with English Translation).

T. Nagatomo, et al., "Properties of $Ga_{1-x}In_xN$ Films Prepared by MOVPE", Japanese Journal of Applied Physics, vol. 28, No. 9, Aug., 1989, pp. L1334-L1336 Blue Device Development Story (P1-6 and P10, ELECTRONICS, Apr. 1999 issue) (with English Translation).

K. Osamura, et al., "Fundamental Absorption Edge in GaN, InN and Their Alloys", Solid State Communications, vol. 11, 1972, pp. 617-621, no month.

S. Yoshida, et al., "Properties of $Al_xGa_{1-x}N$ Films Prepared by Reactive Molecular Beam Epitaxy", J. Appl. Phys., vol. 53, No. 10, Oct. 1982.

K. Osamura, et al., "Preparation and Optical Properties of $Ga_{1-x}In_xN$ Thin Films", Journal of Applied Physics, vol. 46, No. 8, Aug. 1975.

Y. Koide, et al., "Energy Band-Gap Bowing Parameter in an $Al_xGa_{1-x}N$ Alloy", J. Appl. Phys. vol. 61, No. 9, May 1, 1987.

I. Avasaui, et al., "MOVPE Growth Of High Quality $Al_xGa_{1-x}N/Ga_yIn_{1-y}N(x>0,y<1)$ Heterostructures for Short Wavelength Light Emitter", Mat. Res. So. Symp. Pro., vol. 339, pp. 443-452, no month, 1994.

L. Hrivnak, "Band Gaps, Effective Masses, and Band Offsets in Lattice Matched Heterojunctions", Phys. Stat. Sol. (a), vol. 128, K.89, 1991.

Abstract of Japanese Patent Publication No. 02-129915, dated May 7, 1992, Tsunoda.

Strite et al., Progress and Prospects for GaN and the III-V Nitride Semiconductors, Thin Solid Films, vol. 231, pp. 197-210, no month available.

Nakamura et al., "Candela-Class High-Brightness InGaN/AlGaN Double-Heterostructure Blue-Light-Emitting Diodes", Applied Physics Letters, vol. 64, No. 13, pp. 1687-1689.

Analysis Report No. 602020, dated Apr. 25, 1994.

Unpublished Analysis Report (translation); Surface Analysis Second Group No. 602020.

Japanese Journal of Applied Physics, vol. 32, No. 1A/B, dated Jan. 15, 1993.

Applied Physics Letters, vol. 64, No. 13, dated Mar. 28, 1994.

IEEE Journal of Quantum Electronics, vol. QE-17, No. 9, dated Sep. 1981.

(3) Nitride Mixed Crystal (3 pages)-written agreement against Office Action for Japanese Application 06-219892 on which this application is based.

Isamu Akasaki, Advanced Electronics I-1, III-V, Group of Semiconductor Compound (1994); 1st Edition, Baifu-kan, p. 345-347.

*Response of Nichia America Corporation To Amended Complaint of Rohm Co., Ltd. And Notice of Investigation,* with Exhibits D-H, 120 Pages, Dated Feb. 13, 2001 In the Matter of Certain Semiconductor Light Emitting Devices, Components Thereof, and Products Containing Same, Investigation No. 337-TA-444 before the U.S. International Trade Commission.

*Respondent Nichia Corporation's Objections and Responses To Complainant Rohm Co., Ltd.'s Fourth Set of Interrogatories Nos. 110-120,* 20 Pages, Dated Mar. 28, 2001 In the Matter of Certain Semiconductor Light Emitting Devices, Components Thereof, and Products Containing Same, Investigation No. 337-TA-444 before the U.S. International Trade Commission.

*Order No. 6: Denying Motion of Respondents Nichia Corporation and Nichia America Corporation for Sanctions for Abuse of Commission Process, and to Show Cause Why Rohm Co. Ltd. Has Not Violated Commission Rule 210.4(c),* 12 Pages, Dated Jun. 27, 2001 In the Matter of Certain Semiconductor Light Emitting Devices, Components Thereof, and Products Containing Same, Investigation No. 337-TA-444 before the U.S. International Trade Commission.

*Response and Counterclaim of Nichia Corporation and Nichia America Corporation,* 27 Pages, Dated Nov. 9, 2001, in Rohm Co., Ltd. v. Nichia Corporation and Nichia America Corporation v. Rohm Co., Ltd., and Cree, Inc., Civil Action No. 00-CV-6379, U.S. District Court for the Eastern District of Pennsylvania.

*Notice,* 4 Pages, Dated Mar. 8, 2002 In the Matter of Certain Semiconductor Light Emitting Devices, Components Thereof, and Products Containing Same, Investigation No. 337-TA-444 before the U.S. International Trade Commission.

*Nichia's Expedited Motion to Declare Rohm's Certificates of Correction Ineffective for this Action,* 3 Pages, Dated Jun. 26, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Memorandum in Support of Nichia's Expedited Motion to Declare Rohm's Certificates of Correction Ineffective for this Action,* with Exhibits A-H, 61 Pages, Dated Jun. 26, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Nichia Corporation's Objections and Responses to Rohm's Second Set of Interrogatories (Nos. 9-15),* 16 Pages, Dated Jul. 10, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Nichia's Brief in Opposition to Rohm's Motion for Leave to File a Supplemental Pleading and in Support of Nichia's Expedited Motion to Declare Rohm's Certificates of Correction Ineffective for this Action,* 7 Pages, Dated Jul. 22, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Nichia's Motion to Strike the '899 Patent from the Case,* 3 Pages, Dated Sep. 11, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Memorandum in Support of Nichia's Motion to Strike the '899 Patent from the Case,* with Exhibits 1-2, 63 Pages, Dated Sep. 11, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Brief of Rohm Co., Ltd. in Opposition to Nichia's Motion to Strike the '899 Patent from the Case,* with Exhibits 1-4, 29 Pages, Dated Sep. 25, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Nichia's Opposition to Rohm's Motion to Compel,* with Exhibits 1, 48 Pages, Dated Sep. 26, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Reply Memorandum in Support of Nichia's Motion to Strike the '899 Patent from the Case,* 10 Pages, Dated Oct. 2, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Nichia's Emergency Motion to Compel the Deposition of Alleged Sole Inventor Yukio Shakuda to Proceed on Jan. 30, 2004 and to Compel Shakuda to Review and Bring Documents Supporting His Alleged Inventorship,* with Proposed Order, 7 Pages, Dated Oct. 8, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Brief in Support of Nichia's Emergency Motion to Compel the Deposition of Alleged Sole Inventor Yukio Shakuda to Proceed on Jan. 30, 2004 and to Compel Shakuda to Review and Bring Documents Supporting His Alleged Inventorship,* with Exhibits A-D, 33 Pages, Dated Oct. 8, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Clarification to Nichia's Motion to Strike the '899 Patent from the Case and Nichia's Response to Rohm's Motion to Compel,* with Exhibits A-C, 16 Pages, Dated Oct. 14, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Reply Memorandum in Support of Nichia's Motion Compel,* with Exhibit 1, 24 Pages, Dated Nov. 3, 2003, in Rohm Co., Ltd. v. Nichia Corporation and Nichia America Corporation v. Rohm Co., Ltd., Civil Action No. 00-CV-6379, U.S. District Court for the Eastern District of Pennsylvania.

*Reply Brief in Support of Nichia's Emergency Motion to Compel the Deposition of Alleged Sole Inventor Yukio Shakuda to Proceed on Jan. 30, 2004 and to Compel Shakuda to Review and Bring Documents Supporting His Alleged Inventorship,* with Exhibits A-D, 29 Pages, Dated Dec. 4, 2003, in Rohm Co., Ltd. v. Nichia Corporation and Nichia America Corporation v. Rohm Co., Ltd., Civil Action No, 00-CV-6379, U.S. District Court for the Eastern District of Pennsylvania.

*Motion and Stipulation of Voluntary Dismissal with Prejudice Pursuant to Federal Rule of Civil Procedure 41(a)(2),* 2 Pages, Dated Feb. 12, 2004, in Rohm Co.. Ltd. v. Nichia Corporation and Nichia America Corporation, Civil Action No. 00-CV-6379, U.S. District Court for the Eastern District of Pennsylvania.

"Hole Compensation Mechanism of p-Type GaN Films," 9 pages.

"Shallow Impurity Passivation by Atomic Hydrogen," 14 pages.

Lockwood, H.F. et al., "An Efficient Large Optical Cavity Injection Laser ," *Applied Physics Letters,* vol. 17, No. 11, pp. 499-502 (Dec. 1, 1970).

Thompson, G.H.B. and Kirkby, P.A., "(GaAl)As Lasers With a Heterostructure for Optical Confinement and Additional Heterojunctions for Extreme Carrier Confinement," *IEEE Journal of Quantum Electronics,* vol. QE-9, No. 2, pp. 311-318 (Feb. 1973).

Maruska, H.P. et al., "Microstructural Observations on Gallium Nitride Light-Emitting Diodes," *J. Electrochem. Soc.: Solid-State Science and Technology,* pp. 1202-1207 (Sep. 1974).

Robinson, R.J. and Kun, Z.K., "p-n junction zinc sulfoselenide and zinc selenide light-emitting diodes," *Applied Physics Letters,* vol. 27, No. 2, American Institute of Physics, pp. 74-76 (Jul. 15, 1975).

Pearton, S.J. et al., "Hydrogen passivation of shallow level impurities and deep level defects in GaAs," *Inst. Phys. Conf. Ser. No. 83: Chapter 5,* (Paper presented at Int. Symp. GaAs and Related Compounds, Las Vegas, Nevada), pp. 289-294, IOP Publishing Ltd. (1986).

Thompson, G.H.B. et al., "Narrow-beam five layer (GaAl) As/GaAs heterostructure lasers with low threshold and high peak power," *Journal of Applied Physics,* vol. 47, No. 4, American Institute of Physics, pp. 1501-1505 (Apr. 1976).

Chinone, N. et al., "Highly efficient (GaAl)As buried-heterostructure lasers with buried optical guide," *Applied Physics Letters,* vol. 35, No. 7, pp. 513-516 (Oct. 1, 1979).

Botez, D., "cw high-power single-mode operation of constricted double-heterojunction AlGaAs lasers with a large optical cavity," *Applied Physics Letters,* vol. 36, No. 3, American Institute of Physics, pp. 190-192 (Feb. 1, 1980).

Mito, I. et al., "InGaAsP Planar Buried Heterostructure Laser Diode (PBH-LD) with Very Low Threshold Current," *Electronics Letters,* vol. 18, No. 1, pp. 2-3 (Jan. 7, 1982).

Kun, Z.K., "The variation of residual impurities in ZnSe crystals used in light-emitting diode fabrications," *Journal of Applied Physics,* vol. 53, No. 2, American Institute of Physics, pp. 1248-1250 (Feb. 1982).

Magnea, N. et al., "SEM and Photoluminescence Study of Li Segregation in Annealed Zinc Telluride," *Solid State Communications,* vol. 29, No. 1, Pergamon Press Ltd., pp. 35-38 (1979).

Dean, P.J. et al., "Ionization energy of the shallow nitrogen acceptor in zinc selenide," *Physical Review B,* vol. 27, No. 4, The American Physical Society, pp. 2419-2428 (Feb. 15, 1983).

Khan, M.A. et al., "Properties and ion implantation of $Al_xGa_{1-x}N$ epitaxial single crystal films prepared by low pressure metalorganic chemical vapor deposition," *Applied Physics Letters,* vol. 43, No. 5, American Institute of Physics, pp. 492-494 (Sep. 1, 1983).

Sah, C.-T. et al., "Study of the atomic models of three donor-like traps on oxidized silicon with aluminum gate from their processing dependencies," *Journal of Applied Physics,* vol. 54, No. 10, American Institute of Physics, pp. 5864-5879 (Oct. 1983).

Pankove, J.I. et al., "Neutralization of Shallow Acceptor Levels in Silicon by Atomic Hydrogen," *Physical Review Letters,* vol. 51, No. 24, The American Physical Society, pp. 2224-2225 (Dec. 12, 1983).

Hashimoto, M., "Effects of Hydrogen in an Ambient on the Crystal Growth of GaN Using $Ga(CH_3)_3$ and $NH_3$," *Journal of Crystal Growth,* vol. 68, Elsevier, Science Publishers B.V., pp. 163-168 (1984).

Stringfellow, G.B., "A Critical Appraisal of Growth Mechanisms in MOVPE," *Journal of Crystal Growth,* vol. 68, Science Publishers B.V., pp. 111-122 (1984).

Gowar, J., *Optical Communication Systems,* Second Edition, Prentice Hall, p. 414 (1984).

Pankove, J.I. et al., "Hole-mediated chemisorption of atomic hydrogen in silicon," *Applied Physics Letters,* vol. 47, No. 7, American Institute of Physics, pp. 748-750 (Oct. 1, 1985).

Hartmann, H. et al., *Wide gap II-VI compounds as electronic materials,* pp. 352, 353, 368, 369, 646, 647, 650 and 651.

Agrawal, G.P. and Dutta, N.K., *Long-Wavelength Semiconductor Lasers,* Van Nostrand Reinhold Company, p. 194 (1986).

Mawst, L.J. et al., "MOCVD of III-V Compound Epitaxial Layers," *Semiconductor International,* pp. 61-63 (Nov. 1986).

Pajot, B. et al., "Spectroscopic evidence for the hydrogen passivation of zinc acceptors in gallium arsenide," *Semiconductor Science Technology 2,* IOP Publishing Ltd., pp. 305-307 (1987).

Koide, Y. et al., "Energy band-gap bowing parameter in an $AL_xGA_{1-x}N$ alloy," *Journal of Applied Physics,* vol. 61, No. 9, American Institute of Physics, pp. 4540-4543 (May 1, 1987).

Yoo, T.-K. et al., "Surface-Emitting AlGaAs/GaAs DH LED with Buried-Window Cylindrical Lens," pp. L2357-L2360 (Dec. 1988).

Linden, K.J., "MOCVD: Expanding The Range of Photonic Materials," *Photonics Spectra,* pp. 91, 92, 94-98 and 100 (Feb. 1991).

Chevallier, J. et al., "Donor neutralization in GaAs(Si) by atomic hydrogen," *Applied Physics Letters,* vol. 47, No. 2, American Institute of Physics, pp. 108-110 (1985).

Moustakas, T.D. and Molnar, R.J., "Growth and Doping of GaN Films by ECR-Assisted MBE," *Mat. Res. Soc. Symp. Proc.,* vol. 281, Materials Research Society, pp. 753, 755, 757, 759, 761 and 763 (1993).

*Transmission Mode $3^{rd}$Gen. Photocathode Configuration,* 1 page.

Van Vechten, J.A. et al., "Defeating Compensation in Wide Gap Semiconductors by Growing in H that is Removed by Low Temperature De-Ionizing Radiation," *Japanese Journal of Applied Physics,* vol. 31, Part 1, No. 11, pp. 3662-3663 (Nov. 1992).

Andrews, J.E., "MO-CVD promises to be a cost-effective epitaxial technique," *Vacuum Technology,* 3 pages (Jan. 1983).

Hartmann, H. et al., "Wide Gap II-VI Compounds as Electronic Materials," *Current Topics in Materials Science,* vol. 9, North-Holland Publishing Company, pp. 1, 352, 353, 360, 361, 368 and 369 (1982).

Gossmann, H.-J. et al., "Doping of Si thin films by low-temperature molecular beam epitaxy," *Journal of Applied Physics,* vol. 73, No. 12, American Institute of Physics, pp. 8237-8241 (Jun. 15, 1993).

Neugebauer, J. and Van de Walle, C.G., Theory of Point Defects and Complexes in GaN, pp. 645-656.

"APA, AT&T in Laser Technology Pact," *Electronic News,* p. 50, Feb. 7, 1994).

"Blue-Green-Laser Pact Signed by APA Optics and AT&T," *BusinessWorld Briefs,* 1 page (Mar. 1994).

Wang, C. and Davis, R.F., "Deposition of highly resistive, undoped, and p-type, magnesium-doped gallium nitride films by modified gas source molecular beam epitaxy," *Applied Physics Letters,* vol. 63, No. 7, American Institute of Physics, pp. 990-992 (Aug. 16, 1993).

Sze, S.M., *Physics of Semiconductor Devices,* Second Edition, John-Wiley & Sons, pp. 724-730 (1981).

Fukuda, M., *Reliability and Degradation of-Semiconductor Lasers and LEDs,* Artech House, pp. 43-45 and 73-79 (1991).

Thompson, G.H.B., *Physics of Semiconductor Laser Devices,* John Wiley & Sons, pp. 156, 157, 262, 262-265 (1980).

Wood, D. *Optoelectric Semiconductor Devices,* Prentice Hall, pp. 111, 149-154, 157-159, 185 and 203 (1994).

Einspruch, N.G. and Frensley, W.R. (eds)., *Heterostructures and Quantum Devices,* Academic Press, pp. 220-222 (1994).

Verdeyen, J. T., *Laser Electronics,* Second Edition, Prentice Hall, pp. 389-392 (1989).

Osamura, K. et al., "Fundamental Absorption Edge In GaN, InN and Their Alloys," *Solid State Communications,* vol. 11, No. 5, Pergamon Press, pp. 617-621 (1972).

Akasaki, I. and Amano, H., "MOVPE Growth of High Quality $Al_xGa_{1-x}N/Ga_yIN_{1-y}N$ ($x \geq 0$, $y \leq 1$) Heterostructures for Short Wavelenght Light Emitter," *Materials Research Society Symposium Proceedings,* vol. 339, pp. 443-452 (1994).

Amano, H. et al., "Room-temperature violet stimulated emission from optically pumped AlGaN/GainN double heterostructure," *Applied Physics Letters,* vol. 64, No. 11, American Institute of Physics, pp. 1377-1379 (Mar. 14, 1994).

Samid, I. et al., "High-Peak-Power Asymmetric Double-Heterostructure (GaAI)As-GaAs Injection Laser," *Electronics Letters,* vol. 19, No. 19, The Institute of Electrical Engineers, pp. 754-755 (Sep. 15, 1983).

Sun, H.C. et al., "Properties of a Tunneling Injection Quatum-Well Laser: Recipe for a "Cold" Device with a Large Modulation Bandwidth," *IEEE Photonics Technology Letters,* vol. 5, No. 8, IEEE, pp. 870-872 (Aug. 1993).

Kamata, N. et al., "Separation of non-radiative and below-gap emission lifetimes in a heavily Si-doped GaAs/AIGaAs quantum well," *Journal of Luminescence 48 & 49,* Elsevier Science Publishers B.V., pp. 763-767 (1991).

Tsuchiya, H. et al., "Intersubband Absorption Changes In GaAs/AlGaAs MQW Induced by External Light," *Surface Science,* vol. 238, Nos. 1-3, North-Holland, pp. 172-175 (1990).

Katahama, H. et al., "Band and Deep Emission and Their Recombination Processes in a Heavily Si Doped GaAs/AlGaAs Quantum Well," *Superlattices and Microstructures,* vol. 5, No. 4, Academic Press Limited, pp. 523-526 (1989).

Fujimoto, I. et al., "Behaviour of heavily doped Si atoms in MBE grown GaAs revealed by X-ray quasi-forbidden reflection (XFR) method and photoluminescence measurement," *Inst. Phys. Conf. Ser. No. 91: Chapter 3, Paper presented at Int. Symp. GaAs and Related Compounds, Heraklion, Greece,* IOP Publishing Ltd., pp. 247-250 (1988).

Streifer, W. et al., "An Analytic Study of (GaAI)As Gain Guided Lasers at Threshold," *IEEE Journal of Quantum Electronics,* vol. QE-18, No. 5, IEEE, pp. 856-864 (May 1982).

Scifres, D.R. et al., "Leaky wave room-temperature double heterostructure HaAs:GaAIAs diode laser," *Applied Physics Letters,* vol. 29, No. 1, American Institute of Physics, pp. 23-25 (Jul. 1, 1976).

Mataki, H. and Tanaka, H., "Mass production of laser diodes by MBE," *Microelectronics Journal,* vol. 25, No. 8, Elsevier Science Lid., pp. 619-630 (1994).

Mataki, H. et al., "Mass production of AlGaAs laser diodes using MBE," *SPIE Proceedings: Fiber Optic Materials and*

*Components*, The International Society for Optical Engineering, vol. 2290, pp. 321-330 (Jul. 28-29, 1984).

Sakiyama, H. and Takuma, H., "AlGaAs Laser Diodes by the Molecular Beam Epitaxy Method," *Journal of Electronic Engineering*, vol. 26, No. 270, Dempa Publications, Inc., pp. 40-42 (May 1989).

Smith, F.W. et al., "New MBE Buffer Used to Eliminate Backgating in GAAs MESFET's," *IEEE Electron Device Letters*, vol. 9, No. 2, IEEE, pp. 77-80 (Feb. 1988).

Tsou, Y. and Garmire, E.M., "Improving InAs Double Heterostructure Lasers with Better Confinement," *IEEE Journal of Quantum Electronics*, vol. 28, No. 5, pp. 1261-1268 (May 1992).

Kawanaka, S. et al., "Strained Single Quantum Well AlGaInP Laser Diodes with an Asymmetric Waveguiding Layer," *Extended Abstracts of the 1992 International Conference on Solid State Devices and Materials, Tsukuba*, pp. 240-242 (Aug. 26-28, 1992).

Itaya, K. et al., "Highly Reliable 100mW Operation of Broad Area InGaAlP Visible Light Laser Diodes," *Electronics Letters*, vol. 27, No. 24, pp. 2257-2259 (Nov. 21, 1991).

Botez, D., "The Effect of Carried-Induced Index Depressions on Fundamental-Transverse-Mode Characteristics in DH Laser Structures," *RCA Review*, vol. 45, No. 1, RCA Laboratories, pp. 23-32 (Mar. 1984).

Kazi, K. and Jain, F.C., "Modal Analysis of IncGaAsP-InP, GaAs/AlGaAs-GaAs, and InGaAsP/AlGaAs-GaAs MIS Heterostructure Lasers," *International Journal of Infrared and Millimeter Waves*, vol. 7, No. 6, Plenum Publishing Corporation, pp. 891-907 (Jun. 1986).

Murata, H. et al., "Low Threshold Current Density of 620 nm Band MQW-SCH AlGaInP Semiconductor Lasers With Mg Doped AlInP Cladding Layer," *Electronics Letters*, vol. 27, No. 17, IEE, pp. 1569-1571 (Aug. 15, 1991).

Shah, P. and Mitin, V., "Threshold Characteristics of Blue to Ultraviolet Light Emitting Semiconductor Lasers Based on the AlGaN Material System," IEEE, pp. 160-169 (1995).

Kolbas, R.M. and Krishnankutty, S., "Optoelectronic Properties of GaN, AlGaN and AlGaN-GaN Quantum Well Heterostructures," pp. 19-20.

Akasaki, I. and Amano, H., "UV/Blue Light Emitting AlGaN/GaN Heterostructures," pp. 14-15.

Benchimol, J.L. et al., "Growth and modelling of InAsPSb. InAs double heterosturctures," *Inst. Phys. Conf. Ser. No. 83: Chapter 7-Paper presented at Int. Symp. GaAs and Related Compounds, Las Vegas, Nevada*, IOP Publishing Ltd., pp. 385-390 (Sep. 28-Oct. 1, 1986).

Suemune, I., "Theoretical Estimation of Leakage Current in II-VI Heterostructure Lasers," *Japanese Jounral of Applied Physics*, vol. 31, Part 2, No. 2A, pp. L95-L98 (Feb. 1, 1992).

Watanabe, M.O. and Ohba, Y., "Interface properties for GaAs/InGaAlP heterojunctions by the capacitance-voltage profiling technique," *Applied Physics Letters*, vol. 50, No. 14, American Institute of Physics, pp. 906-908 (Apr. 6, 1987).

Yablonovitch, E. and Kane, E.O., "Reduction of Lasing Threshold Current Density by the Lowering of Valence Band Effective Mass," *Journal of Lightwave Technology*, vol. LT-4, No. 5, IEEE, pp. 504-506 (May 1986).

Mori, K. et al., "Band Discontinuity Reduction of i-GaInAsP/p-InP for Improving 1.55µm GaInAsP/InP Surface Emitting Laser Performances," *Conference Proceedings-Sixth International Conference on Indium Phosphide and Related* Materials, IEEE, pp. 311-314 (Mar. 27-31, 1994).

Ohki, Y. et al., "Fabrication and properties of a practical blue-emitting GaN m-i-s diode," *Inst. Phys. Conf. Ser. No. 63: Chapter 10-Paper presented at Int. Symp. GaAs and Related Compounds, Japan*, the Institute of Physics, pp. 479-484 (1981).

Amano, H. et al., "Metalorganic vapor phase epitaxial growth of a high quality GaN film using an AlN buffer layer," *Applied Physics Letters*, vol. 48, No. 5, American Institute of Physics, pp. 353-355 (Feb. 3, 1986).

Haase, M.A. et al., "Blue-green laser diodes," *Applied Physics Letters*, vol. 59, No 11, American Institute of Physics, pp. 1272-1274 (Sep. 9, 1991).

Amano, H. et al., "Stimulated Emission Near Ultraviolet at Room Temperature from a GaN Film Grown on Sapphire by MOVPE Using an AlN Buffer Layer," *Japanese Journal of Applied Physics*, vol. 29, No. 2, pp. L205-L206 (Feb. 1990).

Khan, M.A. et al., "Vertical-cavity, room-temperature stimulated emission from photopumped GaN films deposited over sapphire substrates using low-pressure metalorganic chemical vapor deposition," *Applied Physics Letters*, vol. 58, No. 14, American Institute of Physics, pp. 1515-1517 (Apr. 8, 1991).

Kressel, H. and Butler, J.K. (eds.), *Semiconductor Lasers and Heterojunction LEDs*, Academic Press, pp. 137-141, 205-207, 222-235, 264-271, 280-287 and 456-461 (1977).

Ohtsu, M., *Highly Coherent Semiconductor Lasers*, Artech House, Inc., pp. 15-21 (1992).

Botez, D. and Connolly, J.C., "Terraced-heterostructure large-optical-cavity AlGaAs diode laser: A new type of high-power cw single-mode device," *Applied Physics Letters*, vol. 41, No. 4, American Institute of Physics, pp. 310-312 (Aug. 15, 1982).

Henderson, G.N. et al., "Optical transitions to above-barrier quasibound states in asymmetric semiconductor heterostructures," *Applied Physics Letters*, vol. 62, No. 12, American Institute of Physics, pp. 1432-1434 (Mar. 22, 1993).

Akasaki, I. and Amano, H., "Room Temperature Ultraviolet/Blue Light Emitting Devices Based on AlGaN/GaN Multi-Layered Structure," *Extended Abstracts of the 1992 International Conference on Solid State Devices and Materials, Tsukuba*, pp. 327-329 (1992).

Akasaki, I. and Amano, H., "Widegap Column-III Nitride Semiconductors for UV/Blue Light Emitting Devices," *Journal of the Electrochemical Society*, vol. 141, No. 8, The Electrochemical Society, Inc., pp. 2266-2271 (Aug. 1994).

Amano, H. et al., "Room-Temperature Low-Threshold Surface-Stimulated Emission by Optical Pumping from $AL_{0.1}Ga_{0.9}N$/GaN Double Heterostructure," *Japanese Journal of Applied Physics*, vol. 32, Part 2, No. 7B, pp. L1000-L1002 (Jul. 15, 1993).

Ohtoshi, T. et al., "High-power visible GaAlAs lasers with self-aligned strip buried heterostructure," *Journal of Applied Physics*, vol. 56, No. 9, American Institute of Physics, pp. 2491-2496 (Nov. 1, 1984).

Evans, G.A. et al., "Observations and Consequences of Nonuniform Aluminum Concentration in the Channel Regions of AlGaAs Channeled-Substrate-Planer Lasers," *IEEE Journal of Quantum Electronics*, vol. QE-23, No. 11, IEEE, pp. 1900-1908 (Nov. 11, 1987).

Iyer, S.V. et al., "Modeling of distortions in optical characteristics of semiconductor lasers due to noise in MBE growth temperature measurement," *SPIE Proceedings-Physics and Simulation of Optoelectronic Devices II*, vol. 2146, The International Society for Optical Engineering, pp. 148-159 (Jan. 24-26, 1994).

Jennings, A. et al., "Asymmetric Fabry-Perot Device Arrays with Low Insertion Loss and High Uniformity," *IEEE Photonics Technology Letters*, vol. 4, No. 8, IEEE, pp. 858-860 (Aug. 1992).

Koike, M. et al., "Light-Emitting Devices Based on Gallium Nitride and Related Compound Semiconductors," *Materials Research Society Symposium Proceedings*, vol. 395, Materials Research Society, pp. 889-895 (Nov. 27-Dec. 1, 1995).

Steigerwald, D. et al., "III-V Nitride Semiconductors for High-Performance Blue and Green Light-Emitting Devices," *JOM*, pp. 18-23 (Sep. 1997).

Figueroa, L. et al., "High Power Semiconductor Lasers," *SPIE Proceedings—Progress in Laser Diodes*, vol. 723, The International Society for Optical Engineering, pp. 2-24 (Sep. 25-26, 1986).

Garmire, E. et al., "Longitudinal mode control in GaAs lasers using a three-mirror active-passive cavity," pp. 106-108, Reprinted from *Applied Physics Letters*, vol. 39, No. 10, American Insitute of Physics, pp. 789-791 (Nov. 15, 1981).

Reinhart, F.K. et al., "GaAs-$Al_x$ $Ga_{1-x}As$ injection lasers with distributed Bragg reflectors," pp. 173-175, Reprinted from *Applied Physics Letters*, vol. 27, No. 1, American Institute of Physics, pp. 45-48 (Jul. 1, 1975).

Kressel, H. et al., "Low-Threshold $AL_x$ $GA_{1-x}As$ Visible and IR-Light-Emitting Diode Lasers," pp. 285-291, Reprinted from *IEEE Journal of Quantum Electronics*, vol. QE-6, No. 6, IEEE, pp. 278-284 (Jun. 1970).

Ikeda, M. et al., "Room-temperature continuous-wave operation of an AIGaInP double heterostructure laser grown by atmospheric pressure metalorganic chemical vapor deposition," pp. 295-296, Reprinted from *Applied Physics Letters*, vol. 47, No. 10, American Institute of Physics, pp. 1027-1028 (Nov. 15, 1985).

Morkoç, H. *Nitride Semiconductors and Devices*, Springer, pp. 26-31 and 57-66.

Khan, M.A. et al., "Growth of high optical and electrical quality GaN layers using low-pressure metalorganic vapor deposition," *Applied Physics Letters*, vol. 58, No. 5, American Institute of Physics, pp. 526-527 (Feb. 4, 1991).

Akasaki, I. and Amano, H., "Conductivity Control of AIGaN, Fabrication of AIGaN/GaN Multi-Heterostructure and Their Application to UV/Blue Light Emitting Devices," *Materials Research Society Symposium Proceedings*, vol. 242, Materials Research Society, pp. 383-394 (1992).

Sturge, M.D. (ed.), *Journal of Luminescence: An Interdisciplinary Journal of Research on Excited State Processes in Condensed Matter*, vols. 48 and 49, Part II, North-Holland, Cover page (1991).

*Japanese Journal of Applied Physics*, vol. 29, No. 4, Part 2 Letters, Table of Contents (Apr. 1990).

Christou, A. and Rupprecht, H.S. (eds.), *Proceedings of the Fourteenth International Symposium on Gallium Arsenide and Related Compounds held in Heraklion, Crete*, IOP Publishing Ltd., Cover page (Sep. 28-Oct. 1, 1987).

*Journal of Electronic Materials*, vol. 19, No. 7, IEEE, pp. 17-18 (Jul. 1990).

*CLEO® '94 Summaries of papers presented at the Conference on Lasers and Electro-Optics*, vol. 8, pp. 202, 203 and 205 (May 8-13, 1994).

Akasaki, I. and Amano, H., "Prospects of GaN-Based Laser Diode," *Japanese Journal of Optics*, vol. 22, No. 11, pp. 670-675 (Nov. 1993).

Amano, H. and Akasaki, I., "Present and future prospects of GaN-based short-wavelength, light emitting devices," *Oyo Buturi*, vol.63, No. 12, pp. 1243-1247 (Dec. 12, 1994).

Japanese Article from *Science Forum*, 6 pages (1986).

Blakemore, J.S., "Semiconducting and other major properties of gallium arsenide," *Journal of Applied Physics*, vol. 53, No. 10, American Institute of Physics, pp. R123-R130 and R132-R181 (Oct. 1982).

Pramatarova, L.D. et al., "Preparation of GaAs Substrates for MBE," *Cryst. Res. Technol.*, vol. 23, No. 1, pp. K11 and K13-K15 (1988).

Nagata, F. and Kakibayashi, H., "Electron Microscopy for Compound Semiconductors," *J. Electron Microsc.*, vol. 34, No. 4, pp. 311 and 313-315 (1985).

Gomik, E. and Tsui, D.C., "Voltage-Tunable Far-Infrared Emission from Si Inversion Layers," *Physical Review Letters*, vol. 37, No. 21, pp. 1425, 1426 and 1428 (Nov. 22, 1976).

Holm, D.A. and Taylor, H.F., "Infrared Phase Modulators with Multiple Quantum Wells," *IEEE Journal of Quantum Electronics*, vol. 25, No. 11, IEEE, pp. 2266 and 2271 (Nov. 1989).

Covington, B.C. et al., "Infrared intersubband absorption in GaAs/AIAs multiple quantum wells," *Applied Physics Letters*, vol. 54, No. 21, American Institute of Physics, pp. 2145 and 2147 (May 22, 1989).

Borenstain, S.I. and Katz, J., "Evaluation of the feasibility of a far-infrared laser based on intersubband transitions in GaAs quantum wells," *Applied Physics Letters*, vol. 55, No. 7, American Institute of Physics, p. 654 (Aug, 14, 1989).

Newson, D.J. and Kurobe, A., "Simulation of saturation and relaxation of intersubband absorption in doped quantum wells," *Applied Physics Letters*, vol. 53, No. 25, American Institute of Physics, pp. 2516 and 2518 (Dec. 19, 1988).

Wu, Y., *Metalorganic Molecular Beam Epitaxial Growth and Characterization of ZnSe-Based II-VI Semiconductors*, Dept. of Electrical Engineering, Kyoto University, pp. i-iv, 1-50, 53-140 and 143-159 (May 1991).

Page showing graph of BGE v. mole fraction x of InGaAs for light hole, heavy hole, and unstrained structure, 1 page.

Goetz, K.-H. et al., "Optical and crytallographic properties and impurity incorporation of $Ga_xIn_{1-x}As$ (0.44<x<0.49) grown by liquid phase epitaxy, vapor phase epitaxy, and metal organic chemical vapor deposition," *Journal of Applied Physics*, vol. 54, No. 8, American Institute of Physics, pp. 4543-4550 and 4552 (Aug. 1983).

Kirby, P.B. et al., "Photoluminescence study of undoped and modulation-doped pseudomorphic $Al_yGa_{1-y}As/In_xGa_{1-x}As/Al_yGa_{1-y}As$ single quantum wells," *Physical Review B*, vol. 40, No. 5, pp. 3013-3105 and 3018-3020 (Aug. 15, 1989).

Ekenberg, U., "Enhancement of nonparabolicity effects in a quantum well," *Physical Review B*, vol. 36, No. 11, The American Physical Society, pp. 6152 and 6154 (Oct. 15, 1987).

Cho, H.-S. and Prucnal P.R., "New formalism of the Kronig-Penney model with application to superlattices," *Physical Review B*, vol. 36, No. 6, The American Physical Society, pp. 3237, 3238 and 3240 (Aug. 15, 1987).

Matsushita Technoresearch Graphical Printouts, 4 pages (Apr. 19, 1994).

Kudo, K. et al., "Photoluminescence spectra of undoped GaAs grown by molecular-beam epitaxy at very high and low substrate temperatures," *Journal of Applied Physics*, vol. 59, No.3, American Institute of Physics, pp. 888, 889 and 891 (Feb. 1, 1986).

Jacob, G. et al., "Gallium Nitride Emitting Devices Preparation and Properties," *Journal of Electronic Materials,* vol. 7, No. 4, AIME, pp. 499, 501-514 (1978).

Butler, J.K., "Theory of Transverse Cavity Mode Selection in Homojunction and Heterojunction Semiconductor Diode Lasers," p. 81, Reprinted from *Journal of Applied Physics,* vol. 42, pp. 4447-4457 (Oct. 1971).

Hamada, H. et al., "Wide-Stripe AlGaInP Laser Diode Current-Blocking Region Near Facets Grown on Misoriented Substrates," *Electronics Letters,* vol. 27, No. 19, pp. 1713-1715 (Sep. 12, 1991).

Xu, Y.-N. and Ching, W.Y., "Electronic, optical, and stuctural properties of some wurtzite crystals," *Physical Review B,* vol. 48, No. 7, The American Physical Society, pp. 4335-4348 (Aug. 15, 1993).

Mohammad, S.N. et al., "Emerging Gallium Nitride Based Devices," *Proceedings of the IEEE,* vol. 83, No. 10, pp. 1320-1355 (Oct. 1995).

Masu, K. et al., "Transmission Electron Microscopic Observation of AlN/$\alpha$-Al$_2$O$_3$ Heteroepitaxial Interface with Initial-Nitriding AlN Layer," *Japanese Journal of Applied Physics,* vol. 34, Part 2, No. 6B, pp. L760, L761 and L763 (Jun. 15, 1995).

Nahamura, S. et al., "Cd-Doped InGaN Films Grown on GaN Films," *Japanese Journal of Applied Physics,* vol. 32, Part 2, No. 3A, pp. L338 and L340 (Mar. 1, 1993).

Wong, W.S. et al., "Fabrication of In$_x$Ga$_{1-x}$N Laser Diodes on Copper Substrates by Laser Lift," 2 pages.

Morkoç, H. et al., "GaN based II-V nitrides by molecular beam epitaxy," *Journal of Crystal Growth,* vol. 150, Elsevier Science B.V., pp. 887-890 (1995).

Pearton, S.J., "Hydrogenation of III-V Semiconductors During Processing," *Materials Science Forum,* vols. 148-149, Trans Tech Publications, Switzerland, pp. 113-134, 138 and 139 (1994).

Stockman, S.A. and Stillman, G.E., "Hydrogen in III-V Device Structures," *Materials Science Forum,* vols. 148-149, Trans Tech Publications, Switzerland, pp. 501-524, 529-531, 534 and 535 (1994).

Bykhovski, A. et al., "Strain and charge distribution in GaN-AlN-GaN semiconductor-insulator-semiconductor structure for arbitrary growth orientation," *Applied Physics Letters,* vol. 63, No. 16, American Institute of Physics, pp. 2243 and 2245 (Oct. 18, 1993).

Wlckenden, D.K. et al., "High quality self-nucleated Al$_x$Ga$_{1-x}$N layers on (00.1) sapphire by low-pressure metalorganic chemical vapor deposition," *Applied Physics Letters,* vol. 65, No. 16, American Institute of Physics, pp. 2024 and 2026 (Oct. 17, 1994).

Nakamura et al., "Thermal Annealing Effect of P-Type Mg-Doped GaN Films", Jpn. J. Appl. Phys. vol. 31, (1992), pp. L139-L142.

Watanabe et al., "Annealing effect on the electrical properties of heavily C-doped p GaAs", Appl. Phys. Lett. 59 (4), Jul. 22, 1991, American Institute of Physics.

Delphion, Intellectual Property Network, translation of U.S. 4,960,720.

Amano et al., "Electron Beam Effects on Blue Luminescence of Zinc-Doped GaN", Journal of Luminescence 40 & 41 (1998), pp. 121-122, Elsevier Science Publishers B.V., North-Holland, Amsterdam.

Maruska et al., "The Preparation and Properties of Vapo-Deposited Single-Crystal Line GaN", Applied Physics Letters, vol. 15, No. 10, Nov. 15, 1969.

Johnson et al., "Hydrogen passivation of shallow-acceptor impurities in p-type GaAs", Physical Review B, vol. 33, No. 2, Jan. 15, 1986, The American Physical Society.

Antell et al., "Passivation of zinc acceptors in InP by atomic hydrogen coming from arsine during metalorganic vapor phase epitaxy".

Akasaki et al., "Photoluminescense of Mg-doped p-type GaN and electroluminescence of GaN p-n junction LED", Journal of Luminescence 48 & 49, pp. 666-670, Elsevier Science Publishers B.V., North-Holland.

Khan et al., "P-type Conversion of Nitrogen Doped ZnSe. Films Grown by MOCVD", pp. 251-256, Mat. Rse. Soc. Symp. Proc. vol. 222, 1991, Materials Research Society.

Laks et al., "Native defects and self-compensation in ZnSe", pp. 10 965-10 978, vol. 45, No. 19, Physical Review B, vol. 45, No. 19, May 15, 1992, The American Physical Society.

Van De Walle et al., "Solubilities defect reactions and doping limits in ZnSe", pp. 704-709, Journal of Crystal Growth 117, 1992, Elsevier Science Publishers B.V., North Holland.

Laks et al., "Role of Native Defects in Wide-Band Gap Semiconductors", pp. 648-651, Physical Review Letters, vol. 66, No. 5, 1991 The American Physical Society.

Neumark et al., "Li Doped ZaSe and Problems of p-Type Conduction", pp. 189-194, Journal of Crystal Growth 59, 1982, North Holland Publishing Company.

Neumark, "Effect of deep levels on semiconductor carrier concentrations in the case of "strong" compensation", pp. 2250-2252, Physical Review B, vol. 26, No. 4, , 1982 The American Physical Society.

Neumark, "Are impurities the cause of "self"-compensation in large-band-gap semiconductors?", pp. 3383-3387, J. Appl. Phys. 51(6), Jun. 1980, American Institute of Physics.

Neumark, "Achievement of Well Conducting Wide-Band-Gap Semiconductors: Role of Solubility and Nonequilibrium Impurity Incorporation", Physical Review Letters, pp. 1800-1805, vol. 62, No. 5, 1989 The American Physical Society.

Boulou et al., "Recombination Mechanisms in GaN:Zn", pp. 767-770, Journal of Luminescence 18/19 (1979), North-Holland Publishing Company.

Furtado et al., "Study of the Influence of Annealing Effects in GaN VPE", pp. 257-267, Journal of Crystal Growth 64 (1983), North-Holland Publishing Company.

Desnica et al., "Method of growing of p-type GaN in nonequilibrium conditions", pp. 4119-4120, Physical Review B, vol. 15, No. 8, Apr. 15, 1977.

Boulou et al., "Cathodoluminescence Study of Zn Doped GaN", pp. 555-561, Revue de Physique Appliquee, Nov. 13, 1978.

Madar et al., "Growth Anisotrophy in the GaN/Al$_2$O$_3$ Sytem", pp. 239-251, Journal of Crystal Growth 49 (1977), North-Holland Publishing Company.

Shuto et al., "Noncollinearly Phase-Matched Second Harmonic Generation in Stilbene-Dye-Attached Polymer Thin Films", pp. 2508-2512, Japanese Journal of Applied Physics, vol. 28, No. 12, Dec. 12, 1989.

Pankove, "Low-Voltage Blue Elctroluminescence in GaN", pp. 721-724, IEEE Transactions on Electron Device, vol. Ed-22, No. 9, Sep. 9, 1975.

Pankove, "Luminescence in GaN", Journal of Luminescence 7 (1977), pp. 114-126, North-Holland Publishing Company.

Jacob et al., "Optimized Growth Conditions and Properties of N-Type and Insulating GaN", Gallium Nitride, vol. 11, No. 4, pp. 445-450.

Vasilishchev et al., "Gallium nitride diodes emitting dark blue to violet light", Sov. Phys. Semicond., vol. 9, No. 9, pp. 1189-1190.

Zykov et al., "Influence of Temperature on the Luminescence Bands of Gallium Nitride", Soviet Physics-Semiconductor, vol. 6, No. 1, pp. 154-156, Jul. 1972.

Jacob et al., "Gallium Nitride Emitting Devices Preparation and Properties", Journal of Electronic Materials, vol. 7, No. 4, pp. 499-514, 1978 AIME.

Pankove et al., "Photoluminescence of Zn-implanted GaN", Appl. Phys. Lett., vol. 24, No. 6, pp. 281-283, , Mar. 15, 1974.

Metcalfe et al., "Cathodoluminescence from Gallium Nitride Implanted with Arsenic or Phosphorous", Journal of Luminescence 16 (1978) pp. 405-415, North-Holland Publishing Company.

Wilson et al., "Implantation and Redistribution of Dopants and Isolation Species in GaN and Related Compounds", Solid-State Electronics, vol. 38, No. 7, pp. 1329-1333, 1995 Elsevier Ltd., published in Great Britain.

Karpinski et al., "Equilibrium Pressure of $N_2$ Over GaN and High Pressure Solution Growth of GaN", Journal of Crystal Growth 66 (1984), pp. 1-10.

Zolper et al., "Ion Implantation and Rapid Thermal Processing of III-V Nitrides", Journal of Electronic Materials, vol. 27, No. 5, pp. 839-844.

Strite et al., "GaN, AlN, and InN: A review", Critical Review, J. Vac. Sci. Technol. B, vol. 10, No. 4, pp. 1237-1265, Jul./Aug. 1992, American Vacuum Society.

Dmitriev et al., "Three-color blue-green-red display made from one single crystal", Sov. Tech. Phys. Lett. 12(5), p. 221, May 1986.

Pankove et al., "Photoluminescence of ion-implanted GaN", Journal of Applied Physics, vol. 47, No. 12, pp. 5387-5390, Dec. 12, 1976, American Institute of Physics.

Pearton et al., "Ion Implantation doping and isolation of GaN", Appl. Phys. Lett. 67 (10), pp. 1435-1437, Sep. 4, 1995.

Lee et al., "Hydrogen passivation of Ca acceptors in GaN", Appl. Phys. Lett. 68 (15), pp. 2102-2104, Apr. 8, 1996, American Institute of Physics.

Wilson et al., "Thermal stability of implanted dopants in GaN", Appl. Phys. Lett., vol. 66, No. 17, pp. 2238-2240, Apr. 24, 1995.

Binari et al., "H, He, and N implant isolation of n-type GaN", J. Appl. Phys. 78 (5), pp. 3008-3011, Sep. 1, 1995, American Institute of Physics.

Zolper et al., "Ca and O ion implantation doping of GaN", Appl. Phys. Lett. 68 (14), pp. 1945-1947, Apr. 1, 1996, American Institute of Physics.

Herres et al., "Effect of interfacial bonding on the structural and vibrational properties of InAs/GaSb superlattices", Physical Review B, vol. 53, No. 23, pp. 15 687-15 705, Jun. 15, 1996.

Maruska et al., "Violet luminescence of Mg-doped GaN", Appl. Phys. Lett. vol. 22, No. 6, pp. 303-305, Mar. 15, 1973, American Institute of Physics.

Opposition papers of Ep Patent Application No. 923101323. Notice of Opposition of EP 0.541.373, filed Jun. 30, 1999 in EP Patent Office.

Response letter to Oppositions by A.A. Thornton & Co., dated Mar. 3, 2000.

Ando, T., "Self-Consistent Results for a $GaAs/Al_xGa_{1-x}As$ Heterojunction. I. Subband Structure and Light Scattering Spectra", J. Phys. Soc. Jpn. 51, pp. 3893-3899 (1982).

Ando, T., "Self-Consistent Results for a $GaAs/Al_xGa_{1-x}As$ Heterojunction. II. Low Temperature Mobility", J. Phys. Soc. Jpn. 51, pp. 3900-3907 (1982).

Ando, T. and Mori, S., "Effective-Mass Theory of Semiconductor Heterojunctions and Superlattices," Surf. Sci. 113, pp. 124-130 (1982).

Hedin, L. and Lundqvist, B.I., "Explicit local exchange-correlation potentials," J. Phys. C: Solid St. Phys., vol. 4, pp. 2064-2082 (1971).

Ploog, K., "Molecule Beam Epitaxy of Artificially Layered III-V Semiconductors: Ultrathin-Layer $(GaAs)_m(AlAs)_m$ Superlattices and Delta ($\delta$-) Doping in GaAs", Physica Scripta, vol. T19, pp. 136-146 (1987).

Ploog, K., "Delta-($\delta$-) Doping In MBE-Grown GaAs: Concept and Device Application," Journal of Crystal Growth 81, North-Holland, pp. 304-313 (1987).

Ogawa, M. and Baba, T., "Heavily Si-Doped GaAs and AlAs/n-GaAs Superlattice Grown by Molecular Beam Epitaxy," Japanese Journal of Applied Physics, vol. 24, No. 8, pp. L572-L574 (Aug. 1995).

Sasa, S. et al., "Si Atomic-Planar-Doping in GaAs Made by Molecular Beam Epitaxy," Japanese Journal of Applied Physics, vol. 24, No. 8, pp. L602-L604 (Aug. 1995).

Yao, T. et al., "The effects of substrate temperature on the donor ionization energy and on the material properties of selectively doped short-period GaAs:Si/AlAs superlattices," J. Appl. Phys. 62(5), American Institute of Physics, pp. 1925-1930 (Sep. 1, 1987).

Horikoshi, Y. et al., "High-Mobility Two-Dimensional Electron Gas from Delta-Doped Asymmetric $Al_xGa_{1-x}As/GaAs/Al_yGa_{1-y}As$ Quantum Wells," Japanese Journal of Applied Physics, vol. 26, No. 2, pp. 263-266 (Feb. 1987).

Ploog, K. et al., "Improved electron mobility by AlAs spacer in one-sided selectively doped $Al_xGa_{1-x}As/GaAs$ multiple quantum well heterostructures," Appl. Phys. Lett. 50 (18), American Institute of Physics, pp. 1237-1239 (May 4, 1987).

Ploog, K., "GaAs Doping Superlattices A New Class of Semiconductor Materials Grown by Molecular Beam Epitaxy," Collected Paper of MBE-CST-2, Tokyo, pp. 17-20 (1982).

Theis, T.N. and Wright, S.L., "Origin of 'residual' persistent photoconductivity in selectively doped $GaAs/Al_xGa_{1-x}As$ heterojunctions," Appl. Phys. Lett. 48 (20), American Institute of Physics, pp. 1374-1376 (May 19, 1986).

Hiyamizu, S. et al., "A New Heterostructure for 2DEG System with a Si Atomic-Planar-Doped AlAs-GaAs-AlAs Quantum Well Structure Grown by MBE," Japanese Journal of Applied Physics, vol. 24, No. 6, pp. L431-L433 (Jun. 1985).

Baba, T. et al., "AlAs/n-GaAs superlattice and its application to high-quality two-dimensional electron gas systems," J. Appl. Phys. 59 (2), American Institute of Physics, pp. 526-532 (Jan. 15, 1986).

Street, R.A. et al., "Luminescence of n-i-p-i heterostructures," Physical Review B, vol. 33, No. 10, pp. 7043-7046 (May 15, 1986).

Schubert, E.F. and Ploog, K., "Interpretation of Capacitance-Voltage Profiles from Delta-Doped GaAs Grown by Molecular Beam Epitaxy," Japanese Journal of Applied Physics, vol. 25, No. 7, pp. 966-970 (Jul. 1986).

Nishikawa, Y. et al., "MOCVD Growth Of InGaAlP Using Ethyldimethylindium As An In Source And Application To Visible-Region Lasers," Journal of Crystal Growth 104, Elsevier Science Publishers B.V., pp. 245-249 (1990).

Miller, L.M. et al., "Characteristics of step-graded separate confinement quantum well lasers with direct and indirect barriers," *J. Appl. Phys. 68* (5), American Institute of Physics, pp. 1964-1967 (Sep. 1, 1990).

Sawada, T. and Majerfeld, A., "Carrier Concentratation and Composition Profiling for GaAs/AlGaAs Laser Diodes," *Bulletin of the Faculty of Engineering,* Hokkaido University, No. 133, pp. 59-72 (1986).

LePore, J.J., "An improved technique for selective etching of GaAs and $Ga_{1-x}Al_xAs$," *J. Appl. Phys. 51 (12)*, American Institute of Physics, pp. 6441-6442 (Dec.1980).

Sandroff, C.J. et al., "Dramatic enhancement in the gain of a GaAs/AlGaAs heterostructure bipolar transistor by surface checmical passivation," *Appl. Phys. Lett. 51 (1)*, American Institute of Physics, pp. 33-35 (Jul. 6, 1987).

Takado, N. et al., "Chemically enhanced focused ion beam etching of deep grooves and laser-mirror facets in GaAs under $Cl_2$gas irradiation using a fine nozzle," *Appl. Phys. Lett. 50(26)*, American Institute of Physics, pp. 1891-1893 (Jun. 29, 1987).

Ohba, Y. and Hatano, A., "H-Atom Incorporation in Mg-Doped GaN Grown by Metalorganic Chemical Vapor Deposition," *Jpn. J. Appl. Phys.,* vol. 33, Part 2, No. 10A, pp. L1367-L1369 (Oct. 1, 1994).

Olszakier, M. et al., "Photoinduced Intersubband Absorption in Undoped Multi-Quantum-Well Structures," *Physical Review Letters,* vol. 62, No. 25, pp. 2997-3000 (Jun. 19, 1989).

Seilmeier, A. et al., "Direct Observation of Intersubband Relaxation in Narrow Multiple Quantum Well Structures," *Solid-State Electronics,* vol. 31, No. 3 / 4, Pergamon Journals Ltd., pp. 767-770 (1988).

Yang, C. and Pan, D., "Intersubband absorption of silicon-based quantum wells for infrared imaging," *J. Appl. Phys. 64(3)*, American Institute of Physics, pp. 1573-1575 (Aug. 1, 1988).

Andersson, J.Y. and Landgren, G., "Intersubband transitions in single AlGaAs/GaAs quantum wells studied by Fourier transform infrared spectroscopy," *J. Appl. Phys. 64(8)*, American Institute of Physics, pp. 4123-4127 (Oct. 15, 1988).

Goldberg, B.B. et al., "Inelastic Light Scattering Of Valence Subband Transitions In GaAs/GaAlAs Multiple Quantum Wells," *Surface Science 196,* Elsevier Science Publishers B.V., pp. 619-625 (1988).

Julien, F.H. et al., "Optical saturation of intersubband absorption in GaAs-$Al_xGa_{1-x}As$ quantum wells," *Appl. Phys. Lett. 53(2)*, American Institute of Physics, pp. 116-118 (Jul. 11, 1988).

Goossen, K.W. et al., "Conduction-band offset determination in GaAs-$Al_xGa_{1-x}As$ through measurement of infrared internal photoemission," *Physical Review B,* vol. 36, No. 17, The American Physical Society, pp. 9370-9373 (Dec. 15, 1987).

Kastalsky, A. et al., "Photovoltaic detection of infrared light in a GaAs/AlGaAs superlattice," *Appl. Phys. Lett. 52(16)*, American Institute of Physics, pp. 1320-1322 (Apr. 18, 1988).

Bäuerle, R.J. et al., "Picosecond infrared spectroscopy of hot carriers in a modulation-doped $GA_{0.47}In_{0.53}As$ multiple-quantum-well structure," *Physical Review B,* vol. 38, No. 6, The American Physcial Society, pp. 4307-4310 (Aug. 15, 1988).

Seilmeier, A. et al., "Intersubband Relaxation in GaAs-$Al_xGa_{1-x}As$ Quantum Well Structures Observed Directly by an Infrared Bleaching Techniques," *Physical Review Letters,* vol. 59, No. 12, The American Physical Society, pp. 1345-1348 (Sep. 21, 1987).

Abstreiter, G. et al., "Electronic Excitations In Narrow GaAs/$Al_xGa_{1-x}As$ Quantum Well Structures," *Surface Sciences 196,* Elsevier Science Publishers B.V., pp. 613-618 (1988).

Seilmeier, A. et al., "Picosecond Intersubband Spectroscopy," *Superlattices and Microstructures,* vol. 5, No. 4, Academic Press Limited, pp. 569-574 (1989).

Kane, M.J. et al., "Intersubband Absorption and Infrared Modulation in GaAs/AlGaAs Single Quantum Wells," *Superlattices and Microstructures,* vol. 5, No. 4, Academic Press Limited, pp. 587-589 (1989).

Asai, H. et al., "Structure Dependence of Intersubband Absorption in InGaAs/InAlAs Multiquantum Wells," 6 pages.

Zhou, X. et al., "Intersubband absorption in strained $In_x Ga_{1-x}As/Al_{0.4}Ga_{0.6}As(0 \leq x \leq 0.15)$ multiquantum wells," *Appl. Phys. Lett. 54(9)*, American Institute of Physics, pp. 855-856 (Feb. 27, 1989).

Rosencher, E. et al., "Observation of nonlinear optical rectification at 10.6 $\mu$m in compositionally asymmetrical AlGaAs multiquantum wells," *Appl. Phys. Lett. 55(16)*, American Institute of Physics, pp. 1597-1599 (Oct. 16, 1989).

Fejer, M.M. et al., "Observation of Extremely Large Quadratic Susceptibility at 9.6-10.8 $\mu$m in Electric-Field-Biased AlGaAs Quantum Wells," *Physical Review Letters,* vol. 62, No. 9 The American Physical Society, pp. 1041-1044 (Feb. 27, 1989).

Walrod, D. et al., "Optical nonlinearities due to subband structures in $Al_{0.08}In_{0.92}Sb/InSb$ superlattices," *Appl. Phys. Lett. 56(3)*, American Institute of Physics, pp. 218-220 (Jan. 15, 1990).

Kinch, M.A. and Yariv, A., "Performance limitations of GaAs/AlGaAs infrared superlattices," *Appl. Phys. Lett. 55* (2), American Institute of Physics, pp. 2093-2095 (Nov. 13, 1989).

West, L.C. and Eglash, S.J., "First observation of an extremely large-dipole infrared transition within the conduction band of a GaAs quantum well," *Appl. Phys. Lett. 46(12)*, American Instititute of Physics, pp. 1156-1158 (Jun. 15, 1985).

Nakayama, M. et al., "Intersubband transitions in GaAs-$Al_xGa_{1-x}As$ modulation-doped superlattices," *Appl. Phys. Lett. 51(21)*, American Institute of Physics, pp. 1741-1743 (Nov. 23, 1987).

Allmen, P.v. et al., "Intersubband Absorption In GaAs/AlGaAs Quantum Wells Between 4.2K and Room Temperature," *Superlattics and Microstructures,* vol. 5, No. 2, Academic Press Limited, pp. 259-263 (1989).

Mii, Y.J. et al., "Growth and characterization of doped GaAs/AlGaAs multiple quantum well structures on Si substrates for infrared detection," *J. Vac. Sci. Tecnhol. B* 7(2), American Vacuum Society, pp. 341-344 (Mar./Apr. 1989).

Lobentanzer, H. et al., "Intersubband absorption in a modulation-doped $Ga_{0.47}In_{0.53}As/Al_{0.48}In_{0.52}As$ multiple quantum well structure," *Appl. Phys. Lett. 53(7)*, American Institute of Physics, pp. 571-573 (Aug. 15, 1988).

Elsnesser, T. et al., "Picosecond Infrared Spectroscopy of Hot Carriers in a Modulation-Doped $Ga_{0.47}In_{0.53}As$ Multiple-Quantum-Well Structure," pp. 388-389 (Jul. 19, 1988).

Oberli, D.Y. et al., "Intersubband Relaxation of Photoexcited Hot Carriers In Quantum Wells," *Solid-State Electronics*, vol. 31, No. 3 / 4, Pergamon Journals Ltd., pp. 413-418 (1988).

Asai, H. et al., "[LN-3] 3.2 $\mu$m Intersubband Absorption In Strained InGaAs/InAlAs Multiquantum Wells," p. 8.

Olszakier, M. et al., "Intersubband Spectroscopy In GaAs/GaAlAs Multi-Quantum-Well Structures: Photoinduced Absorption," *Superlattices and Microstructures*, vol. 5, No. 5, Academic Press Limited, pp. 283-286 (1989).

Ahn, D. and Chuang, S.L., "Electric-Field Dependence of the Intersubband Optical Absorption in a Semiconductor Quantum Well," *Superlattices and Microstructures*, vol. 4, No. 2, Academic Press Limited, pp. 153-157 (1988).

Ahn, D. ad Chuang, S.L., "Calculation of Linear and Nonlinear Intersubband Optical Absorptions in a Quantum Well Model with an Applied Electric Field," *IEEE Journal of Quantum Electronics*, vol. QE-23, No. 12, IEEE, pp. 2196-2204 (Dec. 1987).

Newson, D.J. and Kurobe, A., "Possiblity of optical bistability due to resonant intersubband excitation in stepped modulation-doped quantum wells," *Appl. Phys. Lett. 51(21)*, American Institute of Physics, pp. 1670-1672 (Nov. 23, 1987).

Bandara, K.M.S.V. et al., "Exchange interactions in quantum well subbands," *Appl. Phys. Lett. 53(20)*, American Institute of Physics, pp. 1931-1933 (Nov. 14, 1988).

Luryi, S., "Photon-Drag Effect in Intersubband Absorption by a Two-Dimenstional Electron Gas," *Physical Review Letters*, vol. 58, No. 21, The American Physical Society, pp. 2263-2266 (May 25, 1987).

Yuh, P.F. and Wang, K.L., "Novel infrared band-aligned superlattice laser," *Appl. Phys. Lett. 51(18)*, American Institute of Physics, pp. 1404-1406 (Nov. 2, 1987).

Newson, D.J. and Kurobe, A., "Simulation of Saturation and Relaxation of Intersubband Absorption in Doped Quantum Wells," *IQEC '88*, pp. 46-47.

Newson, D.J. and Kurobe, A., "Optical Nonlinearity Due to Resonant Intersubband Transitions in Doped Quantum Wells," *Nonlinear Optics of Organics and Semiconductors*, 8 pages.

Newson, D.J. and Kurobe, A., "The effect of conduction band non-parabolicity on inter-sub-band absorption in doped quantum wells," *Semicond. Sci. Technol. 3*, IOP Publishing Ltd., pp. 786-790 (1988).

Gomes, V.M.S. et al., "Intersubband Transition Energies in Quantum Wells in n-Type GaAs-Al$_x$GA$_{1-x}$As Heterostructures," *International Journal of Quantum Chemistry*, vol. XXXII, John Wiley & Sons, Inc., pp. 655-661 (1987).

Tsang, L. et al., "Electric field control of optical second-harmonic generation in a quantum well," *Appl. Phys. Lett. 52(9)*, American Institute of Physics, pp. 697-699 (Feb. 29, 1988).

Ahn, D. and Chuang, S.L., "Nonlinear intersubband optical absorption in a quantum well with an applied electric field," abstract from the Oct. 18-23, 1997 Annual Meeting of the Optical Society of America, 1 page.

Yoo, S.J.B. et al., "Second harmonic generation in dc-biased quantum wells," abstract from the Oct. 18-23, 1997 Annual Meeting of the Optical Society of America, 1 page.

Ahn, D. and Chuang, S.L., "Intersubband optical absorption in a quantum well with an applied electric field," *Physical Review B*, vol. 35, No. 8, The American Physical Society, pp. 4149-4151 (Mar. 15, 1987).

Anderson, N.G. et al., "Optical characterization of pseudomorphic In$_x$Ga$_{1-x}$As-GaAs single-quantum-well heterostructures," *J. Appl. Phys. 60(7)*, pp. 2361-2367 (Oct. 1, 1986).

Ji, G. et al., "Optical investigation of highly strained InGaAs-GaAs multiple quantum wells," *J. Appl. Phys. 62 (8)*, American Institute of Physics, pp. 3366-3373 (Oct. 15, 1987).

Arent, D.J. et al., "Strain effects and band offsets in GaAs/InGaAs strained layered quantum structures," *J. Appl. Phys. 66(4)*, American Institute of Physics, pp. 1739-1747 (Aug. 15, 1989).

Yu, P.W. et al., "Photocurrent spectrocopy of In$_x$Ga$_{1-x}$As/GaAs multiple quantum wells," *Appl. Phys. Lett. 54(22)*, American Institute of Physics, pp. 2230-2232 (May 29, 1989).

Watson, R.F. et al., "Shattering The Quartz Muffle Myth," pp. 194-202.

Bertolet, D.C. et al., "Pseudomorphic GaAs/InGaAs single quantum wells by atmospheric pressure organometallic chemical vapor deposition," *Appl. Phys. Lett. 52(4)*, American Institute of Physics, pp. 293-295 (Jan. 25, 1988).

Quillec, M. et al., "Growth conditions and characterization of InGaAs/GaAs strained layers superlattices," *J. Appl. Phys. 55(8)*, American Institute of Physics, pp. 2904-2909 (Apr. 15, 1984).

Niki, S. et al., "Band-edge discontinuities of strained-layer In$_x$Ga$_{1-x}$As/GaAs heterojunctions and quantum wells," *Appl. Phys. Lett. 55(13)*, American Institute of Physics, pp. 1339-1341 (Sep. 25, 1989).

Marzin, J.-Y. et al., "Optical investigation of a new type of valence-band configuration in In$_x$Ga$_{1-x}$As-GaAs strained superlattices," *Physical Review B*, vol. 31, No. 12, The American Physical Society, pp. 8298-8301 (Jun. 15, 1985).

Menéndez, J. et al., "Large valence-band offset in strained-layer In$_x$Ga$_{1-x}$As-GaAs quantum wells," *Phsycial Review B*, vol. 36, No. 15, pp. 8165-8168 (Nov. 15, 1987).

Liu, C.T. et al., "Cyclotron resonance measurements of electron effective mass in strained AlGaAs/InGaAs/GaAs pseudomorphic structures," *Appl. Phys. Lett. 53(25)*, American Institute of Physics, pp. 2510-2512 (Dec. 19, 1988).

Suemune, I. et al., "Extremely wide modulation bandwidth in a low threshold current strained quantum well laser," *Appl. Phys. Lett. 53(15)*, American Institute of Physics, pp. 1378-1380 (Oct. 10, 1988).

Priester, C. et al., "Theoretical calculation of band-edge discontinuities near a strained heterojunction: Application to (In,Ga)As/GaAs" *Physical Review B*, vol. 38, No. 14, The American Physical Society, pp. 9870-9873 (Nov. 15, 1988).

Andersson, T.G. et al., "Photoluminescence and photoconductivity measurements on band-edge offsets in strained molecular-beam-epitaxy-grown In$_x$Ga$_{1-x}$As/GaAs quantum wells," *Physical Review B*, vol. 37, No. 8, The American Physical Society, pp. 4032-4038 (Mar. 15, 1988).

Sato, M. and Horikoshi, Y., "Photoluminescence from InGaAs-GaAs strained-layer superlattices grown by flow-rate modulation epitaxy," *Appl. Phys. Lett. 52(2)*, American Institute of Physics, pp. 123-125 (Jan. 11, 1988).

Scott, E.G. et al., "Improvements to and characterization of GaInAs/AlInAs heterointerfaces grown by molecular-beam epitaxy," *J. Vac. Sci. Technol. B 6(2)*, American Vacuum Society, pp. 603-606 (Mar./Apr. 1988).

Peng, C.K. et al., "Extremely low nonalloyed and alloyed contact resistance using an InAs cap layer on InGaAs by molecular-beam epitaxy," *J. Appl. Phys. 64(1)*, American Institute of Physics, pp. 429-431 (Jul. 1, 1988).

Jeong, J. et al., "An investigation of $In_xGa_{1-x}As$/GaAs quantum wells grown by molecular-beam epitaxy," *J. Appl. Phys. 63(11)*, American Institute of Physics, pp. 5464-5468 (Jun. 1, 1988).

Yao, J.Y. et al., "Structure of lattice-strained $In_xGa_{1-x}As$/GaAs layers studied by transmission electron microscopy," *Appl. Phys. Lett. 53(15)*, American Institute of Physics, pp. 1420-1422 (Oct. 10, 1988).

Bedair, S.M. et al., "Defect reduction in GaAs grown by molecular beam epitaxy using different superlattice structures," *Appl. Phys. Lett. 49(15)*, American Institute of Physics, pp. 942-944 (Oct. 13, 1986).

Coronado, M. L. et al., "Indium Isoelectronic Doping Influence on Etch Pit Density in GaAs Layers Grown by Vapour Phase Epitaxy," *Japanese Journal of Applied Physics*, vol. 25, No. 11, pp. L899-L901 (Nov. 1986).

Wood, C.E.C. et al., "State-of-the-art AlGaAs alloys by antimony doping," *J. Appl. Phys. 60(4)*, American Institute of Physics, pp. 1300-1305 (Aug. 15, 1986).

Missous, M. et al., "Electrical Properties of Indium Doped GaAs Layers Grown by MBE," *Journal of Crystal Growth 81*, Elsevier Science Publishers B.V., pp. 314-318 (1987).

Das, U. et al., "Low-loss optical waveguides made with molecular beam epitaxial $In_{0.012}Ga_{0.988}As$ and $In_{0.2}Ga_{0.8}As$-GaAs superlattices," *Appl. Phys. Lett. 48(22)*, American Institute of Physics, pp. 1507-1509 (Jun. 2, 1986).

Beneking, H. et al., "High quality epitaxial GaAs and InP wafers by isoelectronic doping," *Appl. Phys. Lett. 47(8)*, American Institute of Physics, pp. 828-830 (Oct. 15, 1985).

Bhattacharya, P.K. et al., "Low defect densities in molecular beam epitaxial GaAs achieved by isoelectronic In doping," *Appl. Phys. Lett. 49(8)*, American Institute of Physics, pp. 470-472 (Aug. 25, 1986).

Beneking, H. and Emeis, N., "Minority Carrier Lifetime Improvement by Single Strained Layer Epitaxy of InP," *IEEE Electron Device Letters*, vol. EDL-7, No. 2, IEEE, pp. 98-100 (Feb. 1986).

Narozny, P. and Beneking, H., "High-Qality GaAs Schottky Diodes Fabricated By Strained Layer Epitaxy," *Electronics Letters*, vol. 21, No. 22, pp. 1050-1051 (Oct. 24, 1985).

Beneking, H. et al., "Enhanced Carrier Lifetime and Diffusion Length in GaAs by Strained-Layer MOCVD," *IEEE Electron Device Letters*, vol. EDL-7, No. 2, IEEE, pp. 101-103 (Feb. 1986).

Andersson, T.G. et al., "Variation of the critical layer thickness with In content in strained $In_xGa_{1-x}As$-GaAs quantum wells grown by molecular beam epitaxy," *Appl. Phys. Lett. 51(10)*, American Institute of Physics, pp. 752-754 (Sep. 7, 1987).

Fritz, I.J. et al., "Critical layer thickness in $In_{0.2}Ga_{0.6}As$/GaAs single strained quantum well structures," *Appl. Phys. Lett. 51(13)*, American Institute of Physics, pp. 1004-1006 (Sep. 28, 1987).

Gourley, P.L. et al., "Controversy of critical layer thickness for InGaAs/GaAs strained-layer epitaxy," *Appl. Phys. Lett. 52(5)*, American Institute of Physics, pp. 377-379 (Feb. 1, 1988).

Joyce, M.J. et al., "Concentration-dependent band offset in $In_xGa_{1-x}As$/GaAs strained quantum wells," *Physical Review B*, vol. 38, No. 15, The American Physical Society, pp. 10978-10980 (Nov. 15, 1988).

Laurich, B.K. et al., "Study of the Optical Properties of (100) and (111) Oriented GaInAs/GaAs Strained-Layer Superlattices," 12 pages (appears to be dated Aug. 9, 1988).

Raymond, A. et al., "The electron effective mass in heavily doped GaAs," *J. Phys. C: Solid State Phys.*, vol. 12, The Institute of Physics, pp. 2289-2293 (1979).

Bandara, K.M.S.V. et al., "Erratum: Exchange interactions in quantum well subbands [Appl. Phys. Lett. 53, 1931 (1988)]," *Appl. Phys. Lett 55(2)*, American Institute of Physics, p. 206 (Jul. 10, 1989).

Nelson, D.F. et al., "Band nonparabolicity effects in semiconductor quantum wells," *Physical Review B*, vol. 35, No. 14, pp. 7770-7773 (May 15, 1987).

Nelson, D.F. et al., "Exciton binding energies from an envelope-function analysis of data on narrow quantum wells of integral monolayer widths in $Al_{0.4}Ga_{0.6}As$/GaAs," *Physical Review B*, vol. 36, No. 1, pp. 8063-8070 (Nov. 15, 1987).

Yoo, K.H. et al., "Effect of nonparabolicity in $GaAs/Ga_{1-x}Al_xAs$ semiconductor quantum wells," *Physical Review B*, vol. 39, No. 17, The American Physical Society, pp. 12808-12813 (Jun. 15, 1989).

Bastard, G., "Theoretical investigations of superlattice band structure in the envelope-function approximation," *Physical Review B*, vol. 25, No. 12, The American Physical Society, pp. 7584-7597 (Jun. 15, 1982).

Oing, Y. and Chu-liang, Y., "The effect of complex band structure and non-parabolicity on sub-bands of $GaAs-Al_xGa_{1-x}As$ heterostructures: band offset," *J. Phys. C: Solid State Phys. 20*, IOP Publishing Ltd., pp. 5125-5134 (1987).

Bastard, G., "Superlattice band structure in the envelope-function approximation," *Physical Review B*, vol. 24, No. 10, The American Physical Society, pp. 5693-5697 (Nov. 15, 1981).

Dingle, R., "Confined Carrier Quantum States in Ultrathin Semiconductor Heterostructures," pp. 21-48.

Shakuda, Y. and Katahama, H., "Intersubband Absorption in $In_{0.15}Ga_{0.85}As/Al_{0.35}Ga_{0.65}As$ Multiple Quantum Wells", *Japanese Journal of Applied Physics*, vol. 29, No. 4, pp. L552-L555 (Apr. 1990).

Lin, M.E. et al., "Low resistance ohmic contacts on wide band-gap GaN," *Appl. Phys. Lett. 64(8)*, American Institute of Physics, pp. 1003-1005 (Feb. 21, 1994).

*Nichia Product Guide: NSPB Series (Blue)/NSPG Series (Green)/NSPW Series (White)*, Nichia Chemical Industries, Ltd., 6 pages.

Klaasen, J.J. et al., "High Temperature GaN and $Al_xGa_{1-x}N$ Photovoltaic Detectors fr UV Sensing Applications," 2 pages.

Khan, M.A. et al., "Metal semiconductor field effect transistor based on single crystal GaN," *Appl. Phys. Lett. 62(15)*, American Institute of Physics, pp. 1786-1787 (Apr. 12, 1993).

Nakamura, S., "InGaN/AlGaN blue-light-emitting diodes," *J. Vac. Sci. Technol. A 13(3)*, American Vacuum Society, pp. 705-710 (May/Jun. 1995).

Suzuki, M. and Uenoyama, T., "First-principles calculations of effective-mass parameters of AlN and GaN," *Physical Review B*, vol. 52, No. 11, The American Physical Society, pp. 8312-8139 (Sep. 15, 1995).

Uenoyama, T. and Suzuki, M., "Valence subband structures of wurtzite GaN/AlGaN quantum wells," *Appl. Phys. Lett. 67 (17)*, American Institute of Physics, pp. 2527-2529 (Oct. 23, 1995).

Hartman, R.L. et al., "Pulsations and absorbing defects in (Al, Ga)As injection lasers," *J. Appl. Phys. 50(7)*, American Institute of Physics, pp. 4616-4619 (Jul. 1979).

Tsang, W.T., "The influence of bulk nonradiative recombination in the wide band-gap regions of molecular beam epitaxially grown GaAs-Al$_x$Ga$_{1-x}$As DH lasers," *J. Appl. Phys. 33(3)*, American Institute of Physics, pp. 245-248 (Aug. 1, 1978).

Chinone, N. et al., "Mode-Hopping Noise in Index-Guided Semiconductor Lasers and Its Reduction by Saturable Absorbers," *IEEE Journal of Quantum Electronics*, vol. QE-21, No. 8, IEEE, pp. 1264-1270 (Aug. 1985).

Fukui, T. and Horikoshi, Y., "Organometallic VPE Growth of InAs$_{1-x}$Sb$_x$ on InAs," *Japanese Journal of Applied Physics*, vol. 19, No. 1, pp. L53-L56 (Jan. 1980).

Misawa, S. et al., "Influence of Ga Sources on Impurity Doping in Gas Source MBE GaAs," *Japanese Journal of Applied Physics*, vol. 26, No. 7, pp. 1088-1091 (Jul. 1987).

Tsang, W.T., "Very low current threshold GaAs/Al$_{0.5}$Ga$_{0.5}$As double-heterostructure lasers grown by chemical beam epitaxy," *Appl. Phys. Lett. 48(8)*, American Institute of Physics, pp. 511-513 (Feb. 24, 1986).

Tsang, W.T. et al., "Doping studies using thermal beams in chemical-beam epitaxy," *Appl. Phys. Lett. 60(12)*, American Institute of Physics, pp. 4182-4185 (Dec. 15, 1986).

Nakata, N., "Mass Production Of AlGaAs Laser Diode Enabled By Molecular Beam Epitaxy Method," *JEE*, pp. 38-40 (Aug. 1988).

Yamamoto, S. and Hijikata, T., "Continuous control of coherence length in separately pumped (AlGa)As lasers," *Appl. Phys. Lett. 49(18)*, American Institute of Physics, pp. 1129-1131 (Nov. 3, 1986).

Yonezu, H. et al., "A GaAs-Al$_x$Ga$_{1-x}$As Double Heterostructure Planar Stripe Laser," *Japanese Journal of Applied Physics*, vol. 12, No. 10, pp. 1585-1592 (Oct. 1973).

Mamine, T. et al., "Analysis of astigmatism of gain guided laser with a tapered-stripe geometry," *J. Appl. Phys. 56(11)*, American Institute of Physics, pp. 3116-3120 (Dec. 1, 1984).

Mamine, T., "Astigmatism and spontaneous emission factor of laser diodes with parabolic gain," *J. Appl. Phys. 54(4)*, American Institute of Physics, pp. 2103-2105 (Apr. 1983).

Mamine, T. et al., "New class of gain guided laser with a tapered-stripe structure," *J. Appl. Phys. 54(8)*, American Institute of Physics, pp. 4302-4304 (Aug. 1983).

Casey Jr., H.C. et al., "GaAs-Al$_x$Ga$_{1-x}$As heterostructure laser with separate optical and carrier confinement," *Journal of Applied Physics*, vol. 45, No. 1, American Institute of Physics, pp. 322-333 (Jan. 1974).

Goldstein, B. et al., "A high-power channeled-substrate-planar AlGaAs laser," *Appl. Phys. Lett. 47(7)*, American Institute of Physics, pp. 655-657 (Oct. 1, 1985).

Olsen, G.H. and Ettenberg, M., "Universal stain/etchant for interfaces in III-V compounds," *Journal of Applied Physics*, vol. 45, No. 11, American Institute of Physics, pp. 5112-5114 (Nov. 1974).

Logan, R.A. and Reinhart, F.K., "Optical waveguides in GaAs-AlGaAs epitaxial layers," *J. Appl. Phys.*, vol. 44, No. 9, American Institute of Physics, pp. 4172-4176 (Sep. 1973).

Fujiwara, K. and Ploog, K., "Photoluminescence of GaAs single quantum wells confined by short-period ali-binary GaAs/AlAs supterlattices," *Appl. Phys. Lett. 45(11)*, American Institute of Physics, pp. 1222-1224 (Dec. 1, 1984).

Calleja, E. et al., "Origin of the nonexponential thermal emission kinetics of DX centers in GaAlAs," *Appl. Phys. Lett. 49(11)*, American Institute of Physics, pp. 657-659 (Sep. 15, 1986).

Petrou, A., "Photoluminescence In GaAs/AlGaAs Quantum Wells Associated With Excited Confinement Subbands," *Solid State Communications*, vol. 58, No. 9, Pergamon Journals Ltd., pp. 581-585 (1986).

Bajaj, K.K. et al., "High-Resolution Photoluminenscence Studies Of GaAs/GaAlAs Multi-Quantum-Well Structures Grown By Molecular Beam Epitaxy," *Solid State Electronics*, vol. 29, No. 2, Pergamon Press Ltd., pp. 215-227 (1986).

Semelius, B.E., "Band-gap shift in heavily doped n-type GaAs," *Physical Review B*, vol. 33, No. 12, The American Physical Society, pp. 8582-8586 (Jun. 15, 1986).

Scolfaro, L.M.R. et al., "Impurity levels induced by a C impurity in GaAs," *Physical Review B*, vol. 34, No. 10, The American Physical Society, pp. 7135-7139 (Nov. 15, 1986).

Masselink, W.T. et al., "Shallow Impurity Levels In AlGaAs/GaAs Semiconductor Quantum Wells," *Solid State Electronics*, vol. 29, No. 2, Pergamon Press Ltd., pp. 205-214 (1986).

Wright, A.F. and Nelson, J.S., "Explicit treatment of the gallium 3d electrons in GaN using the plane-wave pseudopotential method," *Physical Review B*, vol. 50, No. 4, The American Physical Society, pp. 2159-2165 (Jul. 15, 1994).

Nagahara, M. et al., "Selective Growth of Cubic GaN in Small Areas on Patterned GaAs (100) Substrates by Metalorganic Vapor Phase Epitaxy," *Jpn. J. Appl. Phys.*, vol. 33, Part 1, No. 1B, pp. 694-697 (Jan. 1994).

Kistenmacher, S. et al., "Structural and electrical properties of reactively sputtered InN thin films on AlN-buffered (00.1) sapphire substrates: Dependence on buffer and film growth temperatures and thicknesses," *J. Appl. Phys. 74(3)*, American Institute of Physics, pp. 1684-1691 (Aug. 1, 1993).

Holmes, A.L. et al., "X-ray diffracation studies of high-quality GaN heteroepitaxial film grown by metal organic chemical vapour deposition," *Electronics Letters*, vol. 30, No. 15, pp. 1252-1254 (Jul. 21, 1994).

Shintani, A. and Minagawa, S., "Optical Properties of GaN Light Emitting Diodes," *J. Electrochem. Soc.*, vol. 123, No. 11, pp. 1725-1729 (Nov. 1976).

Pankove, J.I., "Low-Voltage Blue Electroluminescence in GaN," *IEEE Transactions on Electron Devices*, vol. ED-22, No. 9, IEEE, pp. 721-724 (Sep. 1975).

Sato, H. et al., "Transparent and conductive impurity-doped GaN thin films prepared by an electron cyclotron resonance plasma metalorganic chemical vapor deposition method," *J. Appl. Phys. 75(3)*, American Institute of Physics, pp. 1405-1409 (Feb. 1, 1994).

Lin, M.E. et al., Refractive indices of wurtzite and zincblende GaN *Electronids Letters*, vol. 29, No. 20, pp. 1759-1761 (Sep. 30, 1993).

Lee, W.-K. et al., "Low pressure and temperature deposition of transparent conductive indium tin oxide (ITO) films by the face target sputtering (FTS) process," *Thin Solid Films 224*, Elsevier Sequoia, pp. 105-111 (1993).

Kuwano, N. et al., Formation of Cubic GaN on (111)B GaAs by Metal-Organic Vapor-Phase Epitaxy with Dimethylhydrazine, *Jpn. J. Appl. Phys.*, vol. 33., Part 1, No. 6A, pp. 3415-3416 (Jun. 1994).

Sasaki, T. et al., "First-Principle Theories On Self-Compensation In II-VI Semiconductors," *Optoelectronics-Devices and Technologies,* vol. 7 No. 1., MITA Press, pp. 11-18 (Jun. 1992).

Dmitriev, V.A. et al., "Silicon carbide blue and violet light-emitting diodes," *Displays,* vol. 13, No. 2, Butterworth-Heinemann Ltd., pp. 97-106 (1992).

Nurmikk, A.V. et al., "Blue and Green Diode Lasers and LEDs in II-VI Quantum Structures," pp. 311-319.

Bhargava, R.N., "Blue And UV Light Emitting Diodes And Lasers," *Optoelectronics-Devices and Technologies,* vol. 7 No. 1., MITA Press, pp. 19-47 (Jun. 1992).

Torchinskaya, T.V., "Injection-Enhanced Transformation of Luminescence Spectra of Green GaP:N Light-Emitting Diodes," *Journal of Electronic Materials,* vol. 21, No. 4, TMS, pp. 423-429 (1992).

Metzger, R.A., "Turning Blue to Green," *Compound Semiconductor,* pp. 26-28 (Jul./Aug. 1995).

"The End of the Beginning," *Compound Semiconductor,* pp. 34-35 (Jul./Aug. 1995).

Evans, K.R. et al., "Gallium Incorporation Kinetics During Gas-Source Molecular Beam Epitaxy Growth of Gallium Nitride," 13 pages.

Lagerstedt, O. and Monemar, B., "Variation of lattice parameters in GaN with stoichiometry and doping," *Physical Review B,* vol. 19, No. 6, pp. 3064-3070 (Mar. 15, 1979).

Monemar, B. and Lagerstedt, O., "Properties of VPE-grown GaN doped with Al and some iron-group metals," *J. Appl. Phys. 50(10)*, American Institute of Physics, pp. 6480-6491 (Oct. 1979).

Shintani, A., "X-Ray Diffraction Topography and Crystal Characterization of GaN Epitaxial Layers for Light-Emitting Diodes," *J. Electrochem Soc.: Solid-State Science and Technology,* vol. 125, No. 12, pp. 2076-2078 (Dec. 1978).

Jacob, G. et al., "Effect Of Growth Parameters On The Properties Of GaN : Zn Epilayers," *Journal of Crystal Growth 42,* North-Holland Publishing Company, pp. 136-143 (1977).

Sano, M. and Aoki, M., "Epitaxial Growth of Undoped and Mg-Doped GaN," *Japanese Journal of Applied Physics,* vol. 15, No. 10, pp. 1943-1950 (Oct. 1976).

Madar, R. et al., "High Pressure Solution Growth Of GaN," *Journal of Crystal Growth 31,* North-Holland Publishing Company, pp. 197-203 (1975).

Pankove, J.I. et al., "Properties of Zn-doped GaN. I. Photoluminescence," *Journal of Applied Physics,* vol. 45, No. 3, American Institute of Physics, pp. 1280-1286 (Mar. 1974).

Pankove, J.I. and Berkeyheiser, J.E., "Properties of Zn-doped GaN. II. Photoconductivity," *Journal of Applied Physics,* vol. 45, No. 9, American Institute of Physics, pp. 3892-3895 (Sep. 1974).

Lagerstedt, O. and Monemar, B., "Luminescence in epitaxial GaN : Cd," *Journal of Apllied Physics,* vol. 45, No. 5, American Institute of Physics, pp. 2266-2272 (May 1974).

Dingle, R. et al., Absorption, Reflectance, and Luminescence of GaN Epitaxial Layers, *Physical Review B,* vol. 4, No. 4, pp. 1211-1218 (Aug. 15, 1971).

Illegems, M. et al., "Luminescence of Zn- and Cd-doped GaN," *J. Appl. Phys.,* vol. 43, No. 9., pp. 3797-3800 (Sep. 1972).

Shintani, A. and Minagawa, S., "Light Emitting Patterns of Gallium Nitride Electroluminescence," *J. Electrochem. Soc.: Solid-State Science and Technology,* vol. 123, No. 10, pp. 1575-1578 (Oct. 1976).

Matsunami, H., "Growth Of Silicon Carbide And Application To Blue Light-Emitting Diodes And Transistors," *Optoelectronics—Devices and Technologies,* vol. 2, No. 1, Mita Press, pp. 29-44 (Jun. 1987).

Koide, N. et al., "Doping of GaN with Si and properties of blue m/i/n/n$^+$ GaN LED with Si-doped n$^+$-layer by MOVPE," *Journal of Crystal Growth 115,* Elsevier Science Publishers B.V., pp. 639-642 (1991).

Yoshida, S. et al., "Growth Of Cubic And Hexagonal GaN On GaAs By Gas Source MBE And Their Properties," pp. 40-44.

Fertitta, K.G. et al., "High-quality GaN heteroepitaxial films grown by metalorganic chemical vapor deposition," *Appl. Phys. Lett. 65 (14),* American Institute of Physics, pp. 1823-1825 (Oct. 3, 1994).

Giordana, A. et al., "Modulated Reflectance and Absorption Characterization of Single Crystal GaN Films," *Journal of Electronic Materials,* vol. 23, No. 6, pp. 509-512 (1994).

Mattox, D.M., "An Introduction To Physical Vapor Deposition (PVD) Processes," *AESF SUR/FIN,* pp. 177-184 (1992).

Stevens, K.S. et al., "Growth of group III nitrides on Si(111) by plasma-assisted molecular beam epitaxy," *J. Vac. Sci. Technol. B 12(2),* American Vacuum Society, pp. 1186-1189 (Mar./Apr. 1994).

Chin, V.W.L. et al., "Electron mobilites in gallium, indium, and aluminium nitrides," *J. Appl. Phys. 75(11),* American Institute of Physics. Pp. 7365-7372 (Jun. 1, 1994).

Berger, H.H., "Models For Contacts To Planar Devices," *Solid State Electronics,* vol. 15, No. 2-A, Pergamon Press, pp. 145-158 (1972).

Cava, R.J. et al., "GaInO$_3$: A new transparent conducting oxide," *Appl. Phys. Lett. 64 (16),* American Institute of Physics, pp. 2071-2072 (Apr. 18, 1994).

Ueno, Y. et al., "Low-Noise High-Power 680-nm AIGaInP Laser with Sub-GHz Frequency Response," pp. 95-96.

Streifer, W. et al., "Longitudinal mode spectra of diode lasers," *Appl. Phys. Lett. 40 (4),* American Institute of Physics, pp. 305-307 (Feb. 15, 1982).

Stolyarov, S.N., "Influence of interference coatings on the optical strength of semiconductor laser mirrors," *Sov. J. Quantum Electron. 18 (8),* American Institute of Physics, pp. 1021-1025 (Aug. 1988).

"Laser Structures And Their Performance," *Semiconductor Lasers,* pp. 180-230.

Kressel, H. et al., "Mode Guiding In Symmetrical (AIGa) As-GaAs Heterojunction Lasers With Very Narrow Active Regions," Reprinted from RCA Review, vol. 32, pp. 393-401 (Sep. 1971).

Taylor, G.W. et al., "Demonstration of the heterostructure field-effect transistor as an optical modulator," *Appl. Phys. Lett., 59 (9),* American Institute of Physics, pp. 1031-1033 (Aug. 26, 1991).

Ou, S.S. et al., "High power cw operation of GaAs/GaAIAs surface-emitting lasers mounted in the junction-up configuration," *Appl. Phys. Lett. 59 (9),* American Institute of Physics, pp. 1037-1039 (Aug. 26, 1991).

Kawai, H. et al., "High Al-Content Visible (AIGa)As Multiple Quantum Well Heterostructure Lasers Grown by Metalorganic Chemical Vapor Deposition," *Japanese Journal of Applied Physics,* vol. 22, No. 11, pp. L727-L729 (Nov. 1983).

Ungar, J. et al., "GaAIAs Window Lasers Emitting 500 mW CW In Fundamental Mode," *Electronics Letters,* vol. 26, No. 18, pp. 1441-1442 (Aug. 30, 1990).

Welch, D. et al., "High Reliability, High Power, Single Mode Laser Diodes," *Electronics Letters,* vol. 26, No. 18, pp. 1481-1483 (Aug. 30, 1990).

Hayashi, I. et al., "Junction Lasers Which Operate Continuously At Room Temperature," Reprinted from Appl. Phys. Lett., vol. 17, pp. 109-111 (Aug. 1970).

Watanabe, M. et al., "Highly Reliable Operation of InGaP/InGaAIP Multi-Quantum-Well Visible Laser Diodes," *Jpn. J. Appl. Phys.,* vol. 31, Part 2, No. 10A, pp. L1399-L1400 (Oct. 1992).

Honda, S. et al., "Transverse-Mode Stabilised 630 nm-Band AIGaInP Strained Multiquandum-Well Laser Diodes Grown On Misoriented Substrates," *Electronics Letters,* vol. 28, No. 14, pp. 1365-1367 (Jul. 2, 1992).

Kobayashi, K. et al., "632.7 nm CW Operation (20° C.) of AIGaInP Visible Laser Diodes Fabricated on (001) 6° off toward [110] GaAs Substrate," *Japanese Journal of Applied Physics,* vol. 29, No. 9, pp. L1669-1671 (Sep. 1990).

Kawamura, Y. et al., "InGaAs/InGaAIAs MQW Lasers with InGaAsP Guiding Layers Grown by Gas Source Molecular Beam Epitaxy," *IEEE Transactions Photonics Technology Letters,* vol. 3, No. 11, IEEE, pp. 960-962 (Nov. 1991).

Kamiyama, S. et al., "Improvement of catastrophic optical damage level of AIGaInP visible laser didoes by sulfur treatment," *Appl. Phys. Lett. 58(23),* American Institute of Physics, pp. 2595-2597 (Jun. 10, 1991).

Morkoç, H. et al., "Large-band-gap SiC, III-V nitride, and II-VI ZnSe-based semiconductor," *J. Appl. Phys. 76(3),* American Institute of Physics, pp. 1363-1398 (Aug. 1, 1994).

Ueno, Y. et al., "Novel Window-Structure AIGaInP Visible-Light Laser Diodes with Non-Absorbing Facets Fabricated by Utilizing GaInP Natural Superlattice Disordering," *Japanese Journal of Applied Physics,* vol. 29, No. 9, pp. L1666-L1668 (Sep. 1990).

Ueno, Y. et al., "30 mW 690 nm High-Power Strained Quantum Well AIGaInP Laser," *NEC Res. & Develop.,* vol. 33, No. 3, pp. 393-400 (Jul. 1992).

Wilson, A.D., "Reactively Sputtered Silicon Oxy-Nitride Films for Solar Absorber Anti-Reflection Coatings," *Solar Energy Materials 10,* Elsevier Science Publishers, B.V., pp. 9-24 (1984).

Demichelis, F. et al., "Correlation between physical properties and hydrogen concentration in magnetron-sputtered amorphous silicon," *Physical Review B,* vol. 33, No. 10, The American Physical Society, pp. 7022-7028 (May 15, 1986).

Brandt, M.S. et al., "Hydrogenation of p-type gallium nitride," *Appl. Phys. Lett. 64(17),* American Institute of Physics, pp. 2264-2266 (Apr. 25, 1994).

Wickenden, D.K. et al., "Growth Of Epitaxial Layers Of Gallium Nitride On Siliicon Carbide And Corundum Substrates," *Journal of Crystal Growth 9,* North-Holland Publishing Co., pp. 158-164 (1971).

Norton, M.G. et al., "Brazing of aluminium nitride substrates," *J. Mater. Res.,* vol. 5, No. 10, pp. 2172-2176 (Oct. 1990).

Weber, J. and Singh, M., "Photoluminescence Detection Of Shallow Impurity Neutralization In III-V Compound Semiconductors," *Mat. Res. Soc. Symp. Proc.,* vol. 104, Materials Research Society, pp. 325-329 (1988).

Zanzucchi, P.J. et al., "Optical Reflectance Method for Determining the Surface Quality of Sapphire ($AI_2O_3$)," *J. Electrochem. Soc.: Solid-State Sicence and Technology,* vol. 125, No. 2, pp. 299-305 (Feb. 1978).

Vettiger, P. et al., "Full-Wafer Technology-A New Approach to Large-Scale Laser Fabrication and Integration," *Journal of Quantum Electronics,* vol. 27, No. 6, IEEE, pp. 1319-1331 (Jun. 1991).

Matsuoka, T., "InGaAIN Growth," pp. 241-242.

Lester, S.D. et al., "High-dislocation densities in high efficiency GaN-based light-emitting diodes," *Appl. Phys. Lett. 66(10),* American Institute of Physics, pp. 1249-1251 (Mar. 6, 1995).

Ponce, F.A., "Crystalline structure of AIGaN epitaxy on sapphire using AIN buffer layers," *Appl. Phys. Lett. 65(18),* American Institute of Physics, pp. 2302-2304 (Oct. 31, 1994).

Khan, M.A. et al., "GaN/AIN digital alloy short-period superlattices by switched atomic layer metalorganic chemical vapor deposition," *Appl. Phys. Lett. 63(25),* American Institute of Physics, pp. 3470-3472 (Dec. 20, 1993).

Lin, M.E. et al., "p-type zinc-blende GaN on GaAs substrates," *Appl. Phys. Lett. 63(7),* American Institute of Physics, pp. 932-933 (Aug. 16, 1993).

Pearton, S.J. et al., "Low bias electron cyclotron resonance plasma etching of GaN, AIN and InN," *Appl. Phys. Lett. 64(17),* American Institute of Physics, pp. 2294-2296 (Apr. 25, 1994).

Zavada, J.M. et al., "Hydrogenation of GaN, AIN and InN," *Appl. Phys. Lett. 64(20),* American Institute of Physics, pp. 2724-2726 (May 16, 1994).

Cho, S.H. et al., "Photoluminescence of Undoped GaN Grown on c-Plane $AI_2O_3$ by Electron Cyclotron Resonance Molecular Beam Epitaxy," *Jpn. J. Appl. Phys.,* vol. 34, Part 2, No. 12A, pp. L1575-L1578 (Dec. 1, 1995).

Cho, S.H. et al., "Epitaxial Growth of GaN on Sapphire (0001) Substrates by Electron Cyclotron Resonance Molecular Beam Epitaxy," *Jpn. J. Appl. Phys.,* vol. 34, Part 2, No. 2B, pp. L236-L239 (Feb. 15, 1995).

Tsuchiya, H. et al., "Homoepitaxial Growth of Cubic GaN by Hydride Vapor Phase Epitaxy on Cubic GaN/GaAs Substrates Prepared with Gas Source Molecular Beam Epitaxy," *Jpn. J. Appl. Phys.,* vol. 33, Part 1, No. 4A, pp. 1747-1752 (Apr. 1994).

Miraglienza, J., "Optical Second-Harmonic Investigations of GaN Thin Films on Sapphire," 1 page.

Harris, G.L. et al., "Beta Silicon Carbide Schottky Diode FET Inverters Grown on Silicon," 1 page.

Wickenden, A.E. et al., "The Effect of Thermal Annealing on GaN Nucleation Layers Deposited on (0001) Sapphire by Metalorganic Chemical Vapor Deposition," *J. Appl. Phys.* (*accepted for publication*), 25 pages.

Hwang, C.-Y., "Characteristics Of Gallium Nitride Grown On (0001) Sapphire By Plasma-Enhanced Atomic Layer Epitaxy," 5 pages (appears to have been published in 1993).

Wongchotigul, K. et al., "Growth of Solid Solutions of Aluminum Nitride and Silicon Carbide in a Low Pressure Vertical Reactor MOCVD," 1 page.

Hong, C.H. et al., "GaN and AIN OMVPE Growth Using Phenylhydrazine," 2 pages.

Nihei, M. et al., "Effect of Adding $CO_2$ to $CH_4/H_2$ Mixture for InGaAs/GaAs Selective Reactive Ion Etching," *Jpn. J. Appl. Phys.,* vol. 34, Part 1, No. 12B, pp. 6819-6823 (Dec. 1995).

Pearton, S.J. et al., "Reversible changes in doping of InGaAIN alloys induced by ion implantation or hydrogenation," *Appl. Phys. Lett. 63(8),* American Institute of Physics, pp. 1143-1145 (Aug. 23, 1993).

Igarashi, O. "Heteroepitaxial Growth of GaN$_{1-x}$P$_x$ (x≦0.09) on Sapphire Substrates," *Jpn. J. Appl. Phys.*, vol. 31, Part 1, No. 12A, pp. 3791-3793 (Dec. 1992).

Khan, M.A. et al., "Low pressure metalorganic chemical vapor deposition of AlN over sapphire substrates," *Appl. Phys. Lett. 61(21)*, American Institute of Physics, pp. 2539-2541 (Nov. 23, 1992).

Wakahara, A. et al., "Epitaxial Growth Of Indium Nitride," *Journal of Crystal Growth 99*, Elsevier Science Publishers B.V., pp. 385-389 (1990).

Sakai, S. et al., "Band Gap Energy and Band Lineup of III-V Alloy Semiconductors Incorporating Nitrogen and Boron," *Jpn. J. Appl. Phys.*, vol. 32, Part 1, No. 10, pp. 4413-4417 (Oct. 1993).

Miyoshi, S. et al., "MOVPE growth of cubic GaN on GaAs using dimethyhydrazine," *Journal of Crystal Growth 124*, Elsevier Science Publishers B.V., pp. 439-442 (1992).

Yung, K. et al., "Observation of stimulated emission in the near ultraviolet from a molecular beam epitaxy grown GaN film on sapphire in a vertical-cavity, singel pass configuration," *Appl. Phys. Lett. 64(9)*, American Institute of Physics, pp. 1135-1137 (Feb. 28, 1994).

Sun, C.-J. and Razeghi, M., "Comparison of the physical properties of GaN thin films deposited on (0001) and (0112) sapphire substrates," *Appl. Phys. Lett. 63(7)*, American Institute of Physics, pp. 973-975 (Aug. 16, 1993).

Miyauchi, M. et al., "Growth of Aluminum Nitride Films on Silicon by Electron-Cyclotron-Resonance-Assisted Molecular Beam Epitaxy," *Jpn. J. Appl. Phys.*, vol. 31, Part 2, No. 12A, pp. L1714-L1717 (Dec. 1, 1992).

Singh, R. et al., "Intensity dependence of photoluminescence in GaN thin films," *Appl. Phys. Lett. 64(3)*, American Institute of Physics, pp. 336-338 (Jan. 17, 1994).

Miura, Y. et al., "New Epitaxial Growth Method of Cubic GaN on (100) GaAs Using (CH$_3$)$_3$Ga, HCl and NH$_3$," *Jpn. J. Appl. Phys.*, vol. 34, Part 2, No. 4A, pp. L401-L404 (Apr. 1, 1995).

Beresford, R. et al., "Influence of substrate electrical bias on the growth of GaN in plasma-assisted epitaxy," *J. Vac. Scie. Technol. B 13(2)*, American Vacuum Society, pp. 792-795 (Mar./Apr. 1995).

Lin, W.-T. et al., "Epitaxial growth of cubic AlN films on (100) and (111) silicon by pulsed laser ablation," *Appl. Phys. Lett. 66(16)*, American Institute of Physics, pp. 2066-2068 (Apr. 17, 1995).

Zhang, W. et al., "Preparation of epitaxial AlN films by electron cyclotron resonance plasma-assisted chemical vapor deposition on Ir- and Pt-coated sapphire substrates," *Appl. Phys. Lett. 64(11)*, American Institute of Physics, pp. 1359-1361 (Mar. 14, 1994).

Kim, K. et al., "Growth and characterization of GaN on sapphire (0001) using plasma-assisted ionized source beam epitaxy," *J. Vac. Sci. Technol. B 13(2)*, American Vacuum Society, pp. 796-799 (Mar./Apr. 1995).

Qiu, C.H. et al., "Study of defect states in GaN films by photoconductivity measurement," *Appl. Phys. Lett. 66(20)*, American Institute of Physics, pp. 2712-2714 (May 15, 1995).

Meney, A.T. et al., "Theory of optical gain in ideal GaN heterostructure lasers," *Appl. Phys. Lett. 67(20)*, American Institute of Physics, pp. 3013-3015 (Nov. 13, 1995).

Qian, W. et al., "Open-core screw dislocations in GaN epilayers observed by scanning force microscopy and high-resolution transmission electron microscopy," *Appl. Phys. Lett. 67(16)*, American Institute of Physics, pp. 2284-2286 (Oct. 16, 1995).

Lee, S.S. et al., "Single-phase Deposition of α-Gallium Nitride by a Laser-induced Transport Process," *J. Mater. Chem.*, vol. 3, pp. 347-351 (1993).

Ho, K.-L. et al., "MOVPE of AlN and GaN by using novel precursors," *Journal of Crystal Growth 107*, Elsevier Science Publishers B.V., pp. 376-380 (1991).

Rowland, L.B. et al., "Aluminum nitride/silicon carbide multilayer heterostructure produced by plasma-assisted, gas-source molecular beam epitaxy," *Appl. Phys. Lett. 62(25)*, American Institute of Physics, pp. 3333-3335 (Jun. 21, 1993).

He, Z.Q. et al., "Molecular-beam-epitaxy growth of GaN on GaAs (100) by using reactive nitrogen source," *Appl. Phys. Lett. 64(3)*, American Institute of Physics, pp. 315-317 (Jan. 17, 1994).

Eaglesham, D.J. and Cerullo, M., "Dislocation-Free Stranski-Krastanow Growth of Ge on Si (100)," *Physical Review Letters*, vol. 64, No. 16, The American Physical Society, pp. 1943-1946 (Apr. 16, 1990).

*Integrated Optoelectronics*, pp. 356-365.

Kumakura et al., "Low p-type contact resistance using Mg-doped InGaN and InGaN/GaN superlattices," 2 pages.

Jang, J.-S., "Formation of low-resistance, thermally stable, and transparent Pt-based ohmic contacts to surface-treated p-GaN," 2 pages.

Smith, M. et al., "Acceptor-bound exciton recombination dynamics in p-type GaN," *Appl. Phys. Lett. 67(22)*, American Institute of Physics, pp. 3295-3297 (Nov. 27, 1995).

Fischer, S. et al., "On p-type doping in GaN-acceptor binding energies," *Appl. Phys. Lett. 67(9)*, American Institute of Physics, pp. 1298-1300 (Aug. 28, 1995).

Rubin, M. et al., "p-type gallium nitride by reactive ion-beam molecular beam epitaxy with ion implantation, diffusion, or coevaporation of Mg," *Appl. Phys. Lett. 64(1)*, American Institute of Physics, pp. 64-66 (Jan. 3, 1994).

Ohba, Y. and Hatano, A., "Study of H atom behaviour in Mg doped GaN grown by MOCVD," pp. 221-224.

Ohuchi, Y. et al., "New Dopant Precursors for n-type and p-type GaN," 2 pages.

Toda, A. et al., "Blue-green Laser Diode grown by photoassisted MOCVD," 2 pages.

Ohkubo, M. et al., "Magnesium-doped InGaAs Using (C$_2$H$_5$C$_5$H$_4$)$_2$Mg: Application to InP-based HBTs," 2 pages.

Hierro, A. et al., "Detection and identification of deep levels in n-GaN," 2 pages.

Foresi, J.S. and Moustakas, T.D., "Metal contacts to gallium nitride," *Appl. Phys. Lett. 62(22)*, American Institute of Physics, pp. 2859-2861 (May 13, 1993).

Hiramatsu, K. et al., "Relaxation Mechanism of Thermal Stresses in the Heterostructure of GaN Grown on Sapphire by Vapor Phase Epitaxy," *Jpn. J. Appl. Phys.*, vol. 32, Part 1, No. 4, pp. 1528-1533 (1993).

Detchprohm, T. et al., "Relaxation Process of the Thermal Strain in the GaN / α-Al$_2$O$_3$ Heterostructure and Determination of the Intrinsic Lattice Constants of GaN Free from the Strain," *Jpn. J. Appl. Phys.*, vol. 31, Part 2, No. 10B, pp. L1454-L1456 (Oct. 15, 1992).

Akasaki, I. and Amano, H., "Perspective Of The UV / Blue Light Emitting Devices Based On GaN And Related Compounds," *Optoelectronics—Devices and Technologies*, vol. 7, No. 1, Mita Press, pp. 49-56 (Jun. 1992).

Hiramatsu, K. et al., "Growth mechanism of GaN grown on sapphire with AlN buffer layer by MOVPE," *Journal of Crystal Growth 115,* Elsevier Science Publishers B.V., pp. 628-633 (1991).

Hiramatsu, K. et al., "MOVPE growth of GaN on a misoriented sapphire substrate," *Journal of Crystal Growth 107,* Elsevier Science Publishers B.V., pp. 509-512 (1991).

Amano, H. "P-Type Conduction in Mg-Doped GaN Treated with Low-Energy Electron Beam Irradiation (LEEBI)," *Japanese Journal of Applied Physics,* vol. 28, No. 11, pp. L2112-L2114 (Dec. 1989).

Akasaki, I. et al., "Effects of AlN Buffer Layer On Crystallographic Structure And On Electrical And Optical Properties Of GaN and $Ga_{1-x}Al_xN$ ($0<x\leq0.4$) Films Grown On Sapphire Substrate By MOVPE," *Journal of Crystal Growth 98,* Elsevier Science Publishers B.V., pp. 209-219 (1989).

Akasaki, I. and Amano, H., "Crystal growth of column III nitrides and their applications to short wavelength light emitters," *Journal of Crystal Growth 146,* Elsevier Science Publsihers B.V., pp. 455-460 (1995).

Detchprohm, T. et al., "Metalorganic vapor phase epitaxy growth and characteristics of Mg-doped GaN using GaN substrates," *Journal of Crystal Growth 145,* Elsevier Science Publishers B.V., pp. 192-196 (1994).

Tanaka, T. et al., "p-type conduction in Mg-doped GaN and $Al_{0.08}Ga_{0.92}N$ grown by metalorganic vapor phase epitaxy," *Appl. Phys. Lett. 65* (*5*), American Institute of Physics, pp. 593-594 (Aug. 1, 1994).

Kim, S.T. et al., "Optical gain of optically pumped $Al_{0.1}Ga_{0.9}N$/GaN double heterostructure at room temperature," *Appl. Phys. Lett. 64* (*12*), American Institute of Physics, pp. 1535-1536 (Mar. 21, 1994).

Amano, H. et al., "Room-Temperature Low-Threshold Surface-Stimulated Emission by Optical Pumping from $Al_{0.1}Ga_{0.9}N$/GaN Double Heterostructure," *Jpn. J. Appl. Phys.,* vol. 32, Part 2, No. 7B, pp. L1000-L1002 (Jul. 15, 1993).

Maier, K. et al. "Radiative Energy Transfer in GaN:Mg/$Al^2O_3$:$Cr^{3+}$ Epitaxial Systems," *Jpn. J. Appl. Phys.,* vol. 32, Part 2, No. 6B, pp. L846-L848 (Jun. 15, 1993).

Delchprohm, T. et al., "Hydride vapor phase epitaxial growth of a high quality GaN film usig a ZnO buffer layer," *Appl. Phys. Lett. 61*(*22*), American Institute of Physics, pp. 2688-2690 (Nov. 30, 1992).

Akasaki, I. et al., "MOVPE Growth Of GaN and $Al_xGa_{1-x}N$ And Their Luminescence And Electrical Properties," *Memoirs of the Faculty of Engineering, Nagoya University,* vol. 43, No. 2, pp. 147-178 (1991).

Kuwano, N. et al., "Cross-sectional TEM study of microstructures in MOVPE GaN films grown on $\alpha$-$Al_2O_3$ with a buffer layer of AlN," *Journal of Crystal Growth 115,* Elsevier Science Publishers B.V., pp. 381-387 (1991).

Hiramatsu, K. et al., "Cathodoluminescence Of MOVPE-Grown GaN Layer On $\alpha$-$Al_2O_3$," *Journal of Crystal Growth 99,* Elsevier Science Publishers B.V., pp. 375-380 (1990).

Koide, Y. et al., "Effect of AlN Buffer Layer on AlGaN/$\alpha$-$Al_2O_3$ Hereotepitaxial Growth by Metalorganic Vapor Phase Epitaxy," *Japanese Journal of Applied Physics,* vol. 27, No. 7, pp. 1156-1161 (Jul. 1988).

Nakamura, S. et al., "High-Brightness InGaN Blue, Green and Yellow LEDs with Quantum Well Structures," *Jpn. J. Appl. Phys.,* vol. 34, Part 2, No. 7A, pp. L797-L799 (Jul. 1, 1995).

Nakamura, S. et al., "High-brightness InGaN/AlGaN double-heterostructure blue-green-light-emitting diodes," *J. Appl. Phys. 76*(*12*), American Institute of Physics, pp. 8189-8191 (Dec. 15, 1994).

Nakamura, S. et al., "High-Power GaN P-N Junction Blue-Light-Emitting Diodes," *Japanese Journal of Applied Physics,* vol. 30, No. 12A, pp. L1998-L2001 (Dec. 1991).

Nakamura, S. et al., "High-power InGaN/GaN double-heterostructure violet light emitting diodes," *Appl. Phys. Lett. 62*(*19*), American Institute of Physics, pp. 2390-2392 (May 10, 1993).

Nakamura, S. et al., "Si-Doped InGaN Films Grown on GaN Films," *Jpn. J. Appl. Phys.,* vol. 32, Part 2, No. 1A/B, pp. L16-L19 (Jan. 15, 1993).

Nakamura, S. and Mukai, T., "High-Quality InGaN Films Grown on GaN Films," *Jpn. J. Appl. Phys.,* vol. 31, Part 2, No. 10B, pp. L1457-L1459 (Oct. 15, 1992).

Nakamura, S. et al., "Si- and Ge-doped GaN Films Grown with GaN Buffer Layers," *Jpn. J. Appl. Phys.,* vol. 31, Part 1, No. 9A, pp. 2883-2888 (Sep. 1992).

Nakamura, S. et al., "Hole Compensation Mechanism of P-Type GaN Films," *Jpn. J. Appl. Phys.,* vol. 31, Part 1, No. 5A, pp. 1258-1266 (May 1992).

Nakamura, S., "GaN Growth Using GaN Buffer Layer," *Japanese Journal of Applied Physics,* vol. 30, No. 10A, pp. L1705-L1707 (Oct. 1991).

Nakamura, S. et al., "Highly P-Typed Mg-Doped GaN Films Grown with GaN Buffer Layers," *Japanese Journal of Applied Physics,* vol. 30, No. 10A, pp. L1708-L1711 (Oct. 1991).

Nakamura, S., "In Situ Monitoring of GaN Growth Using Interference Effects," *Japanese Journal of Applied Physics,* vol. 30, No. 8, pp. L1620-L1627 (Aug. 1991).

Nakamura, S. et al., "Novel metalorganic chemical vapor deposition system for GaN growth," *Appl. Phys. Lett. 58* (*18*), American Institute of Physics, pp. 2021-2023 (May 6, 1991).

Okamura, H. et al., "Optical properties near the band gap on hexagonal and cubic GaN," *Appl. Phys. Lett. 64*(*22*), American Institute of Physics, pp. 2997-2999 (May 30, 1994).

Grzegory, I. et al., "III-V Nitrides-Thermodynamics And Crystal Growth At High $N_2$ Pressure," *J. Phys. Chem. Solids,* vol. 56, No. 3/4, Pergamon Press, pp. 639-647 (1995).

Zur, A. and McGill, T.C., "Lattice match: An application to heteroepitaxy," *J. Appl. Phys. 55* (*2*), American Institute of Physics, pp. 378-386 (Jan. 15, 1984).

Antonov, P.I. et al., "Anisotropy Of Thermoelastic Stresses In Shaped Sapphire Single Crystals," *Journal of Crystal Growth 52,* North-Holland Publishing Company, pp. 404-410 (1981).

Eliseev, P.G. et al., "Impurity-Related Photoluminescence From InGaN LED Material," pp. 104-105.

Kishino, S. et al., "Half-width and peak-intensity measurement of a rocking curve obtained from silicon on sapphire using soft x-ray beams," *Journal of Applied Physics,* vol. 48, No. 7, American Institute of Physics, pp. 3138-3140 (Jul. 1977).

Palummo, M. et al., "Electronic Structure of Cubic GaN with Self-Energy Corrections," *Europhysics Letters,* 26 (8), pp. 607-612 (1994).

Bulman, G.E. et al., "Demonstration of a Cleaved-Facet InGaN/GaN MQW SCH Laser Grown on 6H-SiC," 2 pages.

Trilhe, J. et al., "Characterization Of The Silicon-Sapphire Interface," *Journal of Crystal Growth 45,* North-Holland Publishing Company, pp. 439-444 (1978).

Sun, C.J. et al., "Thermal stability of GaN thin films grown on (0001) $AI_2O_3$, (0112) $AI_2O_3$ and $(0001)_{51}$ 6H-SiC substrates," *J. Appl. Phys. 76 (1)*, American Institute of Physics, pp. 236-241 (Jul. 1, 1994).

Hsu, S.T., "Electron Mobility in SOS Films," *IEEE Transactions on Electron Devices*, vol. ED-25, No. 8, IEEE, pp. 913-916 (Aug. 1978).

Rubio, A. et al., "Quasiparticle band structures of short-period superlattices and ordered alloys of AlN and GaN," *Physical Review B*, vol. 49, No. 3, The American Physical Society, pp. 1952-1956 (Jan. 15, 1994).

Shul, R.J. et al., "Plasma-Induced-Damage of GaN," *Electrochemical Society Proceedings*, vol. 96-15, pp. 232-243.

Shul, R.J. et al., "High-Density Plasma-Induced Etch Damage of GaN," 10 pages.

Shul, R.J. et al., "Comparison of Dry-Etch Techniques For GaN, InN, and AlN," 7 pages.

*ION Source Refefence Gruide*, Commonwealth Science Corporation, 17 pages.

Shul, R.J. et al., "Inductively Coupled Plasma Etching of GaN," 13 pages.

Adesida, I. et al., "Characteristics of chemically assisted ion beam etching of gallium nitride," *Appl. Phys. Lett. 65(7)*, American Institute of Physics, pp. 889-891 (Aug. 15, 1994).

Pearton, S.J. et al., "$Ar^+$-ion milling characteristics of III-V nitrides," *J. Appl. Phys. 76(2)*, American Institute of Physics, pp. 1210-1215 (Jul. 15, 1994).

Pearton, S.J. et al., "Letter to the editor: Dry etching of thin-film InN, AlN and GaN," *Semicond. Sci. Technol. 8*, pp. 310-312 (1993).

Shul, R.J. et al., "Comparison of Dry Etch Techniques for GaN," 9 pages.

Tojyo, T. et al., "GaN-based High Power Blue-violet Laser Diodes," 5 pages.

Koike, M. et al., "RT-CW operation of GaN-based Laser Diodes improved by GaN/HaInN optical guiding lasers," 2 pages.

Lagerstedt, O. et al., "Properties of GaN tunneling MIS light-emitting diodes," *J. Appl. Phys. 49(5)*, American Institute of Physics, pp. 2953-2957 (May 1978).

Self, K., "Prolog to Emerging Gallium Nitride Based Devices," *Proceedings Of The IEEE*, vol. 83, No. 10, p. 1305 (Oct. 1995).

Mohammad, S.N. et al., "Emerging Gallium Nitride Based Devices," *Proceedings of the IEEE*, vol. 83, No. 10, pp. 1306-1355 (Oct. 1995).

Goldenberg, B. et al., "Ultraviolet and violet light-emitting GaN diodes grown by low-pressure metalorganic chemical vapor deposition," *Appl. Phys. Lett. 62(4)*, American Institute of Physics, pp. 381-383 (Jan. 25, 1993).

Shan, W. et al., "Pressure-dependent photoluminescence study of wurtzite GaN," *Appl. Phys. Lett. 66(25)*, American Institute of Physics, pp. 3492-3494 (Jun. 19, 1995).

Wang, Y. and Mikkola, D.E., "Shock deformation of sapphire single crystals," *Materials Science and Engineering*, Elsevier Sequoia, pp. 25-32 (1991).

Akasaki, I. and Amano, H., "High efficiency UV and blue emitting devices prepared by MOVPE and low energy electron beam irradiation treatment," *Proceedings of SPIE: Physical Concepts of Materials for Novel Optoelectronic Device Applications I: Materials Growth and Characterization*, pp. 138-149 (Oct. 28-Nov. 2, 1990).

Neugebauer, J. and Van De Walle, C.G., "Defects And Doping in GaN," pp. 2327-2330.

Abernathy, C.R., "The Role of Hydrogen In UHV Growth of III-V Semiconductors," *Materials Science Forum*, vols. 148-149, Trans Tech Publications, pp. 3-25 (1994).

Wetzel, C. et al., "Excitation Spectroscopy and Level Assignment in Piezoelectric $Ga_{1-x}In_xN$/GaN Quantum Wells," 2 pages.

Matsuoka, T. et al., "Wide-Gap Semiconductor InGaN and InGaAlN Grown by MOVPE," *Journal of Electronic Materials*, vol. 21, No. 2, pp. 157-163 (1992).

Albanesi, E.A. et al., "Theoretical study of the band offsets at GaN/AlN interfaces," *J. Vac. Sci. Technol. B 12(4)*, American Vacuum Society, pp. 2470-2474 (Jul./Aug. 1994).

Dissanayake, A. et al., "Low-temperature epitaxial growth and photoluminescence characterization of GaN," *Appl. Phys. Lett. 65(18)*, American Institute of Physics, pp. 2317-2319 (Oct. 31, 1994).

Wickenden, D.K. et al., "Thermally annealed GaN nucleation layers and the device-quality metal organic chemical vapor deposition growth of Si-doped GaN films on (00.1) sapphire," *J. Appl. Phys. 75(11)*, American Institute of Physics, pp. 7585-7587 (Jun. 1, 1994).

Saxler, A. et al., "High quality aluminum nitride epitaxial layers grown on sapphire substrates," *Appl. Phys. Lett. 64(3)*, American Institute of Physics, pp. 339-341 (Jan. 17, 1994).

English Translation of Japanese Patent Publication No. 87378/1992, 24 pages.

English Translation of Japanese Patent Publication No. 127595/1992, 9 pages.

English Translation of Japanese Patent Publication No. 111375/1992, 5 pages.

English Translation of Japanese Patent Publication No. 217986/1989, 8 pages.

English Translation of Written Argument, 16 pages, filed Feb. 12, 1999, in Japanese Patent Application No. 219892/1994 (reference No. JP-8355), in response to Notification of Reasons for Refusal dispatched Dec. 15, 1998.

English Translation of Notification of Reasons for Refusal, 8 pages, dispatched Dec. 15, 1998, in Japanese Patent Application No. 219892/1994 (reference No. JP-8355).

English Translation of Japanese Patent Publication No. JP-A-6-177423, 16 pages.

* cited by examiner

SEMICONDUCTOR LIGHT EMITTING DEVICE AND MANUFACTURING METHOD THEREFOR

This application is a divisional application of Ser. No. 09/012,790 filed Jan. 23, 1998, now U.S. Pat. No. 6,115,399, which is a divisional application of Ser. No. 08/528,308 filed Sep. 14, 1995, now U.S. Pat. No. 5,751,752.

BACKGROUND OF THE INVENTION

The invention relates to a semiconductor laser having a double heterodyne structure. More particularly, the invention relates to a semiconductor laser which uses a semiconductor of gallium nitride type compound suitable for emission of blue light, which is capable of reducing operating voltage without reducing the light emitting efficiency.

In the past, blue LED had a fault in putting it to practical use because it has lower luminance than a red LED or a green LED, but in recent years the luminance of the blue LED has increased and is in the spotlight now as a semiconductor of gallium nitride type compound has been in use, making it possible to obtain in p-type semiconductor layer of a low resistance containing Mg as a dopant.

The semiconductor of gallium nitride type compound described here is referred to a semiconductor in which a compound of Ga of group III element and N of group V element or part of Ga of group III element is substituted by other group III element such as Al and In and/or a semiconductor in which part of N of group V element is substituted by other group V element such as P and As.

In a conventional manufacturing method, gallium nitride type LEDs were manufactured in such processes as described below, and a perspective view of LED which uses a semiconductor of completed gallium nitride type compound is shown in FIG. 11.

First, by the organometallic compound vapor phase growth method (hereinafter referred to as MOCVD method), the carrier gas $H_2$ together with trimethyl gallium which is an organometallic compound gas (hereinafter referred to as TMG), ammonia ($NH_3$) and $SiH_4$ and the like are supplied as a dopant to a substrate consisting, for example, of sapphire (single crystal $Al_2O_3$) at low temperature of 400° to 700° C., approximately 0.10 to 0.2 $\mu$m of low temperature buffer layer 2 consisting of n-type GaN layer is formed, and then the same gas is supplied at high temperature of 700° to 1200° C., and approximately 2 to 5 $\mu$m of high temperature buffer layer 3 consisting of n-type GaN of the same composition is formed. The low temperature buffer layer 2 is formed by polycrystalline layer to ease the strain caused by mismatching of the lattice between a substrate 1 and the single crystal layer of semiconductor and then turned into a single crystal by being subjected to 700° to 1200° C., in order to match the lattice by laminating the single crystal of the high temperature buffer layer 3 on that single crystal.

Further, material gas of trimethyl aluminium (hereinafter referred to as TMA) is added to the foregoing gas, a film of an n-type $Al_kGa_{1-k}N$ (0<k<1) layer containing S of n-type dopant is formed, so that approximately 0.1 to 0.3 $\mu$m of an n-type clad layer 4 is formed to form a double heterodyne junction.

Then, instead of TMA which is the foregoing material gas, trimethyl indium (hereinafter referred to as TMI) is introduced to form approximately 0.05 to 0.1 $\mu$m of an active layer 5 consisting, for example, of $In_yGa_{1-y}N$ (0<y<1), a material whose band gap is smaller than that of the clad layer.

Further, impurity material gas is substituted by $SiH_4$ using the same material gas used for forming the n-type clad layer 4, Mg as a p-type impurity of biscyclopentadiene magnesium (hereinafter referred to as $Cp_2Mg$) or dimethyl zinc (hereinafter referred to as DMZn) for An is added and introduced into a reaction tube, causing a p-type $Al_kGa_{1-k}N$ layer which is a p-type clad layer 6 to be grown in vapor phase. By this process, a double hetero junction is formed by the n-type clad layer 4, active layer 5, and p-type clad layer 6.

Next, in order to form a contact layer (cap layer) 7, $Cp_2Mg$ or DMZn is supplied as the impurity material gas using the same gas as the foregoing buffer layer 23 to form 0.3 to 2 $\mu$m of the p-type GaN layer.

Afterward, a protective film such as $SiO_2$ and $Si_3N_4$ is provided all over the surface of the grown layer of a semiconductor layer, aniline or electron is irradiated at 400° to 800° C. for approximately 20 to 60 minutes to activate the p-type clad layer 6 and the contact layer (cap layer) 7, after the protective film is removed, resist is applied and patterning is provided to form an electrode on the n-side, part or respective grown semiconductor layers is removed by dry etching so as to expose the buffer layer 3 or the n-type clad layer 4 which is the n-type GaN layer, an electrode 8 on the n-side and an electrode 9 on the p-side are formed by sputtering and the like, and AN LED chip is formed by dicing.

As a conventional semiconductor laser, one that uses a semiconductor of GaAs type compound is known, in which a resonator is formed by a double hetero junction structure with both sides of an active layer being held between clad layers consisting of a material having greater band gap energy and smaller refractive index than the material of such active layer, so that it is possible to obtain the light oscillated in such resonator. Shown in FIG. 12 is an example of a semiconductor laser which uses a semiconductor of GaAs type compound having a refractive index wave guide structure provided with a difference of refractive index by an absorption layer in order to confine the light in the stripe portion of the active layer.

In FIG. 12, the numeral 121 represents a semiconductor substrate consisting, for example, of an n-type GaAs, on which are laminated in order a lower clad layer 124 consisting, for example, of an n-type $Al_\alpha Ga_{1-\alpha}As$ (0.35≦α≦0.75), an active layer 125 consisting, for example, of $Al_{\beta Ga1-\beta}As$ (0<β≦0.3) of non-doping type or an n-type or a p-type, a first upper clad layer 126a consisting of a p-type $Al_\alpha Ga_{1-\alpha}As$, a current laminating 120 consisting of an n-type GaAs, a second upper clad layer 126b consisting of a p-type $Al_\alpha Ga_{1-\alpha}As$, and a contact layer (cap layer) 127 consisting of a p-type GaAs, and the p-side electrode 128 and the n-side electrode 129 are respectively provided on the upper surface and the lower surface in order to form a chip of a semiconductor laser. In this structure, the current limiting layer 120 consisting of the n-type GaAs restricts the injection current to the stripe-like active area of width W, by absorbing the light generated by the active layer, a difference of refractive index is provided in the inside and the outside of the stripe. Therefore, the semiconductor laser of the present invention is used as a semiconductor laser of a red or infrared ray refractive index wave guide structure wherein the light is confined in transverse direction and the wave of stripe-like active area of width W is directed stably.

In the semiconductor laser of such structure, a blue light radiating semiconductor laser using a semiconductor of gallium nitride type compound is also requested.

In a conventional semiconductor of gallium nitride type compound, the light emitting efficiency of the light emitting element of double hetero junction is high but the operating voltage thereof is high. If a material of small band gap energy, that is, a material of small Al composition rate k of $Al_kGa_{1-k}N$ is used for the n-type clad layer and the p-type clad layer in order to lower the operating voltage, the operating voltage is lowered but the electron outflow from the active layer to the p-type clad layer increases, while the light emitting efficiency is lowered.

In the case where a semiconductor laser is to be composed by using a semiconductor of gallium nitride type compound, by providing a structure wherein an active layer is interposed between both sides by a clad layer consisting of a material having greater band gap energy and smaller refractive index than such active layer so as to confine the light in the active layer for oscillation, it can be considered to use $In_yGa_{1-y}N$ (1<y<1, where y=0.1 for example) as the active layer and $Al_kGa_{1-k}N$ (0<k<1, where k=0.2 for example) as the clad layer of both sides.

In a semiconductor laser which uses a conventional semiconductor of arsenic gallium type compound, specific resistance of $Al_\alpha Ga_{1-\alpha}As$ as the clad layer is approximately 100 Ω.cm and there occurs no problem of increased operating voltage or heat generation even if such clad layer is used as one requiring approximately 1 to 2 $\mu$m, but if a semiconductor of gallium nitride type compound is used, the specific resistance of $Al_kGa_{1-k}N$ (k=0.2 for example) is approximately 1000 Ω.cm when the carrier density of $10^{17}$ $cm^{-3}$, which is approximately 8 times as compared with the specific resistance of GaN of the same carrier density, thereby increasing the operating voltage as well as the power consumption in addition to the problem of heat generation.

Further, in a light emitting element of a semiconductor which uses a conventional semiconductor of gallium nitride type compound wherein the GaN layer is used as the contact layer 7 in which the p-side electrode is to be made, due to such reasons that the GaN layer is affected by variations of the surface level and that there is a large energy gap between the metallic conduction band such as the alloy of Au or Au and Zn used as electrode and the valence band of GaN, and the contact resistance between the electrode metal and the cap layer does not stabilize as a result, so that the contact resistance becomes large and the operating voltage also rises. These problems results from a basic problem that it is not possible to increase the carrier density of the p-type layer, and further, in a type of semiconductor laser with the current injection area being restricted to stripe-like shape in which the contact area of the electrode is formed into a stripe-like shape, and the problem becomes more conspicuous.

Furthermore, as described above, the light emitting element of a semiconductor which uses a conventional semiconductor of gallium nitride type compound is composed by laminating on a sapphire substrate a semiconductor layer of gallium nitride type compound by means of a low temperature buffer layer consisting of GaN and a high temperature buffer layer, the lattice constant 4.758 Å of the sapphire substrate is largely different from the lattice constant 3.189Å of GaN, the interatomic bonding strength of GaN is strong although it is weaker than that of AlGaN group, so that a crystal defect or transition is likely to occur due to temperature shock. In case a crystal defect or transistion occurs in the low temperature buffer layer, the crystal defect or transition progresses to the semiconductor layer formed thereon, thereby deteriorating the light emitting characteristic and reducing the life.

In addition, in the light emitting element of a semiconductor which uses a conventional semiconductor of gallium nitride type compound, as described above, electric current flows between the p-side electrode 8 provided on the contact layer 7 and the n-side electrode 9 provided on the high temperature buffer layer 3 which is an n-type layer due to the voltage applied therebetween, and the electric current flowing to the n-side electrode 9 has high carrier density of the buffer layers 2 and 3, so that the electric current flows throughout the buffer layers 3 and 2. On the other hand, because the buffer layer, the low temperature buffer layer 2 in particular is formed on a substrate consisting, for example, of sapphire that has a different lattice constant from that of a semiconductor of gallium nitride type compound, crystal defects or transition are likely to occur. When electric current flows into the buffer layer where crystal defects or transition take place, crystal defects or transition increase further due to the heat generated by the electric current, such crystal defects or transition progress to the semiconductor which contributes to the emission of light, thereby lowering the light emitting characteristic, reliability or the life.

SUMMARY OF THE INVENTION

An object of the present invention is to provide a light emitting device (hereinafter referred to as a light emitting element) of a semiconductor using a highly characteristic semiconductor of gallium nitride type compound which prevents increase in series resistance, that is, an increase in operating voltage resulting from the use of a semiconductor of gallium nitride type compound as described above and restricts further the occurrence of crystal defects or transition.

A first object of the present invention is to provide a light emitting element of a semiconductor of double hetero structure in which the light emitting efficiency does not lower with the operating voltage being low.

A second object of the present invention is to provide a semiconductor laser of high light emitting efficiency which demonstrates sufficiently the effect of confining the light in an active layer by a clad layer even in a semiconductor laser which uses a semiconductor of gallium nitride type compound and is suitable for emission of blue light, lowers the series resistance of the semiconductor layer, and operates on low operating voltage.

A third object of the present invention is to p provide a light emitting element of a semiconductor in which the contact resistance between the n-side electrode and the contact layer is small and a large output can be obtained from low operating voltage.

A fourth object of the present invention is to provide a light emitting element of a semiconductor of high characteristic or efficiency and long life which restricts occurrence of crystal defects or transition by reducing further the strain of the buffer layer on the surface of a substrate consisting of sapphire and the like and prevents the progress of crystal defects or transition toward the semiconductor layer which contributes to emission of light.

The light emitting element of a semiconductor which realizes the first object of the present invention has at least a sandwich structure consisting of an n-type clad layer, an active layer, and a p-type clad layer, is light emitting element of a semiconductor of double hetero junction type which is formed by a material, band gap energy of said active layer being smaller than the band gap energy of both the foregoing clad layers, and both the foregoing clad layers being selected so that the band gap energy of the foregoing n-type clad layer becomes smaller than the band gap energy of the foregoing p-type clad layer.

It is preferable that the foregoing n-type clad layer consists of an n-type $Al_xGa_{1-x}N$ ($0 \leq x \leq 0.5$), that the foregoing active layer consists of $In_yGa_{1-y}N$ ($0 \leq y \leq 1$), that the foregoing n-type clad layer consists of a p-type $Al_zGa_{1-z}N$ ($0 < z \leq 1$), where $2x \leq z$.

It is preferable that a buffer layer consisting of GaN is provided between one of the foregoing clad layers and the substrate in order that it is possible to relieve the strain of the clad layer, prevent occurrence of crystal defects or transition in the clad layer, and lower the resistance of the semiconductor layer.

In accordance with the light emitting element of a semiconductor which realizes the first object of the present invention, because a material having smaller band gap energy than that of the p-type clad layer is used for the n-type clad layer, injection of electron into the active layer from the n-type clad layer is carried out easily at low voltage. On the other hand, because a material having a large band gap energy is used for the p-type clad layer in the same way as in the past, escape of electron from the active layer to the p-type clad layer is less, contributing to recombination of electron and positive hole in the active layer. Because the positive hole has a greater effective mass than the electron, there is less escape of the electron toward the n-type clad layer side of the positive hole injected into the active layer even if the band gap energy of the n-type clad layer is small. Therefore, the electron contributes to recombination in the active layer without wasting the positive hole, so that it is possible to lower the operating voltage by the amount of the band gap energy of the n-type clad layer is reduced, and the light of approximately the same luminance is emitted.

Because the band gap energy of the n-type clad layer can be made small is approximately three times the electron having effective mass of the positive hole, it is possible to reduce the band gap energy of the n-type clad layer to approximately half the difference of the band gap energy between the p-type clad layer and the active layer, if the $Al_kGa_{1-k}N$ material is used, it is possible to reduce the ratio k of Al to less than half the ratio of Al of the p-type clad layer, and it is possible to lower the operating voltage by 5 to 10%.

A light emitting element which realizes the second object of the present invention is a semiconductor laser of double hetero junction structure which has an active layer, an n-type layer and p-type layer consisting of a material having greater band gap energy and smaller refractive index that the active layer, and the foregoing active layer being held between the foregoing n-type layer and the p-type layer, wherein the foregoing n-type layer and the p-type layer respectively consist of at least two layers, a low refractive index layer consisting of material with small refractive index is provided on the foregoing active layer side of the n-type layer and p-type layer, and a low resistance layer having smaller electric resistance than the foregoing low refractive index layer is provided in other portion of an electric current path of the n-type layer and p-type layer.

It is preferable that the thickness of the foregoing low refractive index layer is 10 to 50% with respect to the thickness of the foregoing n-type layer or p-type layer, so that it is possible to confine the light effectively in the active layer to certain extent and to lower the operating voltage.

Similar to the foregoing, it is preferable that the thickness of the foregoing refractive index layer is 0.1 to 0.3 µm because it is possible to confine the light effectively in the active layer to certain extent and to lower the operating voltage.

In order to obtain a semicondcutor laser which emits blue light of excellent light emitting characteristic, it is preferable that the foregoing active layer consists of $Al_mGa_nIn_{1-m-n}N$ ($0 \leq m < 1$, $0 < n < 1$, $0 < m+n < 1$), the foregoing low refractive index layer consists of $Al_rGa_sIn_{1-r-s}N$ ($0 \leq r < 1$, $0 < s < 1$, $m+n < r+s \leq 1$, $m < r$), and the foregoing low resistance layer consists of $Al_tGa_nIn_{1-t-u}N$ ($0 < t < 1$, $0 < u \leq 1$, $0 < t+u < 1$, $m < t < r$, $m+n < t+u \leq r+s$).

It is preferable that m=0 in the material composition of the foregoing active layer, that r+s=1 in the material composition of the foregoing low refractive index layer, and that t=0 and u=1 in the material composition of the foregoing low resistance layer because it is possible to obtain a semiconductor laser which is of more simple structure, has excellent light emitting characteristic, and emits blue light.

In accordance with the semiconductor laser which realizes the second object of the present invention, since the band gap energy for sandwiching the active layer is large, a low refractive index layer is provided on the respective active layer side of the n-type layer and p-type layer consisting of a material with small refractive index, and a low resistance layer of small electric resistance is provided in an electric current path, effect for confining the light into the active layer is achieved by reflecting the light efficiently on the low refractive index layer, with respect to an increase in specific resistance due to the low refractive index layer, it is possible to reduce sufficiently the operating voltage by other low resistance layer without being influenced excessively by forming the low refractive index layer on a thin layer of approximately 0.1 to 0.3 µm for example.

As a result, it is possible to prevent heat generation due to excessive resistance loss, improve the light emitting efficiency, and extend the life.

The light emitting element of a semiconductor which realizes the third object of the present invention is a light emitting element of a semiconductor in which a semiconductor layer of gallium nitride type compound having a light emitting portion containing at least an n-type layer and p-type layer is laminated on a substrate and an n-side electrode an p-side electrode to be connected respectively to the foregoing n-type layer and p-type layer are provided, and on at least the electrode side surface of the semiconductor layer to be provided with the foregoing p-side electrode are provided a p-type $In_aGa_{1-a}N$ ($0 < a < 1$) or p-type GaSa or p-type GaP or p-type $In_bGa_{1-b}As$ ($0 < b < 1$) or $In_bGa_{1-b}P$ ($0 < b < 1$).

That the composition ratio of In of the foregoing $In_aGa_{1-a}N$ is $0 < a \leq 0.5$ is preferable, so that it is possible to lower the contact resistance without emerging the problem of lattice mismatching.

In accordance with the light emitting element of a semiconductor which realizes the third object of the present invention, because $In_aGa_{1-a}N$ or GaAs or GaP or $In_bGa_{1-b}As$ or $In_bGa_{1-b}P$ is used on the surface of the contact layer to be provided with the p-side electrode, the contact resistance of the semiconductor layer and the electrode becomes small. In other words, because these semiconductor layer such as $In_aGa_{1-a}N$ has smaller band gap energy (forbidden band width) that GaN and is difficult to be oxidized, it becomes difficult for flowing electric current (contact resistance) due to the trapping of electron or positive hole according to the surface level is reduced. Further, a semiconductor layer such as $In_aGa_{1-a}N$ has smaller band gap energy (forbidden band width) as compared to GaN and the energy gap between the energy level of the metallic conduction band as an electrode and the valence band of the semiconductor layer is small, permitting the positive hole to flow easily. There is a gap occurring in the energy level of the valence band between $In_aGa_{1-a}N$ layer and GaN layer but the energy gap $E_v$ between the electrode metal and GaN layer is divided into the energy gap $E_{v1}$ between the metal and $In_aGa_{1-a}N$ layer and the energy gap $E_{v2}$ between $In_aGa_{1-a}N$ layer and GaN layer, so that the apparent contact resistance becomes small since the positive hole or electron which has climbed over the small energy gap $E_{v1}$ should climb over the small energy gap $E_{v2}$ further whole it should not climb over the large energy gap $E_v$ directly.

With respect to the GaAs pr GaP, because the band gap energy (forbidden band width) is small and difficult to be oxidized in the same manner as $In_aGa_{1-a}N$, the surface level is difficult to occur and the band gap energy is smaller than that of $In_aGa_{1-a}N$, so that the contact resistance becomes small further.

As in the case of the foregoing $In_aGa_{1-a}N$, In of $In_bGa_{1-b}As$ or $In_bGa_{1-b}P$ plays a role of reducing the band gap energy (forbidden band width) further and acts to reduce the contact resistance further. In this case, lattice matching deviates largely from that of $In_aGa_{1-a}N$ but the effect of reduction of the band gap energy is larger. In addition, it is possible to increase the p-type carrier density further.

The light emitting element of a semiconductor which realizes the fourth object of the present invention is a light emitting element of a semiconductor in which a semiconductor layer of gallium nitride type compound having a luminous portion containing at least an n-type layer and a p-type layer is laminated on a substrate by means of a buffer layer and at least the foregoing substrate side of the foregoing buffer layer is consisted of a semiconductor layer of gallium nitride type compound containing at least one kind of element selected from a group consisting of P and As.

It is preferable that the foregoing buffer layer has a low temperature buffer layer formed at least at low temperature and that the low temperature buffer layer is a semiconductor layer consisting of $In_cGa_{1-c}N$ (0<c<1) or $In_dAl_eGa_nIn_{1-d-e}N$ (0<d<1, 0<e<1, 0<d+e<1).

It is preferable that the foregoing buffer layer has a low temperature buffer layer formed at least at low temperature and that the low temperature buffer layer is a semiconductor layer consisting of $GaN_uP_{1-u}$ (0<u<1) or $GaN_vAs_{1-v}$ (0<v<1) because it is possible to reduce the straining of the buffer layer.

In accordance with this light emitting element of a semiconductor, because In, P or As is contained in the buffer layer consisting of semiconductor of gallium nitride type compound on a sapphire substrate, the buffer layer becomes soft and occurrence of crystal defects or transition becomes difficult. In other words, when a part of Ga of GaN becomes $In_cGa_{1-c}N$ (0<c<1) which is substituted by In, In is heavier than Ga and is easily cut in a crystal, the strain is easily relieved, making it difficult for crystal defects and the like to occur. In addition, it becomes easy to form a polycrystalline film at low temperature by containing In, and it is possible to relieve the strain further by forming a buffer layer at low temperature. These phenomena apply in the same manner to $In_dAl_eGa_{1-d-e}N$ (0<d<1, 0<e<1, 0<d+e<1, of which part of Ga is substituted by Al.

Further, when part of N of GaN becomes $GaN_uP_{1-u}$ (0<u<1) or $GaN_vAs_{1-v}$ (0<v<1) of which part of N of GaN is substituted by P or As, P or As becomes heavier than N and easily moves in a crystal. Therefore, according to the same reason that part of the foregoing Ga is substituted by In, the strain of the buffer layer is relieved, so that it becomes difficult for crystal defects or transition to occur.

Crystal defects or transition occurred in a buffer layer where the strain is likely to occur most in contact with sapphire substrate and the like progress toward a semiconductor layer which contributes to the light emitting portion, and the strain of the buffer layer is relieved and the occurrence of crystal defects or transition of the buffer layer is restricted, so that the occurrence of crystal defects or transition of a semiconductor layer which contributes to the light emitting portion is restricted, the light emitting characteristic is improved, and the life and also improved.

Other light emitting element of a semiconductor which achieves the forth object of the present invention consists of a semiconductor layer where the electric current is difficult to flow at least on the foregoing substrate side of the buffer layer.

That the foregoing buffer layer is a semiconductor layer of gallium nitride type compound containing at least one kind of element selected from a group consisting of In, P and As is preferable because softness is provided and it is possible to relieve the strain and to make it difficult for crystal defects or transition to occur.

Because at least the foregoing substrate side of the foregoing buffer layer is consisted of a semiconductor layer of high resistance, it is possible to make it difficult for the electric current to flow.

Even in the case of a conductive type semiconductor layer which is different from a conductive type semiconductor layer in which at lest the foregoing substrate side of the foregoing buffer layer is laminated directly on the buffer layer, it is possible to make it difficult for the electric current to flow to the substrate side of the buffer layer.

Because the foregoing buffer layer is formed at high temperature on a p-type low temperature buffer layer formed at low temperature on the foregoing substrate surface and such low temperature buffer layer, consisted of a high temperature buffer layer in which at least the surface side is made an n-type, on such high temperature buffer layer are sequentially formed an n-type cald layer, an active layer, a p-type clad layer, and a p-type contact layer in that order, the p-side electrode is formed on such p-type contact layer, the n-type electrode is formed on the foregoing n-type clad layer exposed by etching or on the high temperature buffer layer, it is possible to obtain a light emitting element of a semiconductor of hetero junction structure in which it is difficult for the electric current to flow toward the buffer layer on the substrate side.

Because the foregoing buffer layer consists of GaN, the foregoing n-type and p-type clad layer consists of $Al_kGa_{1-k}N$ (0<k<1) respectively, the foregoing active layer consists of $Ga_yIn_{1-y}N$ (0<y≦1), and foregoing p-type contact layer consists of GaN, it is possible to obtain a simply structured light emitting element of a semiconductor of double hetero junction structure.

In accordance with the light emitting element of a semiconductor of the present invention, because the semiconductor layer contacting at least the substrate of the semiconductor layer of gallium nitride type compound to be laminated on the substrate is made a semiconductor layer where it is difficult for the electric current to flow, there will be no further increase in crystal defects or transition caused by the electric current which occur due to the strain based on the difference of the lattice constant with respect to the substrate, and further the progress is restricted of crystal defects or transition toward the semiconductor layer contributing to the light emitting portion, so that it is possible to obtain a semiconductor layer of less crystal defects or transition.

In other words, when the electric current flows to a semiconductor layer where crystal defects or transition are occurring, a resistance loss occurs and heat is generated in a portion where crysal defects or transition are occurring, crystal defects or transition increase further, and the vicious cycle is repeated. On the other hand, because crystal defects or transition of the semiconductor of a portion contributing to radiation results from the progress of crystal defects or transition occurred in the semiconductor of a portion contributing to radiation results from the progress of crystal defects or transition occurred in the semiconductor layer contacting the substrate, by restricting the occurrence of crystal defects or transition in the semiconductor layer contacting the substrate, it is possible to restrict the occurrence of crystal defects or transition in the semiconductor layer which positively contributes to the emission of light. As a result, a light emitting element of a semiconductor of excellent light emitting characteristic, high reliability, and long life can be obtained.

DETAILED DESCRIPTION

Referring now in detail to the drawings, the light emitting of a semiconductor of the present invention will be described.

EXAMPLE 1

Figure 1:
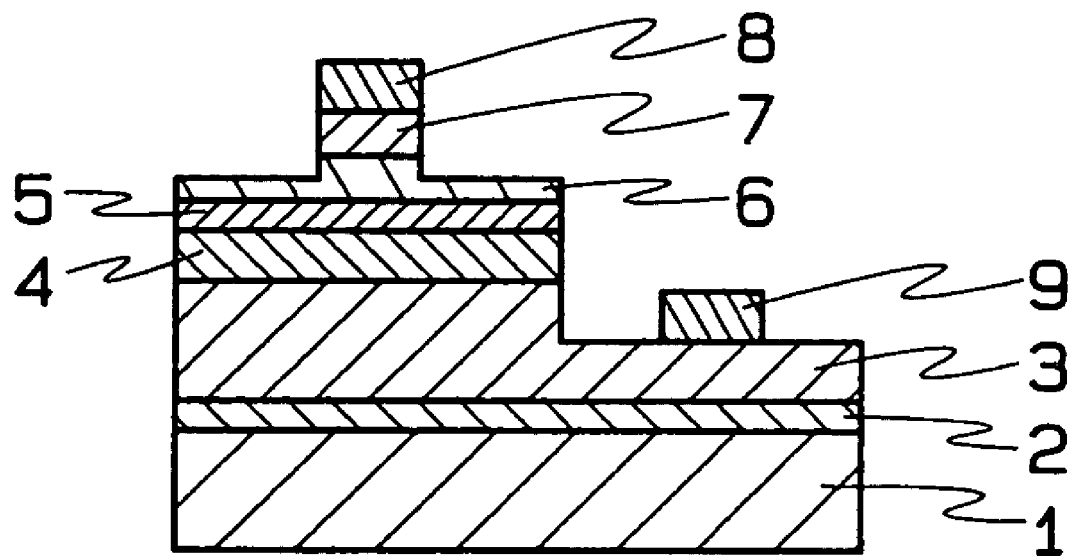
FIG. 1 is an explanatory drawing illustrating a section of an example 1 of the light emitting element of a semiconductor of the present invention.
Figure 2A:
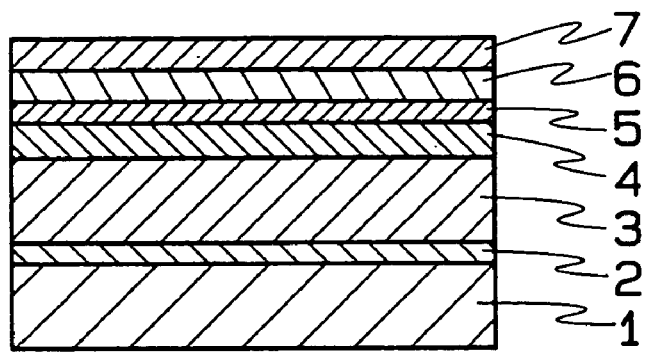
FIGS. 2(a) through 2(c) are explanatory drawings illustrating manufacturing processes of FIG. 1.
Figure 2B:
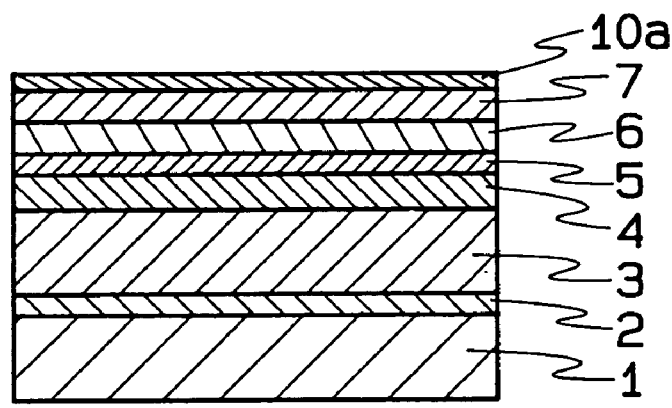
Figure 2C:
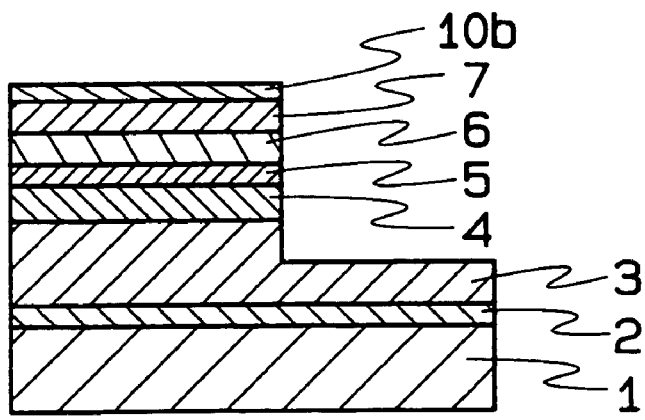
Figure 3:
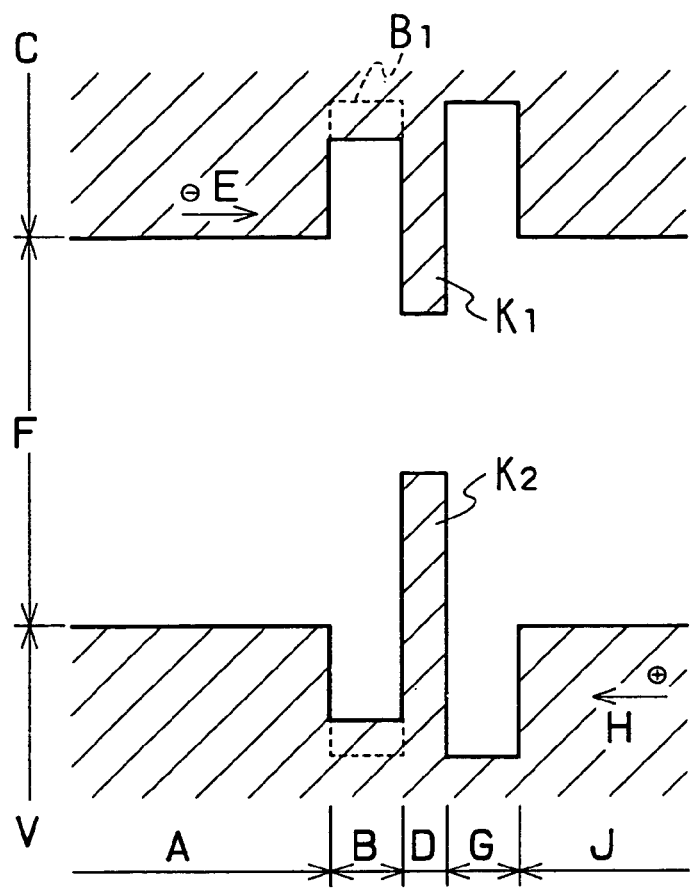
FIG. 3 is an energy band drawing mainly illustrating a forbidden band of a clad layer and an active layer of an example 1 of the light emitting element of a semiconductor of the present invention.

FIG. 1 is an explanatory drawing of a section of a laser chip of a mesa-type shape semiconductor of an example 1 of the light emitting element of a semiconductor of the present invention, FIGS. 2(a) through 2(c) are the manufacturing process drawing thereof, and FIG. 3 is a schematic illustration showing the energy band drawing mainly of the forbidden band of an n-type clad layer, an active layer, and a p-type clad layer of the light emitting element of a semiconductor of the example 1.

In FIG. 1, the numeral 1 indicates a substrate such as sapphire (single crystal of $Al_2O_3$) consisting of an n-type GaN, wherein a low temperature buffer layer 2 of approximately 0.01 to 0.2 $\mu$m, a high temperature buffer layer 3 of approximately 2 to 3 $\mu$m consisting of an n-type GaN, an n-type clad layer 4 of approximately 0.1 to 0.3 $\mu$m consisting of an n-type material such as $Al_xGa_{1-x}N$ ($0x \leq 0.5$, where x=0.07 for example) which has a smaller band gap energy (forbidden band width) than a p-type clad layer, an active layer 5 of approximately 0.05 to 0.1 $\mu$m consisting of non-doping or an n-type or a p-type material such as $In_yGa_{1-y}N$ ($0 \leq y \leq 1$) which has a smaller band gap energy and larger refractive index than both clad layers, a p-type clad layer 6 of approximately 0.1 to 0.3 $\mu$m consisting of a p-type $Al_zGa_{1-z}N$ (0<z<1, 2x<z, where z=0.15 for example), and a contact layer (cap layer) 7 of approximately 0.3 to 2 $\mu$m consisting of a p-type GaN are laminated in order, a p-side electrode 8 consisting of a metal such as Au is formed on the contact layer 7, an n-side electrode 9 consisting of a metal such as Al is formed on the high temperature buffer layer 3 wherein a part of the laminated semiconductor layer is removed and exposed by etching, and a current stripe is formed, so that part of the contact layer 7 and the p-type clad layer is etched and turned into a mesa-type shape, and a chip of a semiconductor laser is formed.

In the light emitting element of a semiconductor of the present invention, as shown in an example of this semiconductor laser, the band gap energy of the n-type clad layer 4 smaller than the band gap energy of the p-type clad layer 6, and both clad layers 4, and 6 and the active layer 5 is formed by a material having a greater band gap energy than that of the active layer 5.

In order to recombine the electron and the positive hole efficiently and to improve the light emitting efficiency, a light emitting element of a semiconductor of double junction structure for sandwiching the active layer 5 consisting of a material having a small band gap energy by clad layers consisting of material having a large band gap energy, is used for a semiconductor laser or an LED of high luminance. When a material having a large band gap energy is used for the clad layer, effect of confining the electron and the positive hole increases and contributes to the emission of light without waste but the operating voltage increases, and in practice, a material having a band gap energy which can ignore to a certain degree the leakage of the electron and the positive hole from the active layer, is selected. However, the operating voltage increases as compared with that of the pn junction. In the present invention, it is so designed that it is possible to lower the operating voltage while maintaining this degree with which the electron and the positive hole can be ignored. In other words, the effective mass of the positive hole is as approximately three times large as the effective mass of electron, and the leakage from the positive hole is smaller than that from the electron even if the band gap energy is small. For this reason, by using for the n-type clad layer a material having a band gap energy smaller than that of the p-type clad layer, it is possible to inject the electron into the active layer at low voltage and prevent the leakage of the positive hole from the active layer.

Referring now to FIG. 3 which illustrates a schematic diagram showing the energy band drawing of the foregoing semiconductor laser of FIG. 1, the action of the present invention will be described. In FIG. 3, the letter V represents the valence band, F the forbidden band, and C the energy band of the conduction band respectively, and the letters A represents the high temperature buffer layer consisting of an n-type GaN, B the n-type clad layer 4 consisting of n-type GaN, B the n-type clad layer 4 consisting of an n-type $Al_{0.07}Ga_{0.93}N$, D the active layer 5 consisting of $In_yGa_{1-y}N$, G the p-type clad layer 6 consisting of $Al_{0.15}Ga_{0.85}N$, and J the contact layer 7 consisting of a p-type GaN respectively of the ranges of the energy bands thereof.

In the semiconductor laser of this example, as shown in FIG. 3, the band gap energy of the n-type clad layer indicated by B is formed to be smaller than the band gap energy of the p-type clad layer indicated by G. The band gap energy indicated by the broken line $B_1$ illustrates the case of the band gap energy which is the same as the p-type clad layer in a conventional structure.

With this structure, when voltage is applied between the p-side electrode 8 and the n-side electrode 9, the electron E flows from the n-type GaN (high temperature buffer layer A) to the p-side, and then into the conduction band $K_1$ of the active layer. In this case, because the band gap energy of the n-type clad layer is low, the electron E is likely to flow into the conduction band $K_1$ of the active layer, so that the electron is supplied to the active layer even with low voltage. The electron E flowed into the conduction band $K_1$ of the active layer is pulled by the p-side electrode, but is confined in the active layer because the band gap energy of the p-type clad layer is large. On the other hand, the positive hole flows from the p-type GaN (contact layer J) to the n-side, and then into the valence band $K_2$ of the active layer. The positive hole H flowed into the valence band $K_2$ of the active layer is pulled by the n-side electrode, but the effective mass of the positive hole H is as approximately three times large as the effective mass of electron, the positive hole cannot climb over the band gap energy even if the band gap energy of the n-type clad layer B is low, and is confined effectively in the valence band of the active layer. As a result, recombination of the electron and the positive hole is carried out in the active layer efficiently, and high light emitting efficiency can be obtained.

As described above, in accordance with the present invention, because each semiconductor layer is selected so that the band gap energy of the n-type clad layer is made smaller than that of the p-type clad layer, it is possible to inject the electron into the active layer with low voltage and improve the light emitting efficiency without increasing the reactive current. The amount that the band gap energy of the n-type clad layer is smaller than that of the p-type clad layer is determined by the band gap energy of the active layer, and the amount may be as low as ⅓ to ½ in the case of the p-type layer by the difference of the band gap energy of the active layer.

In order to reduce the band gap energy by using a semiconductor of gallium nitride type compound consisting of a general formula $Al_pGa_{1-p-q}N$ ($0 \leq p<1$, $0<q \leq 1$, $0<p+q \leq 1$), it is possible to obtain a small band gap energy by making p small, that is, by making the composition ratio of Al small, or by making p+q small, that is, by making the composition ratio of In large. For this reason, by adjusting the composition ratio of Al and In so as to make the band gap energy of the clad layer larger than that of the active layer, and so as to make the band gap energy of the n-type clad layer smaller than that of the p-type clad layer, it is possible to obtain a semiconductor layer of a desired band gap energy.

Because the example shown in FIG. 1 refers to a semiconductor, it is necessary to confine the light in the active layer and oscillate it, so that the refractive index of the clad layer is made smaller than that of the active layer, but it is not always necessary to do so in the case of LED. However, if the composition ratio of Al is made large by the foregoing composition ratio, the refractive index is made small.

Next, by referring to FIG. 2(a) through 2(c), the manufacturing method of the semiconductor laser shown in FIG. 1 will be described.

First, as shown in FIG. 2(a), on a substrate 1 consisting of sapphire and the like is grown by the MOCVD method, approximately 0.01 to 0.2 µm of a low temperature buffer layer 2 consisting, for example, of a semiconductor of gallium nitride type compound such as the n-type GaN, and approximately 2 to 5 µm of a high temperature bufrer layer 3 consisting of the n-type GaN of the same composition is formed at 700° to 1200° C.

Next, TMI is supplied further, and approximately 0.1 to 0.3 µm of an n-type clad layer 4 consisting, for example, of the n-type $Al_xGa_{1-x}N$ ($0 \leq x \leq 0.5$, where x=0.07 for example) is formed. Afterward, TMI is supplied instead of TMA and an active layer 5 consisting of a non-doping type or an n-type or p-type $In_yGa_{1-y}N$ ($0 \leq y \leq 1$, where y=0.06 for example) is caused to grow to a thickness of approximately 0.05 to 0.1 µm. Then, by using the same material gas as the material gas which is used to form the n-type clad layer 4, TMA is supplied to a reaction tube at the flow rate of 20 to 100 sccm which is approximately twice the case of the n-type clad layer 4 so as to form approximately 0.1 to 0.3 µm of the p-type $Al_zGa_{1-z}N$ ($0<z \leq 1$, $2x \leq z$, where z=0.15 for example) which is the p-type clad layer 6. Further, the same material gas used for forming the buffer layer 3 is supplied so as to form approximately 0.3 to 2 µm of a contact layer 7 consisting of the p-type GaN.

In order to form the foregoing buffer layer 3 or clad layer 4 into an n-type clad layer, Si, Ge, Tc is mixed into a reaction oven as the impurity material gas such as $SiH_4$, $GeH_4$, and $TeH_4$, and in order to form the clad layer 6 or the contact layer 7 into a p-type clad layer, Mg or Zn is mixed into the material gas as the organometallic gas of $Cp_2Mg$ or DMZn. However, in the case of the n-type, even if the impurity is not mixed, N is easily evaporated during film forming and is turned into the n-type naturally, and therefore such nature may be utilized.

Afterwards, a protective film 10a such as $SiO_2$ or $Si_3N_4$ is provided over the entire surface of the grown layer of a semiconductor layer (refer to FIG. 2(b)), annealed for approximately 20 to 60 minutes at 400 to 800° C., and the p-type clad layer 6 and the cap layer 7 which are the p-type layer.

When annealing is completed, as shown in FIG. 2(C), a mask such as a resist film 10b is provided and the laminated semiconductor layer is etched until the n-type clad layer 4 or the n-type high temperature buffer layer 3 is exposed. This etching is carried out by the reactive ion etching under the atmosphere of a mixed gas of $Cl_2$ and $BCl_3$ for example.

Then, a metallic film such as Au and Al is formed by sputtering, on the surface of the laminated compound of semiconductor layer is formed the p-side electrode 8 to be electrically connected to the p-type layer, on the surface of the exposed high temperature buffer layer 3 is formed the n-side electrode 9 to be electrically connected to the n-type layer, and part of the contact layer 7 and the p-type clad layer 6 are etched into mesa-type shape layers (refer to FIG. 1).

Next, each chip is diced, and thus semiconductor laser chips are formed.

In this example, the semiconductor laser of mesa-type shape current stripe structure is described, but the present invention can also be applied to a semiconductor laser of various structures such as the flush type current limiting layer or the light emitting element of semiconductor which uses a semiconductor of gallium nitride type compound such as LED of double hetero junction structure.

In accordance with the light emitting element of a semiconductor of this example, because the semiconductor material is selected so that it is possible to make the band gap energy of the n-type clad layer smaller than the band gap energy of the p-type clad layer, reactive current is less, and, it is possible to emit the light of high luminance with low operating voltage and to obtain a light emitting element of semiconductor having high light emitting efficiency.

EXAMPLE 2

Figure 4:
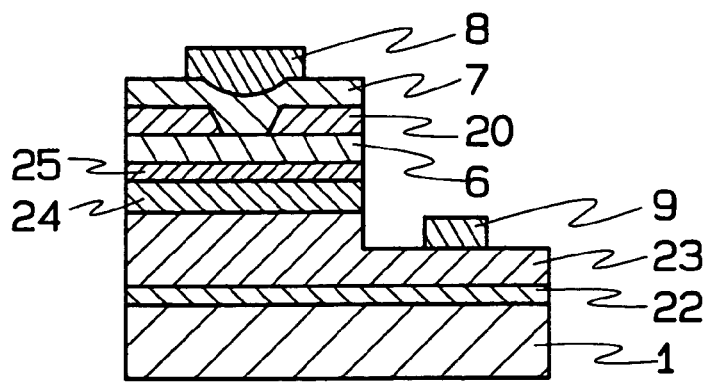
FIG. 4 is an explanatory drawing of a section illustrating an example 2 of the semiconductor laser of the present invention.

FIG. 4 is an explanatory drawing of a section of the chip of a semiconductor laser which is the other example of the light emitting element of the semiconductor of the present invention, and FIG. 5(*a*) through 5(*c*) are an explanatory drawing of a section of the process of the manufacturing method thereof.

As shown in FIG. 4, in the semiconductor laser of this example, a low buffer layer 22 of approximately 0.01 to 0.2 μm which is a lower resistance layer with small electric resistance consisting of an n-type $Al_tGa_{1-t-u}N$ ($0 \leq t < 1$, $0 < u \leq 1$, $0 < t+u \leq 1$) and the like provided on a substrate 1 such as sapphire (single crystal of $Al_2O_3$), a high temperature buffer layer 23 of approximately 2 to 5 μm, an n-type clad layer 24 of approximately 0.1 to 0.3 μm which is low refractive index layer consisting of an n-type $Al_rGa_sIn_{1-r-s}N$ ($0 \leq t < r < 1$, $0 < s < 1$, $0 < r+s < 1$) and having the refractive index smaller than that of the foregoing buffer layers 22 and 23 an active layer 25 of approximately 0.05 to 0.1 μm consisting of $Al_mGa_nIn_{1-m-n}N$ ($0 < m < r$, $0 < m+n < r+s$) of a non-doping type or an n-type or a p-type and having a smaller band gap energy and a larger refractive index than the n-type clad layer 24 (the ratio n of Al is small and the ratio 1-m-n of In is large), a p-type clad layer 26 of approximately 0.1 to 0.3 μm which is a low refractive index layer of the same composition as the n-type clad layer 24, a current limiting layer 20 consisting of GaN and the like formed with a stripe groove, and a cotnact layer consisting of the p-type $Al_tGa_uIn_{1-t-u}N$ ($0 \leq t < 1$, $0 < u \leq 1$, $0 < t+u \leq 1$) of approximately 3 to 2 μm which is a low refractive index layer of the same composition as the buffer layers 22 and 23 are laminated in order, the p-side electrode 8 is provided on the surface of the contact layer 7, the n-side electrode 9 on the high temperature buffer layer 23 which is exposed by etching a part of the laminated semiconductor layer, and a chip of the semiconductor laser of this example is formed.

Figure 6:
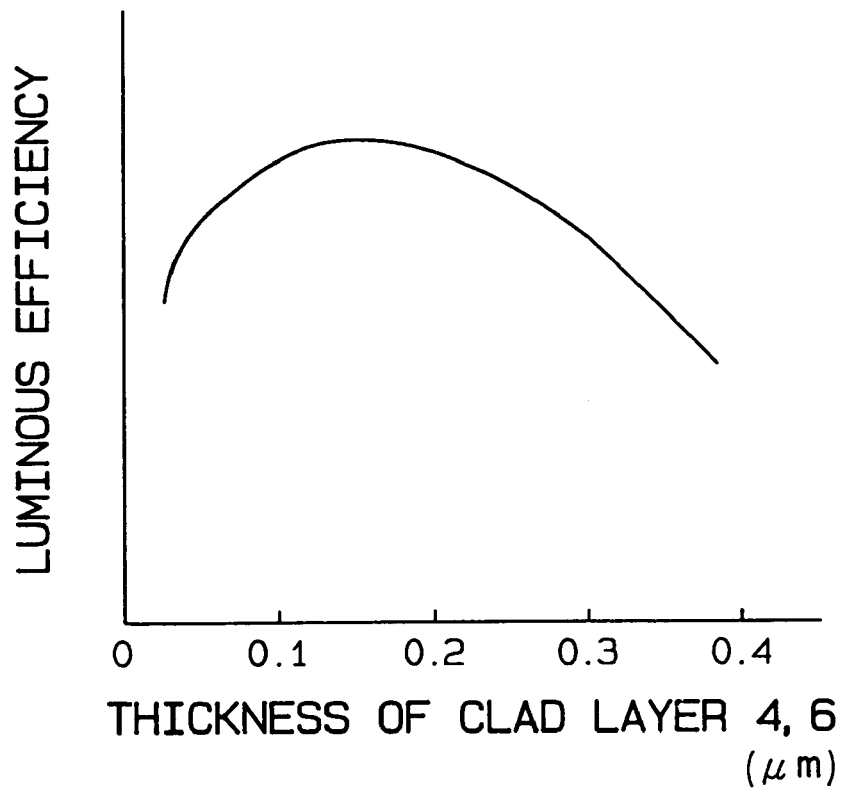
FIG. 6 is a drawing illustrating the relation of the light emitting efficiency with respect to the thickness of a low refractive index layer.

In the semiconductor laser of this example, the n-type layer and the p-type layer which hold the active layer 25 is separated into the buffer layers 22 and 23 which are the low resistance layer respectively, the n-type clad layer 24 which is the low refractive index layer, the p-type clad layer 6 which is the low refractive index layer, and the contact layer 27 which is the low resistance layer, and the low refractive index layer is formed into a minimum thickness necessary to confine the light into the active layer. In order to inspect the influence on the low refractive index layer by the thickness, the inventor of the present invention inspected the light emitting efficiency in a manner as shown in an example of concrete structure to be described layer, namely, on the buffer layer 23 is formed approximately 3 μm of the n-type GaN, on the n-type and p-type clad layers 24 and 26 are formed $Al_{0.3}Ga_{0.7}N$, and on the contact layer 27 is formed approximately 2 μm of the p-type GaN respectively, the thickness of the clad layers 24 and 26 are changed differently from 0 to 0.4 μm (the thickness of the buffer layer 3 and the contact layer 27 is also changed every time so as to keep the total thickness of the clad layers 24 and 26 constant), and thus the light emitting efficiency is inspected. Results of the inspection is shown in FIG. 6. As is apparent from FIG. 6, it is necessary that the thickness of the low refractive index layer is formed to be 0.05 to 0.3 μm, and preferably to be approximately 0.1 to 0.2 μm, and is formed to be 10 to 50% with respect to the entire thickness of the n-type layer or the p-type layer, and preferably to be approximately 10 to 30%.

In case where a semiconductor of gallium nitride type compound is expressed as the general formula of $Al_pIn_{1-p-q}N$, in order to make the refractive index small in a semiconductor of gallium nitride type compound, it is necessary to make the composition ratio of Al large and to make the composition ratio of In small, and when the composition ratio of Al is made large, the resistance is increased and the resistance loss results. Therefore, in this example, a low refractive index layer (the n-type clad layer 24 and the p-type clad layer 26) is provided for confining the light into the semiconductor portion adjacent to the active layer 25 of the n-type layer (the buffer layers 22 and 23, and the n-type clad laeyr 24) which hold the active layer 25 therebetween, and other portion is made a low resistance where the loss of resistance does not occur.

In order to make the specific resistance small in the semiconductor of gallium nitride type compound expressed as the foregoing general formula of $Al_pGa_qIn_{1-p-q}$, the composition ratio of Al is to be simply made small. In this case, it is necessary for the n-type layer and the p-type layer which hold the active layer therebetween to be provided with the function as the clad layer to confine the light into the active layer, it is preferable that even the low resistance layer (the buffer layers 22 and 23 and the contact layer 27) is formed by a material which has smaller refractive index and larger band gap energy than the active layer 25. In order to achieve this object, by making the composition ratio of In large in the active layer 25 and by making such composition ratio small in the n-type layer and the p-type layer, it is possible to obtain a layer which is of low resistance and has larger band gap energy and smaller refractive index than the active layer 25.

In this example, the composition ratios of the n-type buffer layers 22 and 23 and the contact layer 27 are made to be the same, and the composition ratios of the n-type clad layer 24 and p-type clad layer 26 are made to be the same, but respective composition ratios may not always have to be the same, and the low refractive index layer (the n-type clad layer 24 and p-type clad layer 26) may have smaller refractive index and larger band gap energy than the active layer 25 or the low resistance layer (the buffer layers 22 and 23 and the contact layer 27), and the low resistance layer may be of a material having smaller specific resistance than the low refractive index layer.

The low temperature buffer layer 22 is made to be a low resistance layer in this example, but it is not necessary to make the low temperature buffer layer to be an electric current path if it is possible to provide the n-side electrode 9 on the high temperature buffer layer 23, so that the low temperature buffer layer 22 may be made to be a high resistance layer or the p-type layer. In this case, it is preferable that electric current is not flowed to the low temperature buffer layer where crystal defects or transition are likely to occur, thereby making it possible to prevent an increase of crystal defects or transition.

Further, in the boundary between the low resistance layer and the low refractive index layer, the composition may not be changed sharply but may be changed gradually. Causing the composition to change gradually is effective to restrict the strain generating in the interface due to sudden change in composition. In addition, a second clad layer which is a low resistance layer similar to the contact layer 27 may be provided between the p-type clad layer 26 and the contact layer 27, so that the high temperature buffer layer 23 accomplishes the function of the clad layer of low resistance layer.

Figure 5A:
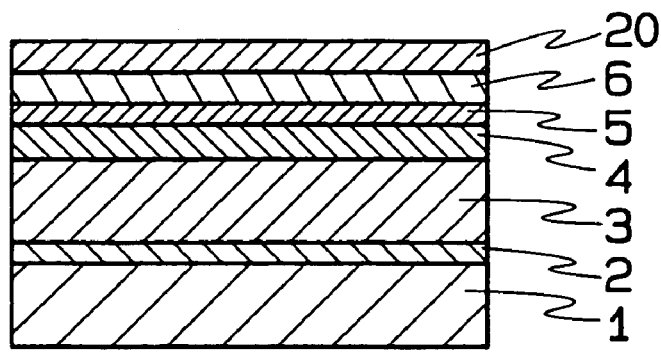
FIGS. 5(a) through 5(c) are explanatory drawings illustrating processes of the manufacturing method of an example 2 of the semiconductor laser of the present invention.

Next, the manufacturing method of the semiconductor laser of this example will be described by a definite example thereof. First, as shown in FIG. 5(a), a substrate 1 consisting of sapphire and the like is installed in a reaction tube, and in the same manner as the example 1, 10 slm of the carrier gas $H_2$, 100 sccm of the reactant gas TMG, and 10 slm of $NH_3$ are introduced to grow in vapor phase at 400° to 700° C. by means of the organometallic vapor phase growth method (hereinafter referred to as the MOCVD method), and a low temperature buffer layer 22 which is a polycrystalline film consisting of GaN of approximately 0.01 to 0.2 $\mu$m is formed. Then, by raising the temperature to 700° to 1200° C. and allwoing to stand for approximately 5 to 15 minutes, polycrystal line of the low temperature 5 to 15 minutes, polycrystal line of the low temperature buffer layer 2 is made into a single crystal, by introducing thereon the same material gas as the foregoing and causing it to react in vapor phase at high temperature of 700° to 1200° C., a high temperature buffer layer 23 consisting of single crystal of GaN is formed to 2 to 5 $\mu$m thick.

Further, by mixing TMA at the flow rate of 10 to 200 sccm and causing it to react in vapor phase, an n-type clad layer 24 consisting of $Al_{0.2}Ga_{0.8}N$ is formed to 0.1 to 0.3 $\mu$m thick.

Next, the dopant $SiH_4$ is stopped and in place of TMA, TMI is supplied at the flow rate of 10 to 200 sccm so as to form approximately 0.05 to 0.1 $\mu$m of a non-doping active layer 5 consisting of $In_{0.1}Ga_{0.9}N$, further the material gas of the same composition as that of the n-type clad laeyr 24 is supplied, the impurity material gas is replaced by $SiH_4$ and $Cp_2Mg$ or DMZn is introduced at the flow rate of 10 to 1000 sccm so as to form the p-type clad layer 6 consisting of $Al_{0.2}Ga_{0.8}N$ to 0.1 to 0.3 $\mu$m thick, and then, the n-type GaN layer is formed to approximately 0.1 to 0.5 $\mu$m thick so as to form a current limiting layer 20 by supplying TMG, $NH_3$, and $SiH_4$.

Figure 5B:
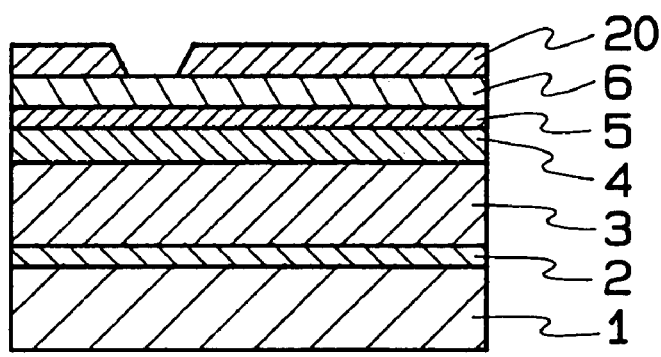

Afterward, the furnace temperature is lowered to approximately the room temperature, a substrate with semiconductor layer laminated thereon is taken out from the MOCVD device, and as shown in FIG. 5(b), a stripe groove is formed by etching by lithographic process, and the current limiting layer 20 is formed.

Figure 5C:
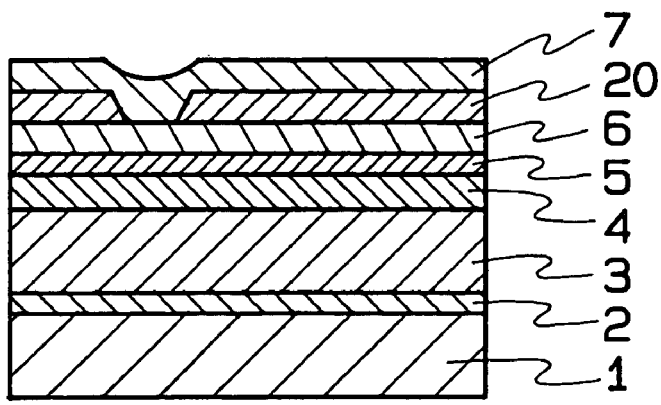

Afterwards, as shown in FIG. 5(c), the substrate is put into the MOCVD device again with the temperature set at 700° to 1200° C., TMG and $NH_3$ as the reactant gas and $Cp_2Mg$ or DMZn as the dopant are supplied, and approximately 2 to 3 $\mu$m of a contact layer 27 consisting of GaN is formed.

Afterwards, a protective film such as $SiO_2$ and $Si_3N_4$ is provided on the entire surface of a semiconductor layer and annealed for approximately 20 to 60 minutes at 400° to 8000° C. so as to activate the p-type clad layer 26 and the contact layer 27.

Next, in order to form the n-side electrode, a mask is formed by a resist film and the like and part of a semiconductor layer laminated under atmosphere of $Cl_2$ gas is provided with reactive ion etching, a high temperature buffer layer 23 which is an n-type layer is caused to be exposed, a p-side electrode 8 consisting of Au and Au—Zn and the like is formed on the contact layer 27, an n-side electrode 9 consisting of Au and Au—Zn and the like is formed on the contact layer 27, an n-side electrode 9 consisting of Al and Au—Gc and the like is formed on the high temperature buffer layer 23, and a chip of a semicondcutor laser is formed by dicing (refer to FIG. 4).

In this example, the semiconductor laser is a semiconductive laser of refractive index wave guide type provided with the current limiting layer 20, but it is also the same in the case of a gain wave guide stripe type semiconductor laser. Further, it is the semiconductor laser which uses a semiconductor of gallium nitride type compound whose general formula is expressed as $Al_pGa_qIn_{1-p-q}N$, and though it is not so remarkable as the semiconductor of gallium nigride type compound, it will be effective by application of the present invention even in the case of a semiconductor of other compound such as the semiconductor of arsenic gallium type compound.

In accordance with a semiconductor laser of the example 2, because the n-type layer and the p-type layer for holding the active layer therebetween are respectively formed by at least a low refractive index layer and a low resistance layer, confinement of the light into the active layer is carried out by the low refractive index layer, electric resistance of the portion composing other electric current path becomes small due to the low resistance layer, so that it is possible to lower the operating voltage. As a result, it is possible to obtain a semiconductor laser which operates with low operating voltage and has high light emitting efficiency.

EXAMPLE 3

Figure 7:
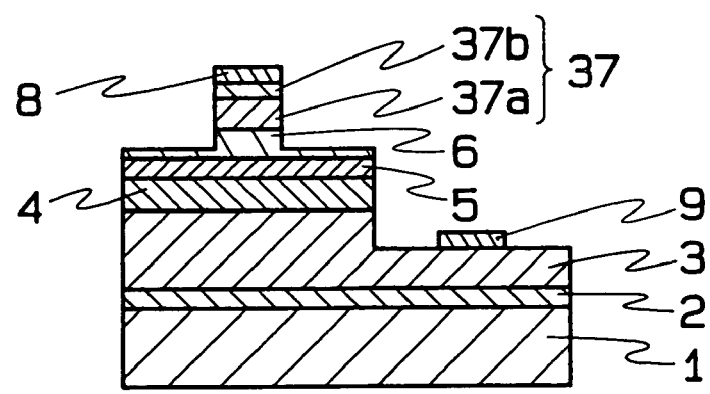
FIG. 7 is an explanatory drawing of a section illustrating an example 3 of the light emitting element of a semiconductor of the present invention.

In a further other example of the semiconductor laser of the present invention shown in FIG. 7, a low temperature buffer layer 2 of approximately 0.01 to 0.2 $\mu$m consisting of the n-type GaN and the like on a substrate 1 such as sapphire (single crystal of $Al_2O_3$), a high temperature buffer layer 3 of approximately 2 to 5 $\mu$m, a lower cald layer 4 of approximately 0.1 to 0.3 $\mu$m consisting of the n-type $Al_kGa_{1-k}N$ (0<k<1), an active layer 5 of approximately 0.05 to 0.1 $\mu$m consisting of a non-doping or n-type or p-type $In_yGa_{1-y}N$ (0<y<1) and having smaller band gap energy and larger refractive index that the lower clad layer 4, an upper clad layer 6 of approximately 0.3 to 2 $\mu$m which is of the same composition as the lower clad layer 4 and of the p-type, and a contact layer 37 consisting of the p-type GaN layer 37a of approximately 0.3 to 2 $\mu$m which is of the same composition as the buffer layers 2 and 3 and of the p-type and the p-type $In_aGa_{1-a}N$ (0<a<1) layer 27b of approximately 0.05 to 0.2 $\mu$m provided on the surface thereof are laminated in order, a p-side electrode 8 is provided on the $In_aGa_{1-a}N$ layer 37b of the surface of the contact layer 37, an n-side electrode 9 is provided on the n-type clad layer 4 or the high temperature buffer layer 3 exposed by etching a part of the laminated semiconductor layer, and a chip of the semiconductor laser of this example is formed.

In the semiconductor laser of this example, a semiconductor layer of gallium nitride type compound is laminated, the material of the p-type contact layer 37 to be provided with the p-type electrode 8 has smaller band gap energy than GaN and is difficult for the surface level to occur, for example, the p-type $In_aGa_{1-a}N$ layer 37b is provided on the surface of the GaN layer 37a, and the p-side electrode 8 is provided on the $In_aGa_{1-a}N$ layer 37b. Since lattice mismatching results if In is mixed with GaN, such mixture is not used in a layer except when a material of small band gap energy is indispensable as in the case of the active layer, and there has been no conception at all to use the $In_aGa_{1-a}N$ layer in the contact layer 37. However, in the light emitting element of a semiconductor which uses a semiconductor of gallium nitride type compound, it is not possible to increase the carrier density of the p-type layer above a certain value, and the increase in the contact resistance between the p-type layer and the p-side electrode increased the operating voltage and caused lowered light emitting efficiency. As the realut of assiduous studies, the inventor of the present invention overcome the problem of lattice mismatching by forming the semiconductor layer to a thickness of approximately 0.05 to 0.2 μm in which a film is formed even if a little lattice mismatching should occur, found out that it is possible to lower the contact resistance with metal, and completed the present invention.

In the case where $In_aGa_{1-a}N$ contained with In as the material of small band gap energy is used, if the composition ratio of In is increased, the thickness for example of the foregoing semiconductor was not preferable in that a phenomenon such as occurrence of transition emerged, but by setting the composition ratio a of In to $0<a\leq0.5$, preferable to $0.05\leq a<0.3$, more preferable to $0.05\leq x\leq0.2$, it was made possible to reduce the contact resistance with metal without causing the problem transition.

Even in the case where GaAs or Gap was used as the material of small band gap energy instead of $In_aGa_{1-a}N$, it was possible to perform an operation in which the contact resistance with metal was also small, it was also difficult for the surface level to occur on the semiconductor surface, and the operating voltage was low. Growth temperature of GaAs or GaP is different from that of the GaN type layer, but it is possible to obtain a layer by forming the GaN type layer and then by growing it by lowering the temperature inside the MOCVD device to 500° to 800° C. Though lattice mismatching of GaN occurs with respect to GaAs or GaP, but the influence due to lattice mismatching is reduced to certain extent by setting the foregoing thickness to approximately 0.05 to 0.2 μm.

By mixing In further with GaAs or GaP, it is possible to use the characteristic that it is easy to make alloy using a metal which is difficult to be oxidized than Al and Ga, and it was possible to reduce the contact resistance further. In this case, it is possible to increase the composition ratio of In to approximately 0 to 0.5.

Next, referring to FIG. 9(a) and FIG. 9(b), and by providing a semiconductor of small band gap energy on the surface of the contact layer 37, the principle that the contact resistance with the p-side electrode is reduced will be described.

Figure 9A:
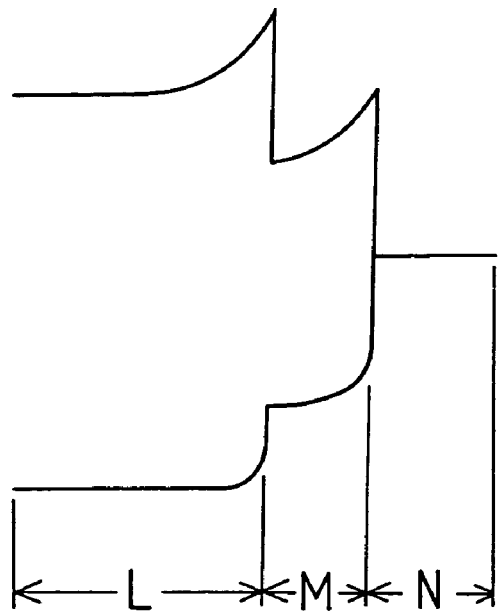
FIGS. 9(a) through 9(b) are explanatory drawings of the energy band of the contact layer and the electrode metal of the light emitting element of a semiconductor of FIG. 7.
Figure 9B:
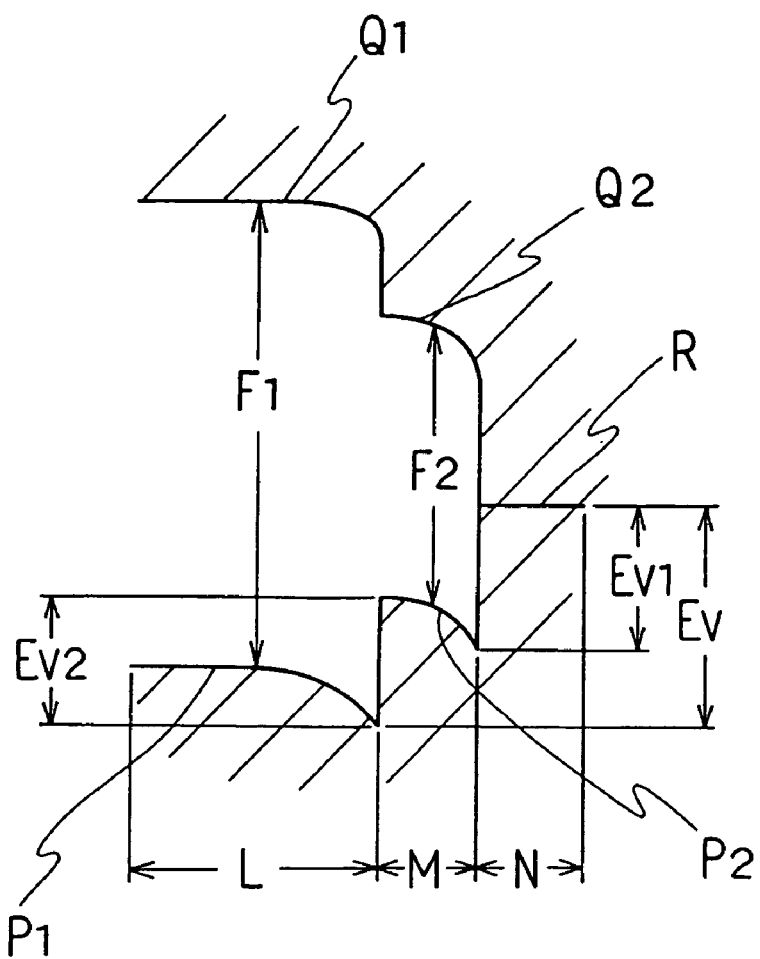

FIG. 9(a) and FIG. 9(b) are the drawings showing the energy band of the contact layer 37 and the p-side electrode 8, in which the left side of the drawing indicates the side of the p-type clad layer 6 of the contact layer 37, the right thereof indicates the side of the p-side electrode 8, and the letter L represents the energy band of the GaN layer 37a, M represent that of the $In_xGa_{1-x}N$ layer 37B, and N represent that of part of the p-side electrode 8 respectively. FIG. 9(a) and FIG. 9(b) typically illustrate the state where the energy levels move upward and downward on the surface of the GaN layer 37a or the $In_aGa_{1-a}N$ layer 37b depending on the composition of the semiconductor layer and the kind of the metal for electrode to be provided on the surface of the semiconductor layer, and indicate the same phenomena in any state of FIG. 9(a) and FIG. 9(b). In FIG. 9(a) and FIG. 9(b), $P_1$ and $P_2$ indicate the valence band of GaN and $In_aGa_{1-a}N$ respectively, $Q_1$ and $Q_2$ the conduction band respectively, and R the energy level where the electron of an electrode metal is maximum The gap $F_1$ of $P_1$ and $Q_1$ and the gap $F_2$ of $P_2$ and $Q_2$ respectively represent the band gap energy (forbidden band) of GaN and $In_aGa_{1-a}N$. The flow of electric current from the p-side electrode to the contact layer means that the positive hole moves from the energy level R of the electrode metal to the valence band $P_1$ of GaN, but in accordance with the present invention, because the $In_aGa_{1-a}N$ layer is provided, it is normal once the positive hole climbs over the gap energy $E_{v1}$ and flows to the valence band $P_2$ of the $In_aGa_{1-a}N$ layer, and then climbs over the gap energy $E_{v2}$ from $P_2$ to $P_1$ and flows, so that the positive hole flows easily because it is not necessary for the positive hole to climb over the gap energy $E_v$ at one time when there is no $In_aGa_{1-a}N$. In this case, assuming that the constant of the electric current including the item of the temperature and $k_1$ and $k_2$ respectively, the gap energy can be expressed by $\exp\{-(k_1E_1+k_2E_{v2})\}$. The reason that the energy barrier is devided into two stages is that the forbidden band width $F_2$ of $In_aGa_{1-a}N$ is smaller than the forbidden band width $F_1$ of GaN, and ideally, it is desirable to use the material of the forbidden band width $F_1$ of GaN GaAs or GaP or $In_bGa_{1-b}As$ or $In_bGa_{1-b}P$ has also the same relation of the forbidden band width, and the contact resistance is reduced in the same manner.

Next, referring to FIGS. 8(a) through 8(c), the manufacturing method of the semiconductor laser of this example shown in FIG. 7 will be described.

Figure 8A:
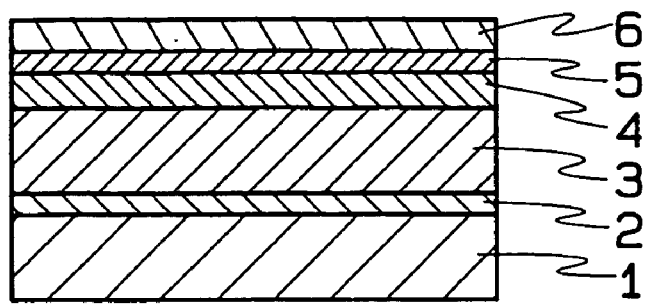
FIGS. 8(a) through 8(c) are drawings illustrating manufacturing methods of the light emitting element of a semiconductor of FIG. 7.

First, as shown in FIG. 8(a), to the substrate 1 consisting of sapphire and the like in the same manner as the example 1 is supplied by the MOCVD method the carrier gas $H_2$ together with TMG and $NH_3$ which are the organometallic compound gas, and $SiH_4$ as the dopant, and the low temperature buffer layer 2 and the high temperature buffer layer 3 consisting of gallium nitride type semiconductor layer such as the n-type GaN layer are grown respectively to approximately 0.01 to 0.2 μm and 2 to 5 μm.

Then, TMA is added further to the foregoing gas, and n-type clad layer 4 containing Si and the like of the n-type dopant as the $SiH_4$ gas and the like is formed to approximate thickness of 1 to 2 μm.

Next, as a material in which the band gap energy is smaller than that of the clad layer, in place of the foregoing material gas for example, TMI is introduced and approximately 0.05 to 0.1 μm of an active layer 5 is formed, further, in place of $SiH_4$, the same material gas used for forming the n-type clad layer 4 is used and $Cp_2Mg$ or DMZn is introduced into a reaction tube as the p-type impurity, and the p-type GaN layer which is the p-type clad layer 6 is caused to grow in vapor phase.

Figure 8B:
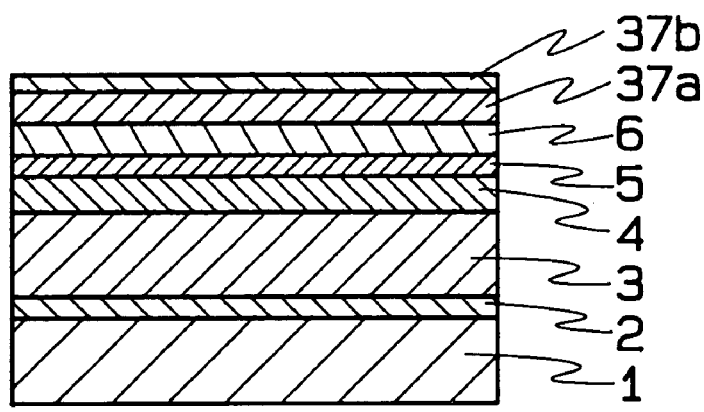

Then, as shown in FIG. 8(b), in order to form a contact layer, $Cp_2Mg$ or DMZn is supplied as the dopant gas using the same gas of the foregoing buffer layer 3, and the p-type GaN layer 37a is grown to a thickness of approximately 0.3 to 2 μm.

Further, in order to reduce the contact resistance with the p-side electrode, TMI is added to the same material gas as the foregoing GaN layer 37a, and the $In_aGa_{1-a}N$ (0<a<1, where a=0.1 for example) is formed to a thickness of approximately 0.05 to 0.2 μm. If the $In_aGa_{1-a}N$ layer is excessively thick, the resistance of the film itself influences the entire layer, and if it is excessively thin, the contact resistance cannot be reduced.

In the foregoing description, the p-type $In_aGa_{1-a}N$ layer is used as part of the contact layer, but by changing the gas to the p-type $In_aGa_{1-a}N$, it is possible to obtain the same effect by forming the p-type GaAs, p-type GaP, p-type $In_bGa_{1-b}As$ (0<b<1, where b=0.2 for example) or p-type $In_bGa_{1-b}P$ (0<b<1, where b=0.5 for example) as the contact layer on the side contacting the p-side electrode. In this case, it is possible to obtain the same effect by lowering the inside temperature of the MOCVD device to 500° to 800° C. and introducing the gas, in place of the foregoing TMI, or introducing TMI and tertiary butyl arsine (TBA) or tertiary butyl phosphine (TBP).

Afterwards, a protective film such as $SiO_2$ and $Si_3N_4$ is provided over the entire surface of the grown layer of a semiconductor, annealing or electron irradiation is provided for approximately 20 to 60 minutes at 400° to 800° C. so as to activate the p-type clad layer 6 and the contact layer 37. Upon completion of annealing, the protective film is removed by wet etching.

Figure 8C:
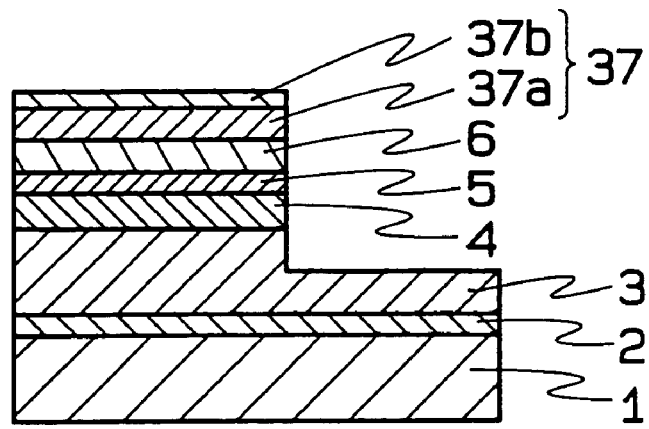

Then, in order to form an electrode on the n-side, resist is applied and patterning is provided, a resist film is provided on the surface of a semiconductor layer of gallium nitride type compound from which the protective film is removed as shown in FIG. 8(c), part of the semiconductor layer is removed by dry etching, the high temperature buffer layer 3 which is an n-type layer or the n-type clad layer 4 is exposed, on the surface of the exposed high temperature buffer layer 3 (or the n-type clad layer 4) is formed an n-side electrode 9 consisting of Al and the like to be electrically connected to the n-type layer, and on the surface of the contact layer 37 of a semiconductor layer of the laminated compound is formed a p-side electrode 8 consisting of a metallic film such as Au and Zn respectively by sputtering and the like. Next, part of the contact layer 7 and the p-type clad layer is turned into the mesa-type shape by etching, and a semiconductor laser chip is formed by dicing each chip.

And, a structure for lowering the contact resistance between the p-side electrode 8 and the contact layer 37 of this example can be applied to the light emitting element of various semiconductors such as an LED of double hetero junction or an LED of pn junction.

In accordance with the light emitting element of the semiconductor of the example 3, because the portion at least contacting the p-side electrode of the contact layer of the p-side electrode is formed with a semiconductor material having smaller band gap energy than the p-type GaN, it is possible to reduce the influence of the surface level and it is also possible to reduce the contact resistance with the p-side electrode. Therefore, it is possible to reduce the operating voltage and improve the light emitting efficiency.

EXAMPLE 4

In the light emitting element of the semiconductor of the example, when forming a semiconductor of gallium nitride type compound on a substrate such as sapphire, a semiconductor layer in which In, P or As is contained is provided on a semiconductor layer at least contacting a substrate, the strain of such semiconductor layer is relieved so as to restrict occurrence of crystal defects or transition involved in lattice mismatching with a substrate such as sapphire, thereby preventing the progress of crystal defects or transition toward the semiconductor layer which contributes to the light emitting portion.

A semiconductor layer containing In is one of which part of GaN is replaced by In and by forming on the substrate as a semiconductor layer of $In_cGa_{1-c}N$ (0<c<1), In becomes heavier than Ga and is moved easily, so that it is possible to form a soft buffer layer with less strain in which coupling between atoms is easily cut. The composition ratio c of In is set to 0 to 1, and preferable to 0.1 to 0.5, and more preferably to approximately 0.1 to 0.3. If the composition ratio of In is excessively large, the difference between the substrate and the lattice constant becomes excessively large, posing excessively large problem of lattice mismatching, and therefore, the effect of relieving the strain by In is now shown if the composition ratio of In is excessively small. In this $In_cGa_{1-c}N$, the same applies to the case of $In_dAl_eGa_{1-d-e}N$ (0<d<1, 0<e<1, 0<d+e<1) in which part of Ga is replaced further by Al.

And, in a semiconductor layer containing p or As, part of N of GaN is replaced by P or As and formed on a substrate as $GaN_wP_{1-w}$ (0<w<1) or $GaN_vAs_{1-v}$ (0<v<1), because p or As is heavier than N and is moved easily, so that it is possible to form a soft buffer layer with less strain in which coupling between atoms is easily cut. Composition ratio w and V of P and As is set to 0<w and v≦0.2, preferably to 0<w and v≦0.1, and more preferably to approximately 0.02≦w and v≦<0.06. When the composition ratio of P and As becomes excessively large, lattice mismatching between GaN and N becomes large, and therefore, the effect of relieving the strain is low shown if the composition ratio of P and As is excessively small.

In P and As, both atoms may be contained not only in one side only but may be contained in to form of mixed crystals. In this case, it is preferable that the total composition ratio of P and As is contained in the range of the foregoing w or v. Further, each atom such as In and P, In and As, and In and As may form a mixed crystal respectively. In this case, it is possible to contain in the range of the foregoing c and to contain P and/or As in the range of foregoing w or v.

Next, further details will be described in concrete example.

FIGS. 10(a) through 10(d) are explanatory drawings of a section of the process of the concrete example of the light emitting element of a semiconductor of the example 4.

Figure 10A:
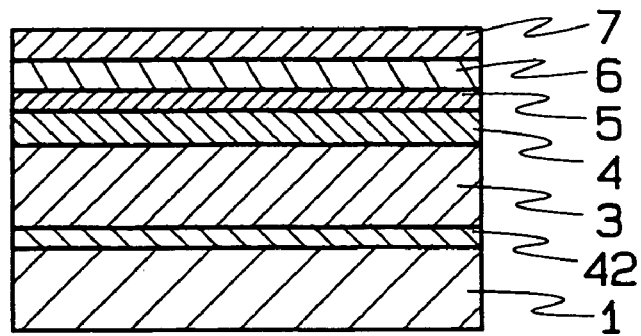
FIG. 10(a) through 10(d) are explanatory drawings illustrating manufacturing processes of the example 4 of the light emitting element of a semiconductor of the present invention.
Figure 10B:
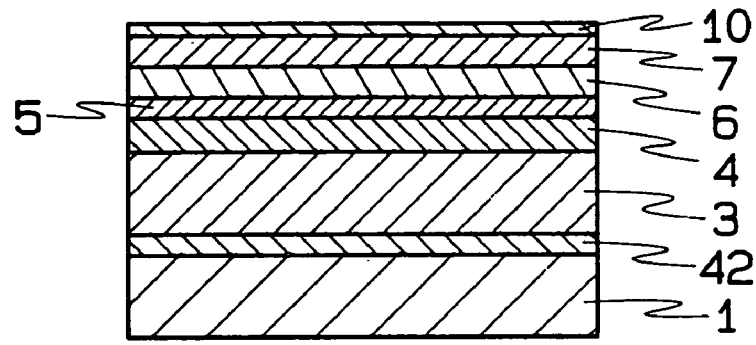

First, as shown in FIG. 10(a), to a substrate 1 consisting of sapphire and the like is supplied by the MOCVD method the carrier gas, TMG, $NH_3$, and TMI, a low temperature buffer layer 42 consisting of a semiconductor layer of the n-type gallium nitride type compound of $In_cGa_{1-c}N$ (0<c<1, where c=0.2 for example) is formed to approximate thickness of 0.01 to 0.2 μm at low temperature of 400° to 600° C. Composition ratio of In is set preferably to 0.1 to 0.5, sand more preferably to 0.1 to 0.3. If the composition ratio is excessively large, the problem of lattice mismatching results and if excessively small, the effect of relieving the strain is not shown.

Afterwards, in order to form a buffer layer of single crystal, temperature is at 700° to 1200° C. and the low temperature buffer layer is made into a single crystal layer, and on the surface thereof is grown the high temperature buffer layer 3 consisting of GaN or AlGaN type or InAlGaN type and the like to approximate thickness of 2 to 5 μm. Afterwards, a clad layer 4 consisting, for example, of the n-type $Al_kGa_{1-k}N$ (0<k<1) and active layer 5 consisting of $In_yGa_{1-y}N$ (0<y<0.2) is grown to approximate thickness 0.1 to 0.3 μm and 0.05 to 0.1 μm respectively. To form the clad layer, TMG, NH and TMA, and $SiH_4$ as the dopant are supplied, and TMI is introduced in place of TMA and caused to react.

Further, with the same material gas as the material gas used for forming the n-type clad layer 4, impurity material gas is replaced by $SiH_4$, $Cp_2Mg$ or DMZn gas is introduced into a reaction tube as the p-type impurity material gas, so that the p-type $Al_kGa_{1-k}N$ (0<k<1) layer which is the p-type clad layer 6 is caused to grow in vapor phase.

Then, a contact layer (cap layer) 7 consisting, for example, of the p-type GaN layer is grown and formed to 0.2 to 3 μm.

Figure 10C:
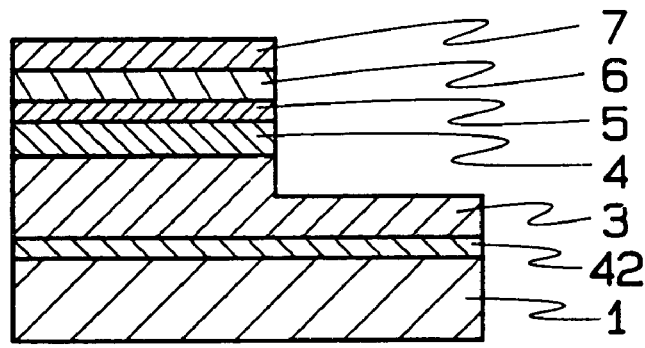

Afterwards, as shown in FIG. 10(c) in the same manner as the example 1, a protective film 10a such as $SiO_2$ and $Si_3N_4$ is provided on the entire surface of the grown layer of a semiconductor layer, annealing or electron irradiation is provided for approximately 20 to 60 minutes at 400° to 800° C., thereby activating the p-type clad layer 6 and the contact layer 7.

Figure 10D:
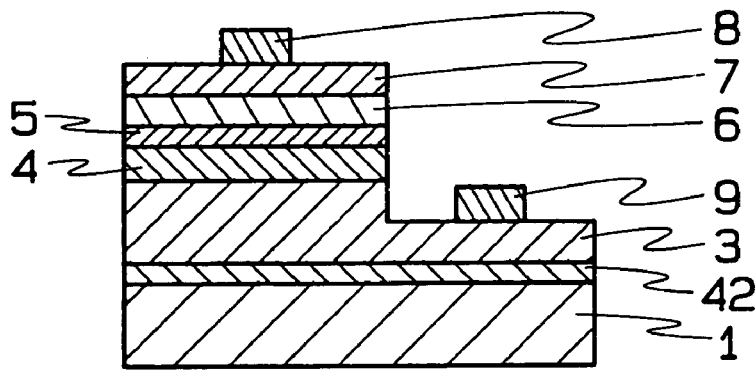
Figure 11:
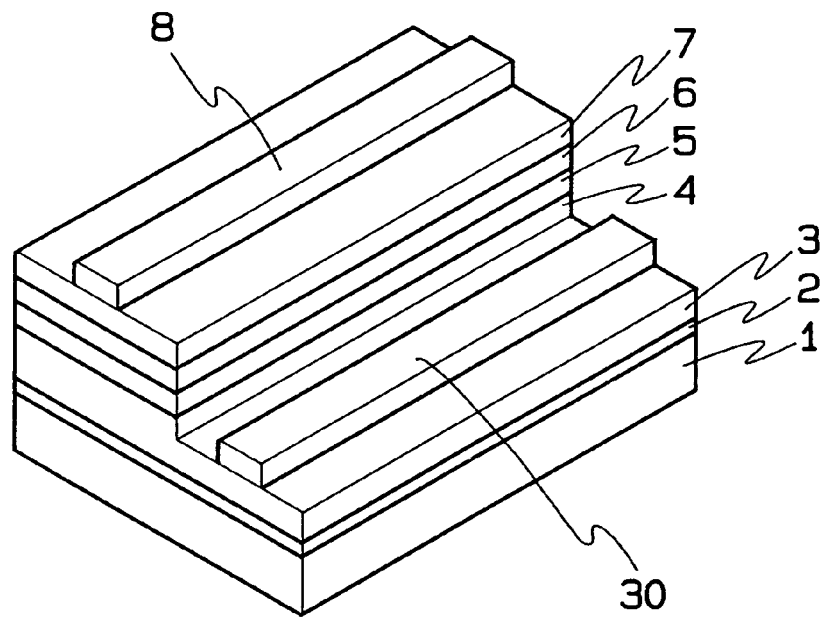
FIG. 11 is a perspective drawing illustrating an example of a conventional light emitting element of a semiconductor and FIG. 12 is an explanatory drawing of a section of a conventional semiconductor of GaAs type compound.
Figure 12:
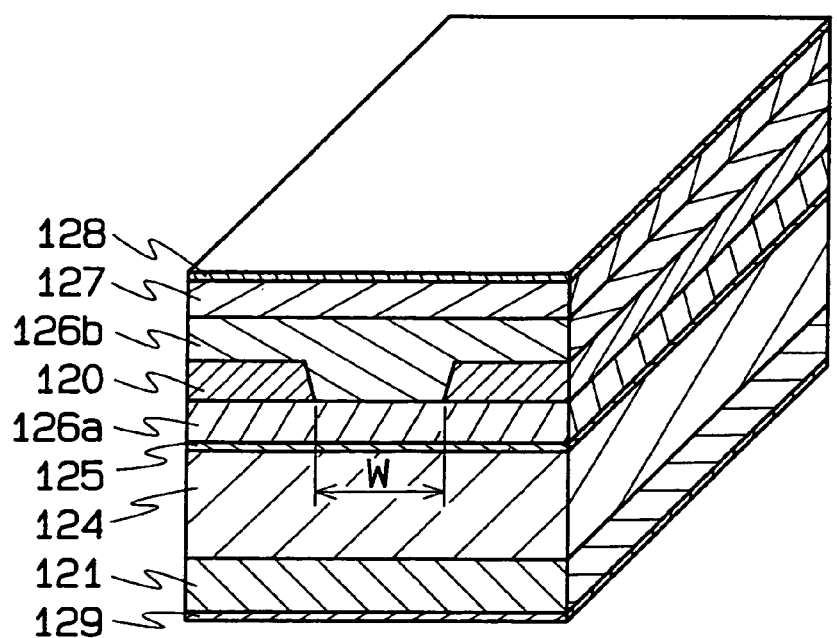

Then, in order to form an electrode of the n-side after the protective film 10a is removed, resist is applied and patterning provided, a clad layer 4 or buffer layer 3 which are the n-type layer are exposed (refer to FIG. 10(c)) by removing part of each of grown semiconductor layer by etching in the same manner as the example 1, the n-side electrode 9 to be electrically connected to the n-type layer and the p-side electrode 8 to be electrically connected to the p-type contact layer 7 are respectively formed on the surface of a semiconductor layer of the laminated compound by sputtering and the like (refer to FIG. 10(d)), and LED chips are formed by dicing.

In accordance with this example, because a semiconductor layer of gallium nitride type compound containing In is used for the low temperature buffer layer 42 as the semiconductor layer which contacts a substrate such as sapphire, the semiconductor becomes one which is soft and the coupling thereof between atoms is easily cut, and it is possible to considerably relieve the strain involved in lattice mismatching. The low temperature buffer layer 42 may not be have to be $In_cGa_{1-c}N$ but the same result was obtained by $In_dAl_eGa_{1-d-e}N$.

With respect to the material gas used for forming the foregoing low temperature buffer layer 42, in place of TMI, tertiary butyl phosphine (TBP) or tertiary butyl arsine (TBA), for example, is introduced, a semiconductor layer of a compound consisting of $GaN_wP_{1-w}$ (0<w<1) or $GaN_vAs_{1-v}$ (0<v<1) is formed, and the same structure and manufacturing method were used as in the case of $In_cGa_{1-c}N$. The growth temperature of the low temperature buffer layer 24 was 400° to 600° C.

As a result, because a semiconductor of gallium nitride type compound containing P or As is used for the low temperature buffer layer as a semiconductor layer which contacts a substrate such as sapphire, as in the case of the example 1 in which such semiconductor contained In, it is possible to obtain a soft semiconductor layer with coupling thereof between atoms being easily cut, and to considerably relieve the strain involved in the lattice mismatching.

In each of the foregoing example, examples of LED of double hetero junction were described, but it is the same with a laser diode of pn junction various structures.

In accordance with the light emitting element of the semiconductor of the example 4, because a low temperature buffer layer consisting of a semiconductor containing at least In, P or As is provided as a semiconductor of gallium nitride type compound to be formed on the surface of substrate, the semiconductor is soft and the strain is relieved. As a result, occurrence of crystal defects and transition in the low temperature buffer layer is restricted, progress of crystal defects or transition toward the semiconductor which contributes to emission of light can also be restricted, thereby improving the light emitting characteristic, improving reliability, and extending the life further.

EXAMPLE 5

In the light emitting element of the semiconductor of this example 5, a buffer layer which is a semiconductor layer contacting a substrate of a semiconductor layer of gallium nitride type compound containing at least an n-type layer and a p-type layer to be laminated to form a light emitting portion on a substrate such as sapphire is composed by a semiconductor in which it is difficult for electric current to flow. In other words, because the lattice constant of the semiconductor layer of gallium nitride type compound and that of the sapphire substrate are different in that the former is 4.758 Å and the latter is 3.189 Å, strain due to lattice mismatching occurs in the buffer larer on the substrate, and crystal defects or transition are likely to occur. When electric current flows into the semiconductor where such crystal defects or transition are occurring, heat is generated and crystal defects or transition increase in the portion where crystal defects or transition occur. Because the crystal defects or transition occurred in this buffer layer progress toward the semiconductor layer which forms the light emitting portion, by preventing electric current form flowing to the buffer layer on the substrate as much as possible, it is possible to restrict the occurrence of crystal defects or transition in the entire semiconductor layer.

In order to make the buffer layer portion contacting the substrate as a layer where electric current is difficult to flow, it is possible to obtain such layer by making the layer as a high resistance layer or a layer of opposite conduction type by introducing a semiconductor layer of the upper part of the buffer layer and opposite conduction type dopant when growing a semiconductor layer in vapor phase. For example, because it is necessary to anneal and activate the p-type layer when forming the light emitting element a semiconductor by laminating a semicondcutor of gallium type compound, the lower portion which is the substrate side is made into an n-type layer and the surface side is made into a p-type layer, and then are laminated. When growing a semicondcutor of gallium nitride type compound in vapor phase, N of the semiconductor of gallium nitride type compound is easily evaporated, so that the n-type layer is obtained without mixing a dopant. Therefore, when forming a buffer layer, by mixing the n-type clad layer to be formed on the buffer layer and the p-type dopant of opposite conduction type, the layer to be originally formed into an n-type layer is neutralized by the p-type dopant and becomes a high resistance layer, and becomes a p-type layer by mixing more p-type dopant. Because the n-side electrode is provided on the surface of the n-type layer of the buffer layer or the clad layer, electric current does not flow to the high resistance layer of the substrate side or to the p-type layer. As a result, electric current does not flow to the buffer layer of the substrate side in particular where crystal defects or transition are likely to occur, so that it is possible to prevent an increase of crystal defects or transition.

When a semiconductor of gallium nitride type compound containing at least either In, P or As is used for the foregoing buffer layer, In is heavier than Ga and p or As is heavier than N, it is preferable that it is easy to relieve the strain because the coupling between atoms is easily split, and it is further possible to prevent an increase of crystal defects or transition.

Next, the manufacturing method of the light emitting element of the semiconductor of the example 5.

First, as shown in FIG. 10(*a*) of the example 4, on a substrate 1 consisting of sapphire and the like is supplied by the MOCVD method the carrier gas $H_2$ together TMG at the flow rate of 20 to 200 sccm, $NH_3$, at the flow rate 5 to 20 slm, and $Cp_2Mg$ or DMZn at the flow rate of 10 to 1000 sccm so as to grow in vapor phase at 400 to 700° C., and a low temperature buffer layer 42 consisting of GaN having the specific resistance of approximately 10 to $10^{18}$.cm is grown to approximate thickness of 0.01 to 0.2 $\mu$m.

Then, the temperature is raised to approximately 700° to 1200° C. to make the foregoing low temperature buffer layer 42 into single crystal, and the same material gas as the foregoing gas is continuously supplied, the dopant gas is changed to $SiH_4$ and the high temperature buffer layer 3 consisting of the n-type GaN is formed to approximate thickness of 2 to 5 $\mu$m. When growing the high temperature buffer layer 3, it is possible to obtain the n-type layer as described above even if the layer is grown without supplying the dopant gas, it is preferable to supply the dopant gas in order to sufficiently increase the carrier gas density.

Afterwards, in the same manner as the example 4, semiconductors of the n-type clad layer, active layer, p-type clad layer, and contact layer are laminated, annealed, and etched to be formed into the p-side electrode and the n-side electrode, and then made into chips.

In this example, the flow rate of the p-type dopant supplied during growth of the low temperature buffer layer 42 is set to approximately 10 to 100 sccm and the buffer layer is formed as a high resistance layer having the specific resistance of approximately 1000 to $10^{18}$.cm, but by setting the flow rate of the p-type dopant to approximately 500 to 1000 sccm and forming the layer as the p-type layer, the high temperature buffer layer 3 thereon is the n-type and the n-side electride is provided on the n-type layer, therefore, little electric current flows to the p-type layer on the insulated substrate, and it is possible to form a layer where electric current is difficult to flow.

In addition, in this example, the entire high temperature buffer layer 3 on the low temperature buffer layer 42 is formed by the example of the n-type layer, but it is also possible to make the lower layer side of the high temperature buffer layer 3 as the high resistance layer or the p-type layer. In this case, by changing only the dopant gas to be supplied while growing a semiconductor layer in vapor phase, it is possible to change the conduction type dopant. Further, the entire of the high temperature buffer layer 3 may be made a high resistance layer or a p-type layer and the n-type clad layer may be made to a thickness to an extent where the series resistance does not pose a problem.

Further, in the light emitting element of a semiconductor which uses a semiconductor of gallium nitride type compound, as stated above, normally the n-type layer is formed n the lower layer side close to the substrate and p-type layer is formed on the surface side, but even if the n-type layer and the p-type layer are formed in the opposite way, it is possible to form a layer where the same electric current is difficult to flow by simply reversing the n-type layer and the p-type layer.

In addition, in this example and LED of double hetero junction is described, the present invention can be applied to the light emitting element of semiconductor such as laser diode having LED of pn junction or various structures.

In accordance with the light emitting element of the semiconductor of the example 5, because the semiconductor layer of gallium nitride type compound (buffer layer) contacting the substrate where crystal defects or transition are likely to occur due to the lattice mismatching is made a layer where electric current is difficult to flow, it is possible to prevent an increase of crystal defects or transition caused by electric current. As a result, it is possible to restrict the occurnce of crystal defects or transition in the semiconductor layer composing the light emitting portion, and it is possible to obtain the light emitting element of semiconductor having excellent light emitting characteristic.

Further, crystal defects or transition do not increase during operation due to the influence of electric current, while the reliability is improved and the life is extended as well.

In each example of the foregoing examples 1 through 5, examples of semiconductor layers of special compositions are described as the semiconductor layer of gallium nitride type compound, but not limiting to the material of the foregoing composition, the semiconductor layer is generally consisted of $Al_pGa_{1-p-q}N$ ($0 \leq p<1$, $0<q<1$, $0<p+q \leq 1$), the ratio of each composition may be selected so that the bond gap energy of the active layer, for example, is smaller than the band gap energy of the clad layer, or the composition ratios p and q may be changed so as to satisfy the band gap energy or the refractive index of each semiconductor layer according to the desired light emitting element of semiconductor. The present invention can be applied in the same manner as to the material in which part or whole of N of the foregoing $Al_pGa_{1-p-q}N$ is replaced by As and/or P.

What is claimed is:

1. A semiconductor light emitting device comprising:
   an electrode;
   a substrate;
   gallium nitride type compound semiconductor layers forming a light emitting portion, said semiconductor layers including at least an n-type layer and a p-type layer, a band gap energy of the p-type layer being greater than a band gap energy of the n-type layer, said semiconductor layers being between said electrode and said substrate; and
   a buffer region interposed between said substrate and said semiconductor layers, said buffer region alleviating strain resulting from a lattice mismatch between said substrate and said semiconductor layers, wherein said buffer region comprises a first layer, said first layer including In.

2. The semiconductor light emitting device according to claim 1, wherein said buffer region includes a second layer formed at a first temperature on said substrate, and wherein said first layer includes the elements In, Ga, and N, said first layer being formed at a second temperature higher than said first temperature.

3. The semiconductor light emitting device according to claim 1, wherein the conductivity of the first layer is greater than the conductivity of the second layer.

4. The semiconductor light emitting device according to claim 3, wherein the second layer consists of a semiconductor layer of high resistance.

5. The semiconductor light emitting device according to claim 1, wherein said buffer region further comprises a second layer formed at a first temperature on the surface of said substrate, wherein said first layer is formed at a second temperature higher than said first temperature, said first layer being between said second layer and said semiconductor layers, said light emitting device further including a p-type contact layer between said semiconductor layers and said electrode.

6. The semiconductor light emitting device according to claim 5, wherein said p-type contact layer consists of essentially GaN.

7. The semiconductor light emitting device according to claim 1, wherein said buffer region further comprises a second layer formed at a first temperature on the surface of said substrate, wherein said first layer includes the elements In, Ga, and N, and said first layer is formed at a second temperature higher than said first temperature, said first layer being between said second layer and said semiconductor layers, said light emitting device further including a p-type contact layer between said semiconductor layers and said electrode.

* * * * *